(12) United States Patent
Kato et al.

(10) Patent No.: US 8,753,802 B2
(45) Date of Patent: Jun. 17, 2014

(54) PATTERN FORMING METHOD, CHEMICAL AMPLIFICATION RESIST COMPOSITION AND RESIST FILM

(71) Applicant: FUJIFILM Corporation, Tokyo (JP)

(72) Inventors: Keita Kato, Shizuoka (JP); Shinji Tarutani, Shizuoka (JP); Sou Kamimura, Shizuoka (JP); Yuichiro Enomoto, Shizuoka (JP); Kaoru Iwato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 27 days.

(21) Appl. No.: 13/656,960

(22) Filed: Oct. 22, 2012

(65) Prior Publication Data

US 2013/0045365 A1 Feb. 21, 2013

Related U.S. Application Data

(63) Continuation of application No. PCT/JP2011/059890, filed on Apr. 15, 2011.

(30) Foreign Application Priority Data

Apr. 22, 2010 (JP) ................................ 2010-099298

(51) Int. Cl.
*G03F 7/26* (2006.01)

(52) U.S. Cl.
USPC .......................................... 430/322; 430/331

(58) Field of Classification Search
USPC ...................... 430/322, 270.1, 331
See application file for complete search history.

(56) References Cited

U.S. PATENT DOCUMENTS

| 5,155,012 | A * | 10/1992 | Joerg et al. | 430/331 |
| 6,261,738 | B1 * | 7/2001 | Asakura et al. | 430/270.1 |
| 2001/0049073 | A1 | 12/2001 | Hada et al. | |
| 2003/0039921 | A1 | 2/2003 | Washio et al. | |
| 2003/0113662 | A1 | 6/2003 | Kato et al. | |
| 2003/0203310 | A1 * | 10/2003 | Thackeray et al. | 430/270.1 |
| 2008/0182087 | A1 | 7/2008 | Kato et al. | |
| 2009/0142693 | A1 | 6/2009 | Iwashita | |
| 2009/0181224 | A1 | 7/2009 | Minegishi | |
| 2010/0239984 | A1 | 9/2010 | Tsubaki | |
| 2012/0058436 | A1 | 3/2012 | Tsubaki et al. | |
| 2012/0077131 | A1 * | 3/2012 | Enomoto et al. | 430/325 |

FOREIGN PATENT DOCUMENTS

| JP | 2000-206694 A | | 7/2000 |
| JP | 2002-182393 | * | 6/2002 |
| JP | 2003-114531 A | | 4/2003 |
| JP | 2003-122005 A | | 4/2003 |
| JP | 2006-189788 A | | 7/2006 |
| JP | 2006-195050 A | | 7/2006 |
| JP | 2006-259582 A | | 9/2006 |
| JP | 2006-317803 A | | 11/2006 |
| JP | 2008-184571 A | | 8/2008 |
| JP | 2008-292975 A | | 12/2008 |
| JP | 2008-310314 A | | 12/2008 |
| JP | 2009-025707 A | | 2/2009 |
| JP | 2009-115835 A | | 5/2009 |

OTHER PUBLICATIONS

International Search Report for PCT/JP2011/059890 dated May 24, 2011 [PCT/ISA/210].
Written Opinion for PCT/JP2011/059890 dated May 24, 2011 [PCT/ISA/237].
Office Action dated Feb. 18, 2014 in Japanese Application No. 2010-099298.

* cited by examiner

*Primary Examiner* — Caleen Sullivan
(74) *Attorney, Agent, or Firm* — Sughrue Mion, PLLC

(57) ABSTRACT

A pattern forming method comprising: (i) a step of forming a film from a chemical amplification resist composition, (ii) a step of exposing the film, and (iii) a step of developing the exposed film by using an organic solvent-containing developer, wherein the resist composition contains: (A) a resin, (B) a nonionic compound capable of generating an acid upon irradiation with an actinic ray or radiation, (C) a crosslinking agent, and (D) a solvent.

16 Claims, No Drawings

PATTERN FORMING METHOD, CHEMICAL AMPLIFICATION RESIST COMPOSITION AND RESIST FILM

CROSS REFERENCE TO RELATED APPLICATION

This is a continuation of International Application No. PCT/JP2011/059890 filed on Apr. 15, 2011, and claims priority from Japanese Patent Application No. 2010-099298, filed on Apr. 22, 2010, the entire disclosures of which are incorporated herein by reference.

TECHNICAL FIELD

The present invention relates to a pattern forming method applicable to the production of an electronic device such as a semiconductor device or a liquid crystal device or thermal head or the process of producing a semiconductor such as IC or the production of a circuit board such as thermal head and further to the lithography in other photo-fabrication processes, a chemical amplification resist composition used for the pattern forming method, and a resist film. More specifically, the present invention relates to a pattern forming method suitable for exposure by an ArF exposure apparatus, an ArF immersion-type projection exposure apparatus or an EUV exposure apparatus each using a light source that emits far ultraviolet light at a wavelength of 300 nm or less, a chemical amplification resist composition used for the pattern forming method, and a resist film.

BACKGROUND ART

Since the advent of a resist for KrF excimer laser (248 nm), an image forming method called chemical amplification is used as an image forming method for resist so as to compensate for sensitivity reduction caused by light absorption. For example, the image forming method by positive chemical amplification is an image forming method of decomposing an acid generator in the exposed area upon exposure with excimer laser, electron beam, extreme-ultraviolet light or the like to produce an acid, converting an alkali-insoluble group into an alkali-soluble group by using the generated acid as a reaction catalyst in the baking after exposure (PEB: Post Exposure Bake), and removing the exposed area with an alkali developer.

As for the alkali developer used in the method above, various alkali developers have been proposed, but an aqueous alkali developer of 2.38 mass % TMAH (an aqueous tetramethylammonium hydroxide solution) is being used for general purposes.

Also, due to miniaturization of a semiconductor device, the trend is moving toward a shorter wavelength of the exposure light source and a higher numerical aperture (higher NA) of the projection lens, and an exposure machine using an ArF excimer laser with a wavelength of 193 nm as a light source has been developed at present. Furthermore, for example, a so-called immersion method of filling a high refractive-index liquid (hereinafter sometimes referred to as an "immersion liquid") between the projection lens and the sample, and EUV lithography of performing exposure to ultraviolet light at a shorter wavelength (13.5 nm) have been proposed.

However, it is actually very difficult to find out an appropriate combination of a resist composition, a developer, a rinsing solution and the like, necessary for forming a pattern with overall good performance, and more improvements are being demanded. In particular, as the resolved line width of resist becomes finer, improvement of the line edge roughness performance of a line pattern or the in-plane uniformity of the pattern dimension is being desired.

On the other hand, as well as the currently predominant positive resist, a negative chemical amplification resist composition for use in the pattern formation by alkali development is also being developed (see, for example, JP-A-2006-317803 (the term "JP-A" as used herein means an "unexamined published Japanese patent application"), JP-A-2006-259582, JP-A-2006-195050, JP-A-2000-206694). Because, in the production of a semiconductor device or the like, patterns having various profiles such as line, trench and hole need to be formed and some patterns are difficult to form by the current positive resist composition.

In the pattern formation by alkali development using a conventional negative resist composition, it is demanded to more improve the line width variation (LWR), focus latitude (DOF) and other various performances, which are presumed to be mainly governed by swelling at the development.

Also, a double developing technique as a double patterning technology for further raising the resolution is described in JP-A-2008-292975. In this technique, by making use of a property that when exposed, the polarity of a resin in a resist composition becomes high polarity in a high light intensity region and becomes low polarity in a low light intensity region, a high exposure region of a specific resist film is dissolved with a high-polarity developer and a low exposure region is dissolved with a low-polarity developer, whereby the medium exposure dose region is allowed to remain without being dissolved and removed by development and a line-and-space pattern having a pitch half the pitch of the exposure mask is formed.

Furthermore, a chemical amplification resist composition comprising a first resin containing an acid-decomposable repeating unit with a partial structure selected from specific alicyclic hydrocarbon structures and being capable of increasing the polarity by the action of an acid to decrease the solubility for a negative developer (a developer that selectively dissolves and removes the exposed area), and a second resin containing an acid-decomposable repeating unit and being capable of increasing the polarity by the action of an acid to decrease the solubility for a negative developer, with the average content of acid-decomposable repeating units being different from the average content of acid-decomposable repeating units in the first resin, is described in JP-A-2009-025707. It is demonstrated that according to this chemical amplification resist composition, a pattern with little line edge roughness and good performance in terms of pattern collapse is obtained.

However, more stable formation of a high-definition fine pattern for producing a high-precision electronic device with high integration is being demanded.

SUMMARY OF INVENTION

An object of the present invention is to solve the above-described tasks and provide a pattern forming method, a chemical amplification resist composition and a resist film, ensuring that the exposure latitude (EL) and focus latitude (DOF) are excellent and the line width variation (LWR) and scum defect can be reduced, The present invention includes the following configurations, and the above-described object of the present invention is attained by these configurations.

(1) A pattern forming method comprising:
   (i) a step of forming a film from a chemical amplification resist composition, (ii) a step of exposing the film, and
(iii) a step of developing the exposed film by using an organic solvent-containing developer,
wherein the resist composition contains:
(A) a resin,
(B) a nonionic compound capable of generating an acid upon irradiation with an actinic ray or radiation,
(C) a crosslinking agent, and
(D) a solvent.

(2) The pattern forming method as described in (1) above, wherein the resin (A) is substantially alkali-insoluble.

(3) The pattern forming method as described in (1) or (2) above, wherein the nonionic compound is a compound represented by the following formula (B1) or (B2):

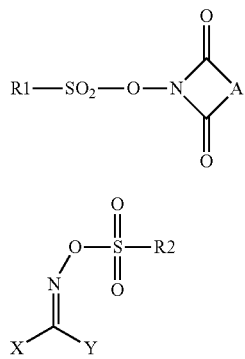

wherein each of R1 and R2 independently represents an organic group,
A represents an alkylene group, a cycloalkylene group, an alkenylene group, a cycloalkenylene group or an arylene group,
each of X and Y independently represents an alkyl group, a cycloalkyl group, an aryl group, a cyano group or a nitro group, X and Y may combine with each other to form a ring, and
X or Y in a compound represented by formula (B2) may combine with X or Y in another compound represented by formula (B2) through a linking group.

(4) The pattern forming method as described in (3) above, wherein the organic group as R1 and R2 in formulae (B1) and (B2) is a group represented by the following formula (I):

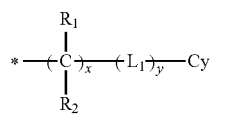

wherein each of $R_1$ and $R_2$ independently represents a hydrogen atom, a fluorine atom or an alkyl group, and when a plurality of $R_1$'s or $R_2$'s are present, each $R_1$ or $R_2$ may be the same as or different from every other $R_1$ or $R_2$,
$L_1$ represents a divalent linking group and when a plurality of $L_1$'s are present, each $L_1$ may be the same as or different from every other $L_1$,
Cy represents a cyclic organic group,
x represents an integer of 0 to 20,
y represents an integer of 0 to 10, and
* represents a bond to a sulfonyl group.

(5) The pattern forming method as described in (4) above, wherein the organic group represented by formula (I) is a group represented by the following formula (II) or (III):

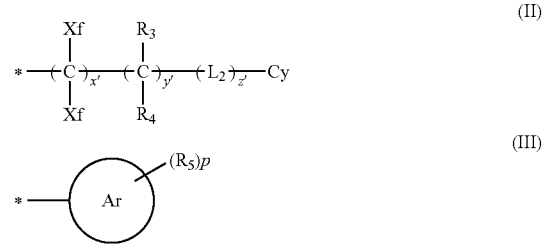

wherein in formula (II),
each Xf independently represents a fluorine atom or an alkyl group substituted with at least one fluorine atom,
each of $R_3$ and $R_4$ independently represents a hydrogen atom or an alkyl group, and when a plurality of $R_3$'s or $R_4$'s are present, each $R_3$ or $R_4$ may be the same as or different from every other $R_3$ or $R_4$,
$L_2$ represents a divalent linking group and when a plurality of $L_2$'s are present, each $L_2$ may be the same as or different from every other $L_2$,
Cy represents a cyclic organic group,
x' represents an integer of 0 to 20,
y' represents an integer of 0 to 10, and
z' represents an integer of 0 to 10,
provided that $1 \leq x'+y'+z+$; in formula (III),
Ar represents an aryl group,
$R_5$ represents a group containing a hydrocarbon group, and
p represents an integer of 0 or more; and in formulae (II) and (III),
* represents a bond to a sulfonyl group.

(6) The pattern forming method as described in (5) above, wherein the organic group represented by formula (II) or (III) is an organic group represented by formula (II) and x' is an integer of 1 to 10.

(7) The pattern forming method as described in any one of (1) to (6) above, wherein the resin (A) contains a repeating unit having an acid-decomposable group.

(8) The pattern forming method as described in any one of (1) to (6) above, wherein the resin (A) does not contain a repeating unit having an acid-decomposable group.

(9) The pattern forming method as described in any one of (1) to (8) above, wherein the organic solvent-containing developer is a developer containing at least one kind of an organic solvent selected from the group consisting of a ketone-based solvent, an ester-based solvent, an alcohol-based solvent, an amide-based solvent and an ether-based solvent.

(10) The pattern forming method as described in any one of (1) to (9) above, which is a negative-type pattern forming method.

(11) A chemical amplification resist composition that is used for the pattern forming method as described in any one of (1) to (10) above.

(12) A resist film formed of the chemical amplification resist composition as described in (11) above.

(13) A method for producing an electronic device, comprising the pattern forming method as described in any one of (1) to (10) above.

(14) An electronic device formed by the method as described in (13) above.

The present invention preferably further includes the following configurations.

(15) The pattern forming method as described in any one of (1) to (3) and (7) to (10) above, wherein the organic group as R1 and R2 in formulae (B1) and (B2) is an alkyl group.

(16) The pattern forming method as described in any one of (1) to (3), (7) to (10) and (15) above, wherein the organic group as R1 and R2 in formulae (B1) and (B2) is a fluoroalkyl group.

(17) The pattern forming method as described in any one of (1) to (10), (15) and (16) above, wherein the resin (A) contains a repeating unit having a lactone structure.

(18) The pattern forming method as described in any one of (1) to (10) and (15) to (17) above, wherein the chemical amplification resist composition further contains a hydrophobic resin having at least either a fluorine atom or a silicon atom.

(19) The pattern forming method as described in any one of (1) to (10) and (15) to (18) above, wherein the water content ratio for the entire developer of the organic solvent-containing developer is less than 10 mass %.

(20) The pattern forming method as described in any one of (1) to (10) and (15) to (19) above, wherein the content of the organic solvent in the organic solvent-containing developer is from 90 to 100 mass % based on the entire amount of the developer.

According to the present invention, a pattern forming method, a chemical amplification resist composition and a resist film can be provided, ensuring that the exposure latitude (EL) and focus latitude (DOF) are excellent and the line width variation (LWR) and scum defect can be reduced.

DESCRIPTION OF EMBODIMENT

The mode for carrying out the present invention is described below.

In the present specification, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

In the present specification, the term "actinic ray" or "radiation" indicates, for example, a bright line spectrum of mercury lamp, a far ultraviolet ray typified by excimer laser, an extreme-ultraviolet ray (EUV light), an X-ray or an electron beam. Also, in the present invention, the "light" means an actinic ray or radiation.

Furthermore, in the present specification, unless otherwise indicated, the "exposure" includes not only exposure to a mercury lamp, a far ultraviolet ray typified by excimer laser, an extreme-ultraviolet ray, an X-ray, EUV light or the like but also lithography with a particle beam such as electron beam and ion beam.

The pattern forming method of the present invention comprises:

(i) a step of forming a film from a chemical amplification resist composition containing (A) a resin, (B) a nonionic compound capable of generating an acid upon irradiation with an actinic ray or radiation, (C) a crosslinking agent, and (D) a solvent, (ii) a step of exposing the film, and (iii) a step of developing the exposed film by using an organic solvent-containing developer.

As to the fact that when the unexposed area in a resist film obtained using the resist composition above is developed with an organic solvent-containing developer, the exposure latitude (EL) and focus latitude (DOF) can be excellent and the line width variation (LWR) and scum defect can be reduced, its operational mechanism is not completely clarified.

However, it may be considered that when a nonionic compound is used as the acid generator as in the present invention, the solubility of the unexposed area for an organic solvent-containing developer can be increased while scarcely affecting the solubility of the exposed area for an organic solvent-containing developer, as a result, the dissolution contrast between the exposed area and the unexposed area is enhanced.

Also, when the resist composition contains a crosslinking agent, this becomes a factor in reducing the solubility of the exposed area underwent a crosslinking reaction for an organic solvent-containing developer and therefore, contributes to enhancing the above-described dissolution contrast.

The high dissolution contrast considered to be achieved for these reasons is presumed to lead to enhancement of the exposure latitude (EL) and focus latitude (DOF) and reduction of the line width variation (LWR) and scum defect.

In the pattern forming method of the present invention, the developer is preferably a developer containing at least one kind of an organic solvent selected from the group consisting of a ketone-based solvent, an ester-based solvent, an alcohol-based solvent, an amide-based solvent and an ether-based solvent.

The pattern forming method of the present invention preferably further comprises (iv) a step of performing rinsing by using an organic solvent-containing rinsing solution.

The rinsing solution is preferably a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent.

The pattern forming method of the present invention preferably comprises (v) a heating step after the exposure step (ii).

In the pattern forming method of the present invention, the resin (A) may be a resin capable of increasing the polarity by the action of an acid to increase the solubility for an alkali developer and the method may further comprise (vi) a step of developing the film by using an alkali developer.

In the pattern forming method of the present invention, the exposure step (ii) may be performed a plurality of times.

In the pattern forming method of the present invention, the heating step (v) may be performed a plurality of times.

The resist film of the present invention is a film formed of a chemical amplification resist composition containing (A) a resin, (B) a nonionic compound capable of generating an acid upon irradiation with an actinic ray or radiation, (C) a crosslinking agent, and (D) a solvent, and this film is formed, for example, by coating the resist composition on a base material.

The resist composition which can be used in the present invention is described below.

[1] (A) Resin

The chemical amplification resist composition of the present invention forms a negative pattern by the pattern forming method of the present invention.

That is, in a resist film obtained from the chemical amplification resist composition of the present invention, the exposed area is reduced in the solubility for an organic solvent-containing developer due to a crosslinking reaction caused to proceed by the action of an acid and becomes insolubilized or sparingly solubilized, and the unexposed area remains soluble in an organic solvent-containing developer, whereby a negative pattern is formed.

The resin (A) is preferably substantially alkali-insoluble.

The term "substantially alkali-insoluble" means that when a coating film (thickness: 100 nm) is formed by dissolving only the resin (A) in a solvent such as butyl acetate to have a solid content concentration of 3.5 mass % and coating the composition obtained and the film is dipped in an aqueous 2.38 mass % tetramethylammonium hydroxide (TMAH) solution at room temperature (25° C.) for 1,000 seconds, the average dissolution rate (the rate of decrease in the film thickness) measured using a QCM (quartz crystal oscillator microbalance) sensor or the like is 1 nm/s or less, preferably 0.1 nm/s or less. Thanks to this condition, the resist film in the unexposed area exhibits good solubility for an organic solvent-containing developer.

The resin (A) may or may not contain a repeating unit having an acid group, but as described above, the resin (A) is preferably substantially alkali-insoluble and therefore, preferably does not contain such a repeating unit.

Examples of the acid group include a carboxyl group, a sulfonamide group, a sulfonylimide group, a bisulfonylimide group, and an aliphatic alcohol substituted with an electron-withdrawing group at the α-position (for example, a hexafluoroisopropanol group and —C(CF$_3$)$_2$OH).

In the case where the resin (A) contains an acid group, the content of the repeating unit having an acid group in the resin (A) is preferably 25 mol % or less, more preferably 15 mol % or less, still more preferably 10 mol % or less. In the case where the resin (A) contains a repeating unit having an acid group, the content of the acid group-containing repeating unit in the resin (A) is usually 1 mol % or more.

Here, the electron-withdrawing group indicates a substituent having a propensity to attract an electron, for example, a substituent having a propensity to draw an electron from an atom located in proximity to the group in a molecule.

The electron-withdrawing group specifically includes those in $Z_{ka1}$ of formula (KA-1) described later.

As long as the film when formed using the resist composition dissolves in an organic solvent-containing developer, the resin need not have by itself solubility for an organic solvent-containing developer. For example, depending on the property or content of other components contained in the resist composition, it may suffice if a film formed using the resist composition dissolves in the developer.

The resin (A) is generally synthesized by polymerization, for example, radical polymerization, of a monomer having a partial structure to be polymerized and contains a repeating unit derived from the monomer having a partial structure to be polymerized. Examples of the partial structure to be polymerized include an ethylenically polymerizable partial structure.

Respective repeating units which can be contained in the resin (A) are described in detail below.

(a1) Repeating Unit Having Crosslinking Group

The resin (A) preferably contains (a1) a repeating unit having a crosslinking group at least either in the main chain or on the side chain. When such a unit is contained, the crosslinking group reacts with a crosslinking agent by the action of an acid, and this is expected to not only make the resist film substantially insoluble for an organic solvent-containing developer but also enhance the adherence to substrate.

The crosslinking group is preferably an alcoholic hydroxyl group.

The alcoholic hydroxyl group as used in the present invention is a hydroxyl group bonded to a hydrocarbon group and is not particularly limited as long as it is a hydroxyl group except for the hydroxyl group (phenolic hydroxyl group) bonded directly on an aromatic ring, but in the present invention, a hydroxyl group except for the hydroxyl group in the aliphatic alcohol substituted with an electron-withdrawing group at the α-position, described above as the acid group, is preferred. The hydroxyl group is preferably a primary alcoholic hydroxyl group (a group where the carbon atom on which a hydroxyl group is substituted has two hydrogen atoms separately from the hydroxyl group) or a secondary alcoholic hydroxyl group where another electron-withdrawing group is not bonded to the carbon atom on which a hydroxyl group is substituted, because the reaction efficiency with the crosslinking agent (C) is enhanced.

The repeating unit preferably has from one to three, more preferably one or two, alcoholic hydroxyl groups per the repeating unit.

Such a repeating unit includes a repeating unit represented by formula (2) or (3):

(2)

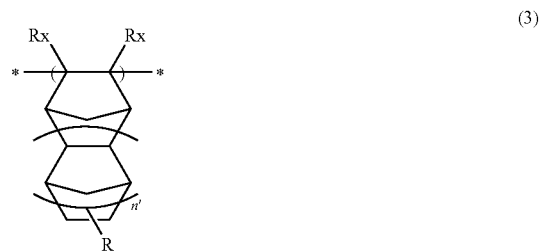

(3)

In formula (2), at least either one of Rx and R represents an alcoholic hydroxyl group-containing structure.

In formula (3), at least one of two Rx's and R represents an alcoholic hydroxyl group-containing structure. Two Rx's may be the same or different.

Examples of the alcoholic hydroxyl group-containing structure include a hydroxyalkyl group (preferably having a carbon number of 2 to 8, more preferably from 2 to 4), a hydroxycycloalkyl group (preferably having a carbon number of 4 to 14), a hydroxyalkyl group-substituted cycloalkyl group (preferably having a total carbon number of 5 to 20), a hydroxyalkoxy group-substituted alkyl group (preferably having a total carbon number of 3 to 15), and a hydroxyalkoxy group-substituted cycloalkyl group (preferably having a total carbon number of 5 to 20). As described above, a residue structure of a primary alcohol is preferred, and a structure represented by —(CH$_2$)$_n$—OH (n is an integer of 1 or more, preferably an integer of 2 to 4) is more preferred.

Rx represents a hydrogen atom, a halogen atom, a hydroxyl group, an alkyl group (preferably having a carbon number of 1 to 4) which may have a substituent, or a cycloalkyl group (preferably having a carbon number of 5 to 12) which may have a substituent. Preferred substituents which the alkyl group and cycloalkyl group of Rx may have include a hydroxyl group and a halogen atom. The halogen atom of Rx includes a fluorine atom, a chlorine atom, a bromine atom and an iodine atom. Rx is preferably a hydrogen atom, a methyl group, a hydroxymethyl group, a hydroxyl group or a trifluoromethyl group, more preferably a hydrogen atom or a methyl group.

R represents a hydrocarbon group which may have a hydroxyl group. The hydrocarbon group of R is preferably a saturated hydrocarbon group and includes an alkyl group (preferably having a carbon number of 1 to 8, more preferably from 2 to 4) and a monocyclic or polycyclic, cyclic hydrocarbon group (preferably having a carbon number of 3 to 20, for example, the later-described alicyclic group). n' represents an integer of 0 to 2.

The repeating unit (a1) is preferably a repeating unit derived from an ester of an acrylic acid, in which the α-position (for example, Rx in formula (2)) of the main chain may be substituted, and is more preferably derived from a monomer having a structure corresponding to formula (2). Also, it is preferred to contain an alicyclic group in the unit. The alicyclic group includes monocyclic and polycyclic structures but in view of etching resistance, a polycyclic structure is preferred.

Specific examples of the alicyclic structure include, as a monocyclic structure, cyclobutyl, cyclopentyl, cyclohexyl, cycloheptyl and cyclooctyl; and as a polycyclic structure, norbornyl, isobornyl, tricyclodecanyl, tetracyclododecanyl, hexacycloheptadecanyl, adamantyl, diamantyl, spirodecanyl and spiroundecanyl. Among these structures, adamantyl, diamantyl and norbornyl are preferred.

Examples of the repeating unit (a1) are illustrated below, but the present invention is not limited thereto. In specific examples, $R^x$ represents a hydrogen atom or a methyl group.

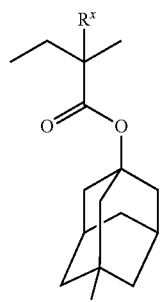 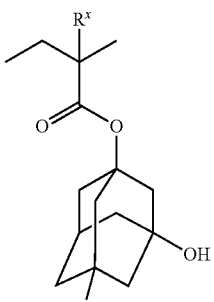

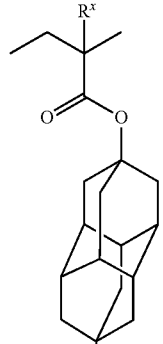 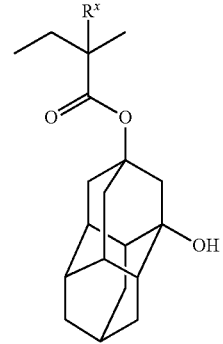

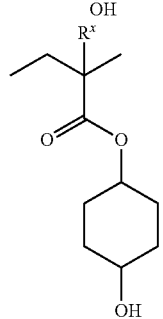 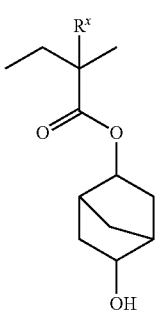 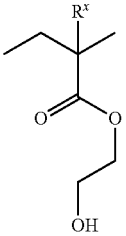

-continued

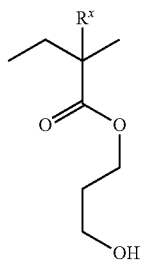 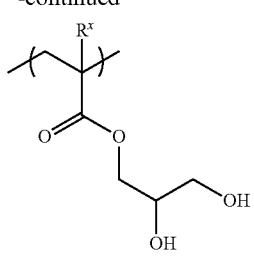

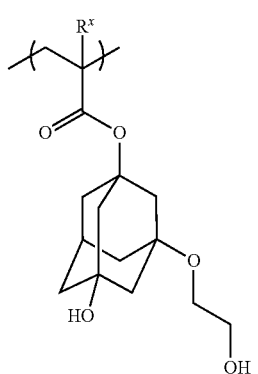

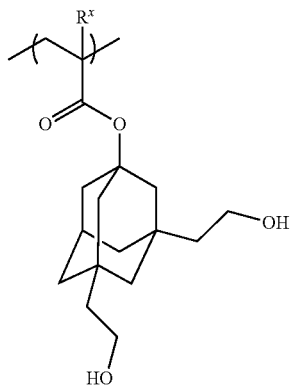

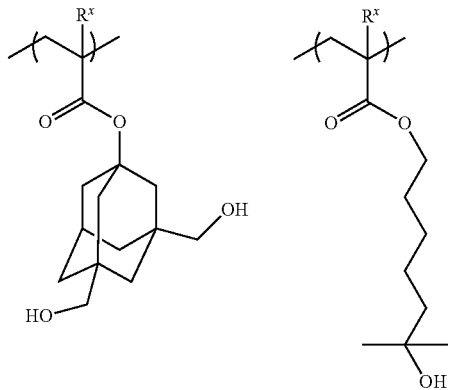

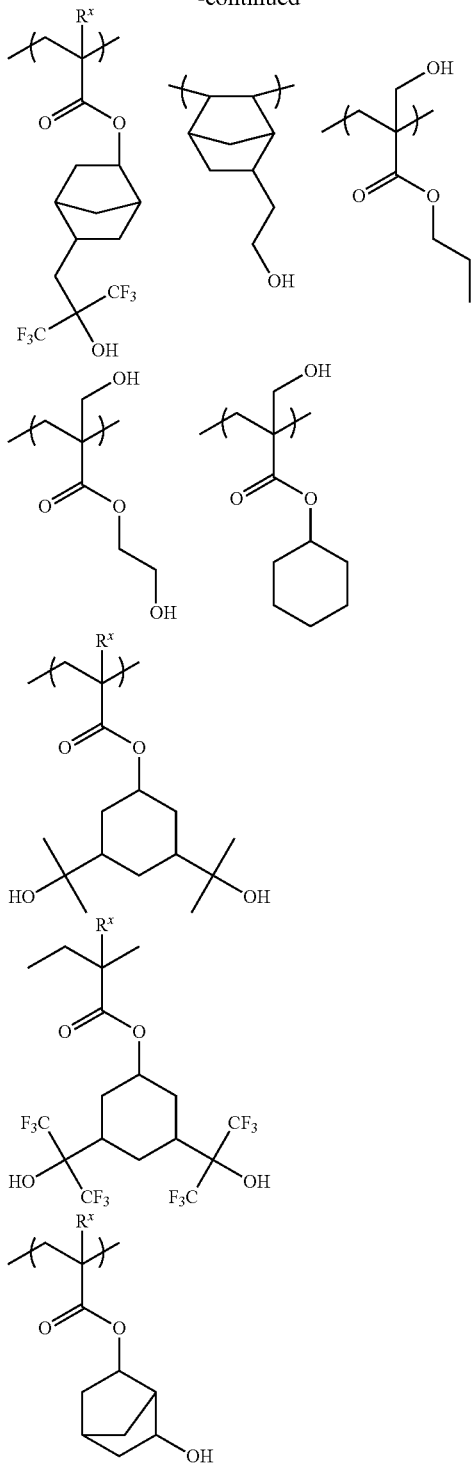

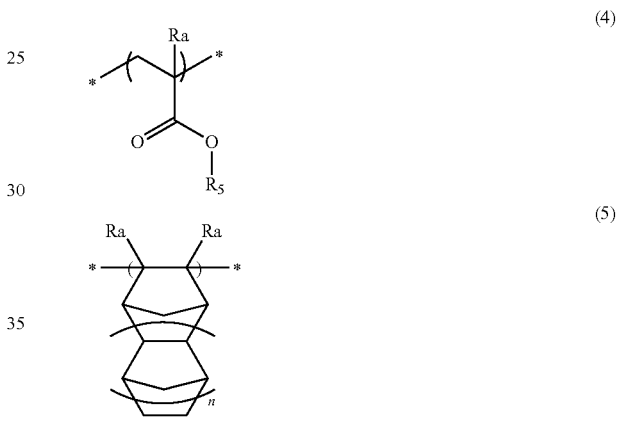

The repeating unit having an alcoholic hydroxyl group, as the repeating unit (a1), may have a structure where at least one of the later-described repeating units (a2) to (a4) has an alcoholic hydroxyl group. For example, in the (a4) repeating unit having an acid-decomposable group, the moiety capable of leaving by the action of an acid may have an alcoholic hydroxyl group. It is expected that the crosslinking efficiency can be optimized by containing such a repeating unit. Specific examples of such a structure include a structure where in formula (AI) shown later, the moiety of atomic group —$C(Rx_1)(Rx_2)(Rx_3)$ has a hydroxyl group, more specifically, a structure where in the later-described repeating unit represented by formula (2-1), $R_{10}$ is a hydroxyl group, a hydroxyl group-containing linear or branched alkyl group, or a hydroxyl group-containing cycloalkyl group.

(a2) Repeating Unit Having Nonpolar Group

The resin (A) for use in the present invention preferably contains (a2) a repeating unit having a nonpolar group. Thanks to this repeating unit, not only dissolving out of low molecular components from the resist film into the immersion liquid at the immersion exposure can be reduced but also the solubility of the resin at the development using an organic solvent-containing developer can be appropriately adjusted. The (a2) repeating unit having a nonpolar group is preferably a repeating unit not containing a polar group (for example, the above-described acid group, a hydroxyl group or a cyano group) in the repeating unit and is preferably a repeating unit not having the later-described acid-decomposable group and lactone structure. Such a repeating unit includes a repeating unit represented by formula (4) or (5):

In the formulae, $R_5$ represents a hydrocarbon group having neither a hydroxyl group nor a cyano group.

Ra represents, when a plurality of Ra's are present, each independently represents, a hydrogen atom, a hydroxyl group, a halogen atom or an alkyl group (preferably having a carbon number of 1 to 4). The alkyl group of Ra may have a substituent, and the substituent includes a hydroxyl group and a halogen atom. The halogen atom of Ra includes a fluorine atom, a chlorine atom, a bromine atom and an iodine atom. Ra is preferably a hydrogen atom, a methyl group, a trifluoromethyl group or a hydroxymethyl group, more preferably a hydrogen atom or a methyl group.

n represents an integer of 0 to 2.

$R_5$ preferably contains at least one cyclic structure.

The hydrocarbon group in $R_5$ includes, for example, a chain or branched hydrocarbon group, a monocyclic hydrocarbon group and a polycyclic hydrocarbon group. In view of dry etching resistance, $R_5$ preferably contains a monocyclic hydrocarbon group or a polycyclic hydrocarbon group, more preferably a polycyclic hydrocarbon group.

$R_5$ is preferably a group represented by -$L_4$-$A_4$-$(R_4)_{n4}$. $L_4$ represents a single bond or a divalent hydrocarbon group and is preferably a single bond, an alkylene group (preferably having a carbon number of 1 to 3) or a cycloalkylene group (preferably having a carbon number of 5 to 7), more preferably a single bond. $A_4$ represents an (n4+1)-valent hydrocarbon group (preferably having a carbon number of 3 to 30, more preferably from 3 to 14, still more preferably from 6 to 12), preferably a monocyclic or polycyclic alicyclic hydrocarbon group. n4 represents an integer of 0 to 5, preferably an integer of 0 to 3. $R_4$ represents a hydrocarbon group, preferably an alky group (preferably having a carbon number of 1 to 3) or a cycloalkyl group (preferably having a carbon number of 5 to 7).

The chain or branched hydrocarbon group includes, for example, an alkyl group having a carbon number of 3 to 12, and the monocyclic hydrocarbon group includes, for example, a cycloalkyl group having a carbon number of 3 to 12, a cycloalkenyl group having a carbon number of 3 to 12, and a phenyl group. The monocyclic hydrocarbon group is preferably a monocyclic saturated hydrocarbon group having a carbon number of 3 to 7.

The polycyclic hydrocarbon group includes a ring assembly hydrocarbon group (e.g., bicyclohexyl group) and a crosslinked cyclic hydrocarbon group. The crosslinked cyclic hydrocarbon group includes a bicyclic hydrocarbon group, a tricyclic hydrocarbon group, a tetracyclic hydrocarbon group and the like. The crosslinked cyclic hydrocarbon group also includes a condensed cyclic hydrocarbon group (for example, a group formed by fusing a plurality of 5- to 8-membered cycloalkane rings). Preferred crosslinked cyclic hydrocarbon groups are a norbornyl group and an adamantyl group.

These groups may further have a substituent, and preferred examples of the substituent include a halogen atom and an alkyl group. The halogen atom is preferably bromine atom, chlorine atom or fluorine atom, and the alkyl group is preferably a methyl group, an ethyl group, a butyl group or a tert-butyl group. This alkyl group may further have a substituent, and the substituent which the alkyl group may further have includes a halogen atom and an alkyl group.

Specific examples of the repeating unit having a nonpolar group are illustrated below, but the present invention is not limited thereto. In the formulae, Ra represents a hydrogen atom, a hydroxyl group, a halogen atom, or an alkyl group having a carbon number of 1 to 4, which may have a substituent. Preferred substituents which the alkyl group of Ra may have include a hydroxyl group and a halogen atom. The halogen atom of Ra includes a fluorine atom, a chlorine atom, a bromine atom and an iodine atom. Ra is preferably a hydrogen atom, a methyl group, a hydroxymethyl group or a trifluoromethyl group, more preferably a hydrogen atom or a methyl group.

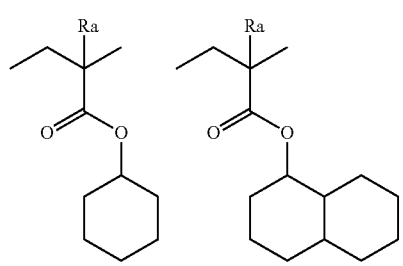

-continued

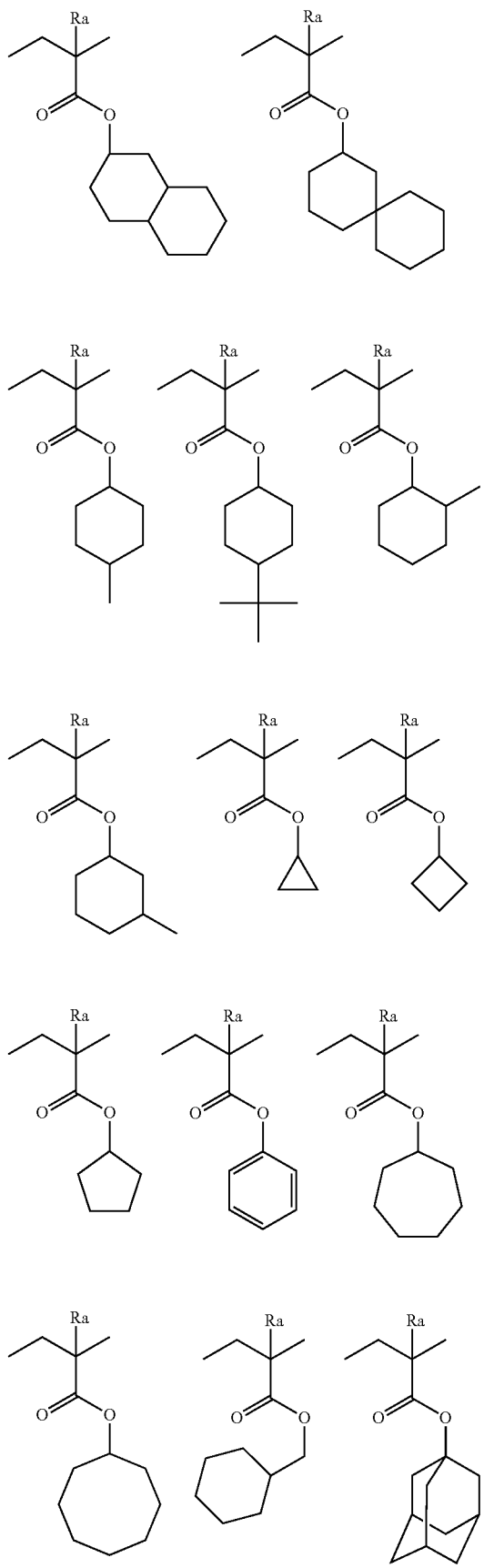

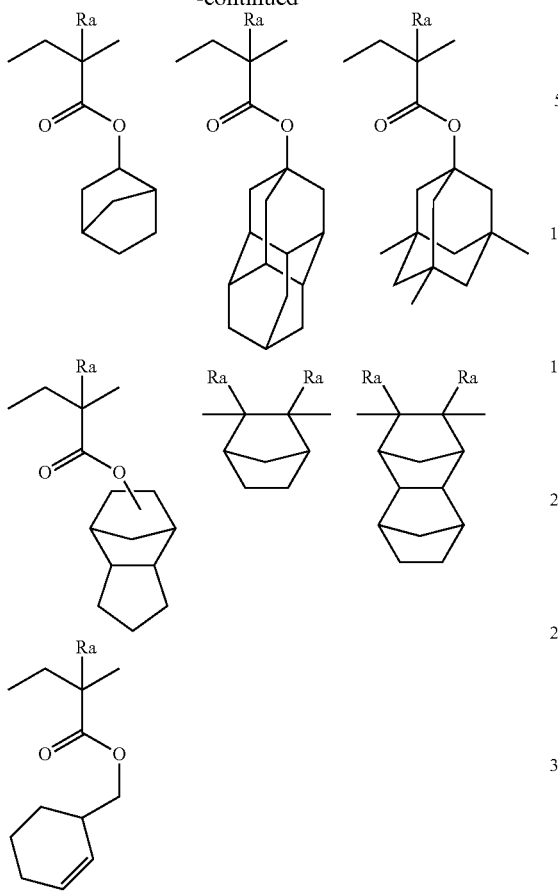

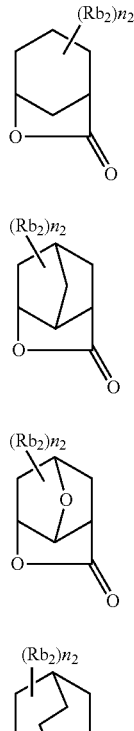

(a3) Repeating Unit Having Lactone Structure

The resin (A) may contain a repeating unit having a lactone structure.

Any lactone structure may be used, but a 5- to 7-membered ring lactone structure is preferred, and a 5- to 7-membered ring lactone structure to which another ring structure is fused to form a bicyclo or spiro structure is preferred. It is more preferred to contain a repeating unit having a lactone structure represented by any of the following formulae (LC1-1) to (LC1-17). The lactone structure may be bonded directly to the main chain. Among these lactone structures, (LC1-1), (LC1-4), (LC1-5), (LC1-6), (LC1-13), (LC1-14) and (LC1-17) are preferred. By virtue of using a specific lactone structure, LWR and development defect are improved.

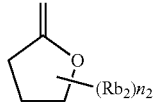

LC1-1

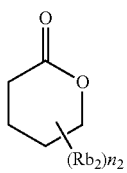

LC1-2

LC1-3

LC1-4

LC1-5

LC1-6

LC1-7

LC1-8

LC1-9

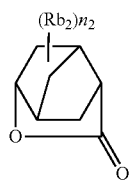

LC1-10

-continued

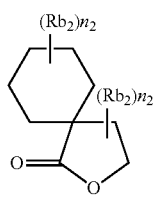
LC1-11

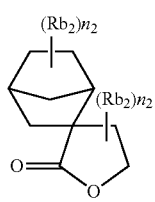
LC1-12

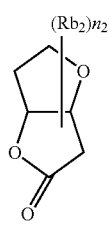
LC1-13

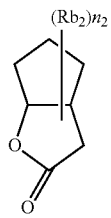
LC1-14

LC1-15

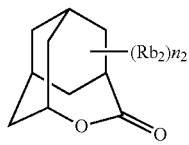
LC1-16

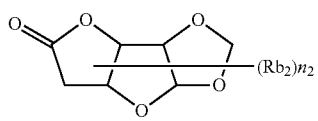
LC1-17

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Among these, an alkyl group having a carbon number of 1 to 4, a cyano group and an acid-decomposable group are more preferred. $n_2$ represents an integer of 0 to 4. When $n_2$ is an integer of 2 or more, each substituent ($Rb_2$) may be the same as or different from every other substituents ($Rb_2$), and also, the plurality of substituents ($Rb_2$) may combine together to form a ring.

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90% or more, more preferably 95% or more.

The repeating unit having a lactone structure is preferably a repeating unit represented by the following formula (AII):

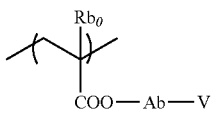

(AII)

In formula (AII), $Rb_0$ represents a hydrogen atom, a halogen atom, or an alkyl group having a carbon number of 1 to 4, which may have a substituent. Preferred substituents which the alkyl group of $Rb_0$ may have include a hydroxyl group and a halogen atom. The halogen atom of $Rb_0$ includes a fluorine atom, a chlorine atom, a bromine atom and an iodine atom. $Rb_0$ is preferably a hydrogen atom, a methyl group, a hydroxymethyl group or a trifluoromethyl group, more preferably a hydrogen atom or a methyl group.

Ab represents a single bond, an alkylene group, a divalent linking group having a monocyclic or polycyclic aliphatic hydrocarbon ring structure, an ether group, an ester group, a carbonyl group, or a divalent linking group formed by combining these, and is preferably a single bond or a divalent linking group represented by -$Ab_1$-$CO_2$—.

$Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a lactone structure and specifically represents, for example, a group having a structure represented by any of formulae (LC1-1) to (LC1-17).

Specific examples of the repeating unit having a lactone structure are illustrated below, but the present invention is not limited thereto.

(In the formulae, Rx represents H, $CH_3$, $CH_2OH$ or $CF_3$.)

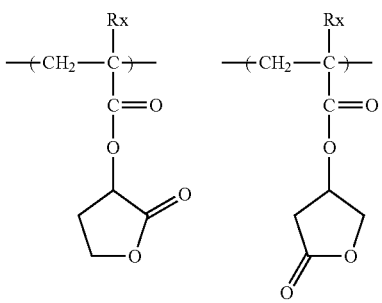

-continued
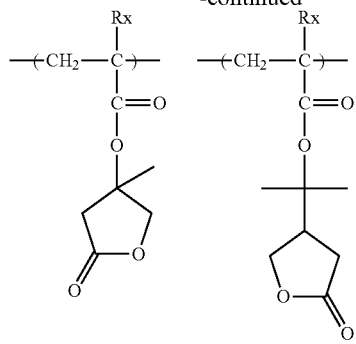
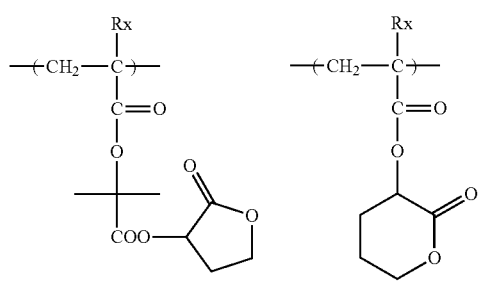
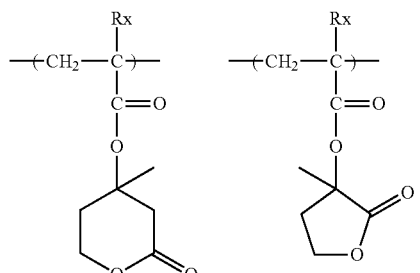
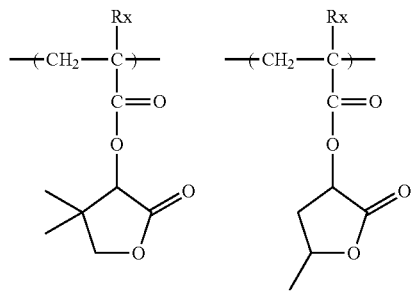
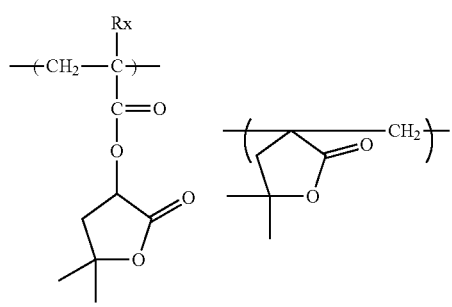
-continued
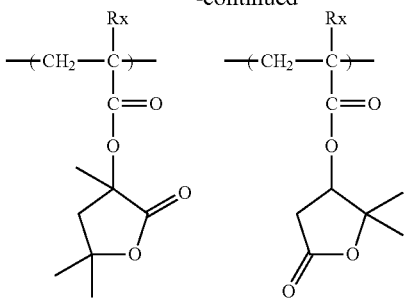
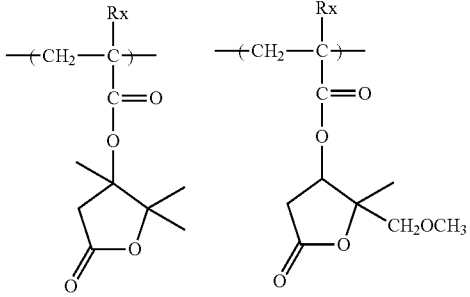
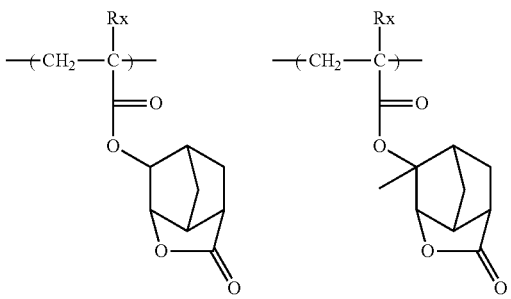
(In the formulae, Rx represents H, CH$_3$, CH$_2$OH or CF$_3$.)
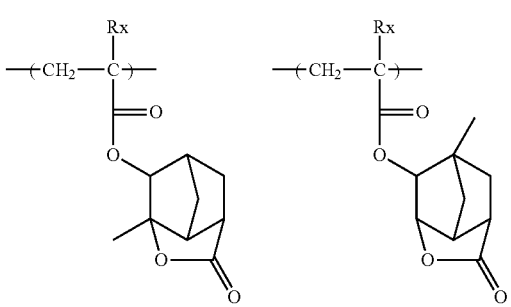

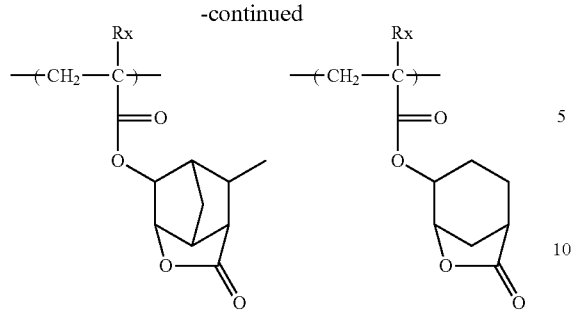
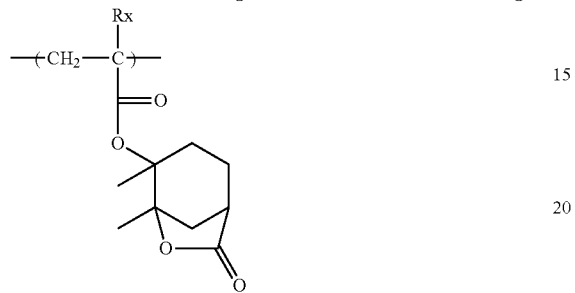
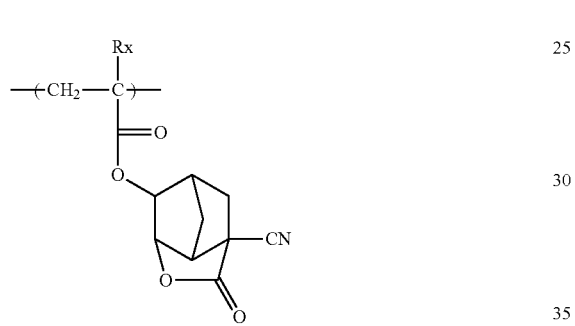
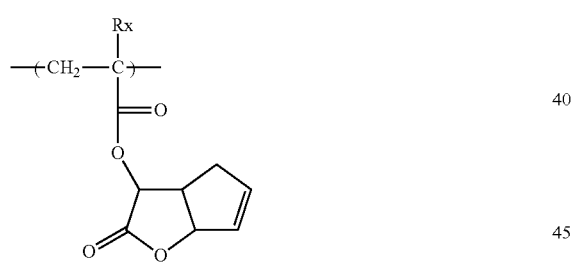
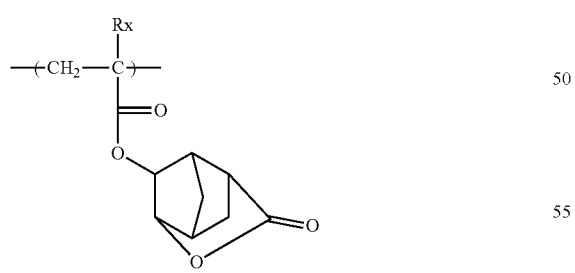
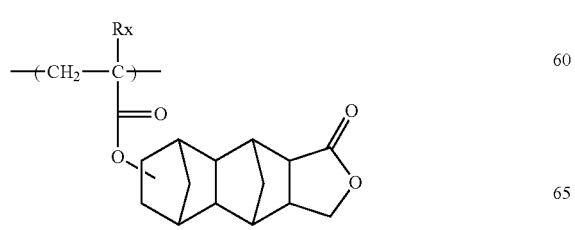
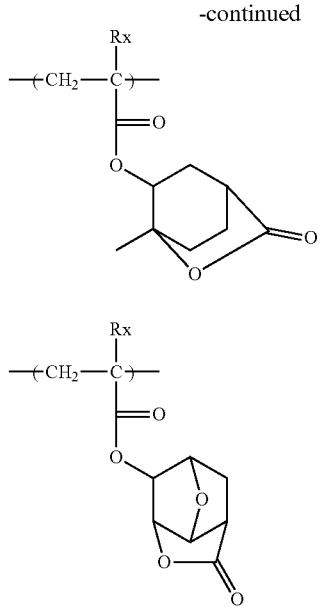
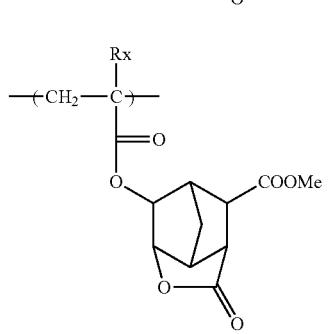
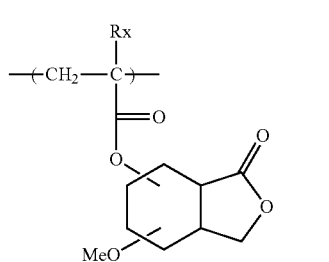
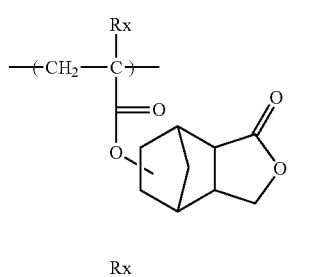
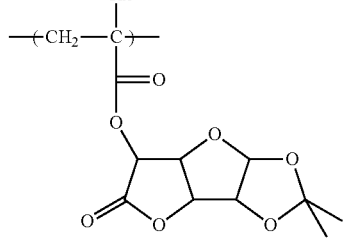

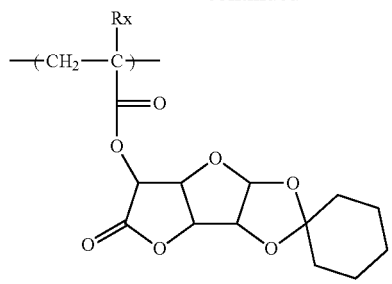
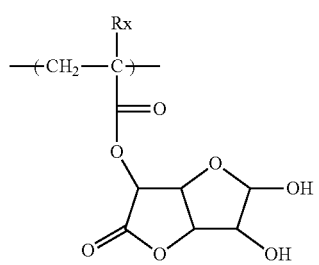
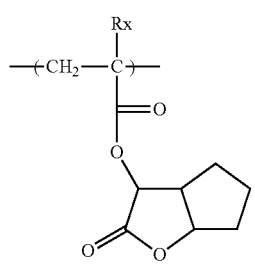
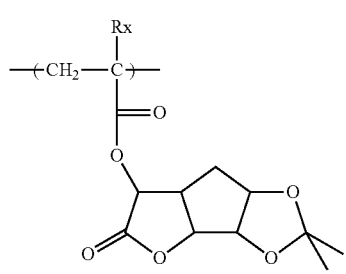
(In the formulae, Rx represents H, CH₃, CH₂OH or CF₃.)
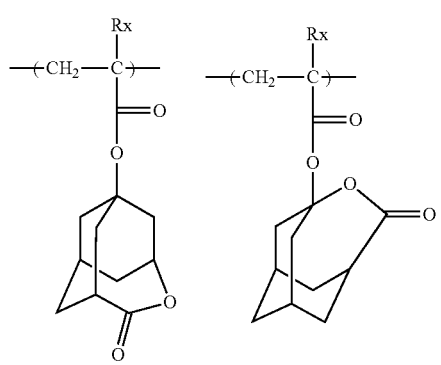
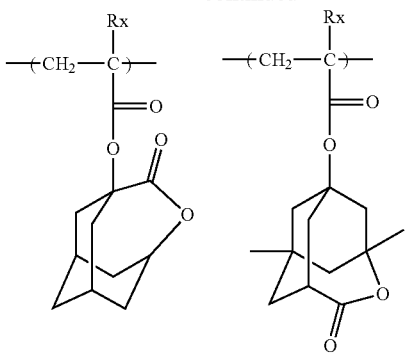
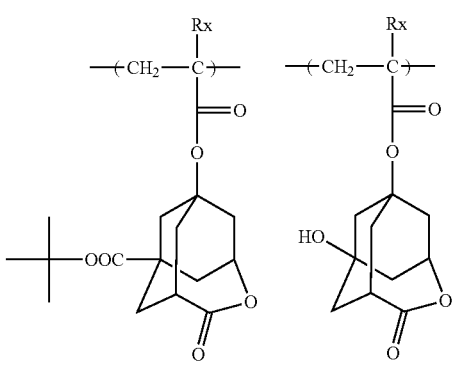
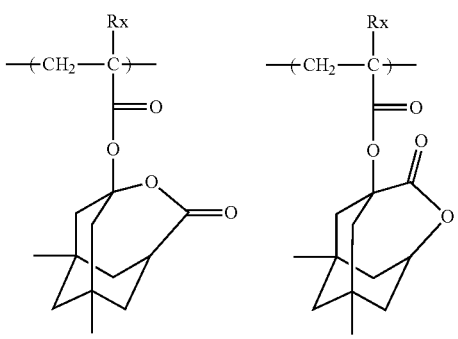
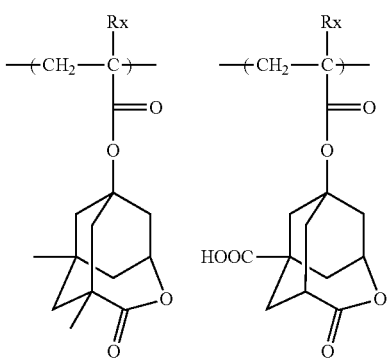

-continued

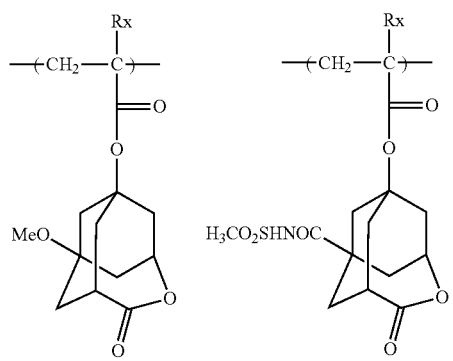

Particularly preferred repeating units having a lactone structure include the following repeating units. By selecting an optimal lactone structure, the pattern profile and the iso/dense bias are improved.

(In the formulae, Rx represents H, CH$_3$, CH$_2$OH or CF$_3$.)

It is preferred to contain a unit represented by the following formula (III) as the lactone structure-containing repeating unit.

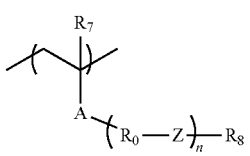

(III)

In formula (III), A represents an ester bond (a group represented by —COO—) or an amido bond (a group represented by —CONH—).

R$_0$ represents, when a plurality of R$_0$'s are present, each independently represents, an alkylene group, a cycloalkylene group or a combination thereof.

Z represents, when a plurality of Z's are present, each independently represents, an ether bond, an ester bond, an amide bond, a urethane bond (a group represented by

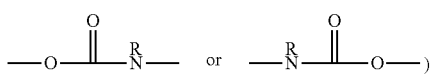

or a urea bond
(a group represented by

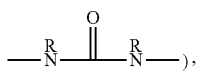

wherein each R independently represents a hydrogen atom, an alkyl group, a cycloalkyl group or an aryl group.

$R_8$ represents a monovalent organic group having a lactone structure.

n is the repetition number of the structure represented by —$R_0$—Z— and represents an integer of 1 to 5, preferably 1.

$R_7$ represents a hydrogen atom, a halogen atom or an alkyl group.

The alkylene group and cycloalkylene group of $R_0$ may have a substituent.

Z is preferably an ether bond or an ester bond, more preferably an ester bond.

The alkyl group of $R_7$ is preferably an alkyl group having a carbon number of 1 to 4, more preferably a methyl group or an ethyl group, still more preferably a methyl group.

The alkyl group in the alkylene group and cycloalkylene group of $R_0$ and in $R_7$ may be substituted, and examples of the substituent include a halogen atom such as fluorine atom, chlorine atom and bromine atom, a mercapto group, a hydroxyl group, an alkoxy group such as methoxy group, ethoxy group, isopropoxy group, tert-butoxy group and benzyloxy group, and an acyloxy group such as acetyloxy group and propionyloxy group.

$R_7$ is preferably a hydrogen atom, a methyl group, a trifluoromethyl group or a hydroxymethyl group.

The chain alkylene group in $R_0$ is preferably a chain alkylene group having a carbon number of 1 to 10, more preferably from 1 to 5, and examples thereof include a methylene group, an ethylene group and a propylene group. The cycloalkylene group is preferably a cycloalkylene group having a carbon number of 3 to 20, and examples thereof include a cyclohexylene group, a cyclopentylene group, a norbornylene group and an adamantylene group. For bringing out the effects of the present invention, a chain alkylene group is more preferred, and a methylene group is still more preferred.

The lactone structure-containing monovalent organic group represented by $R_8$ is not limited as long as it has a lactone structure. Specific examples thereof include lactone structures represented by formulae (LC1-1) to (LC1-17) and among these, a structure represented by (LC1-4) is preferred. Also, structures where $n_2$ in (LC1-1) to (LC1-17) is an integer of 2 or less are more preferred.

$R_8$ is preferably a monovalent organic group having an unsubstituted lactone structure, or a monovalent organic group having a lactone structure containing a methyl group, a cyano group or an alkoxycarbonyl group as the substituent, more preferably a monovalent organic group having a lactone structure containing a cyano group as the substituent (cyanolactone).

Specific examples of the repeating unit having a lactone structure-containing group represented by formula (III) are illustrated below, but the present invention is not limited thereto.

In specific examples, R represents a hydrogen atom, an alkyl group which may have a substituent, or a halogen atom, preferably a hydrogen atom, a methyl group, a hydroxymethyl group or an acetyloxymethyl group.

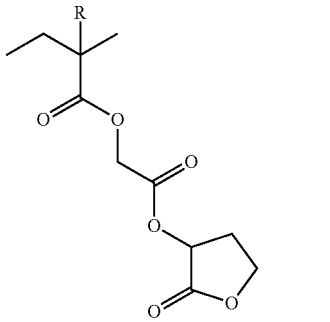

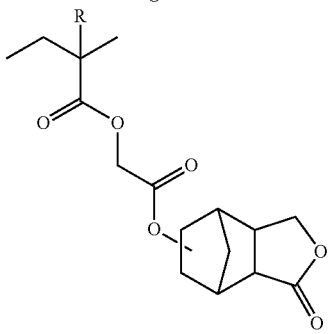

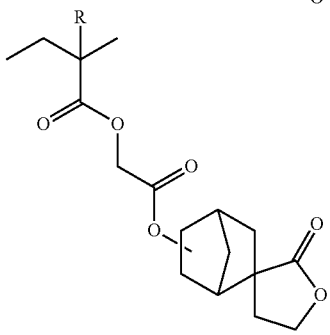

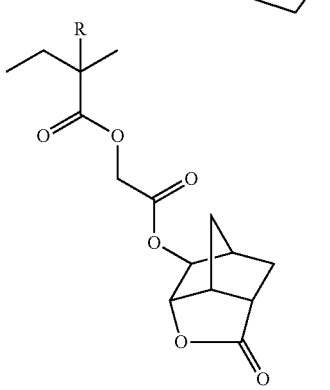

-continued

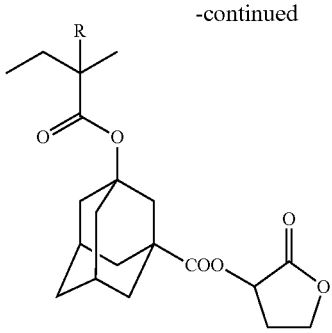

The lactone structure-containing repeating unit is more preferably a repeating unit represented by the following formula (III-1):

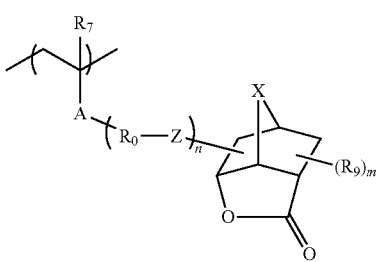

(III-1)

In formula (III-1), $R_7$, A, $R_0$, Z and n have the same meanings as in formula (III).

$R_9$ represents, when a plurality of $R_9$'s are present, each independently represents, an alkyl group, a cycloalkyl group, an alkoxycarbonyl group, a cyano group, a hydroxyl group or an alkoxy group, and when a plurality of $R_9$'s are present, two members thereof may combine to form a ring.

X represents an alkylene group, an oxygen atom or a sulfur atom.

m is the number of substituents and represents an integer of 0 to 5. m is preferably 0 or 1.

The alkyl group of $R_9$ is preferably an alkyl group having a carbon number of 1 to 4, more preferably a methyl group or an ethyl group, and most preferably a methyl group. The cycloalkyl group includes a cyclopropyl group, a cyclobutyl group, a cyclopentyl group and a cyclohexyl group. Examples of the alkoxycarbonyl group include a methoxycarbonyl group, an ethoxycarbonyl group, an n-butoxycarbonyl group and a tert-butoxycarbonyl group. Examples of the alkoxy group include a methoxy group, an ethoxy group, a propoxy group, an isopropoxy group and a butoxy group. These groups may have a substituent, and the substituent includes a hydroxy group, an alkoxy group such as methoxy group and ethoxy group, a cyano group, and a halogen atom such as fluorine atom. $R_9$ is preferably a methyl group, a cyano group or an alkoxycarbonyl group, more preferably a cyano group.

Examples of the alkylene group of X include a methylene group and an ethylene group. X is preferably an oxygen atom or a methylene group, more preferably a methylene group.

When m is an integer of 1 or more, at least one $R_9$ is preferably substituted on the α-position or β-position, more preferably on the α-position, of the carbonyl group of lactone.

Specific examples of the repeating unit having a lactone structure-containing group represented by formula (III-1) are illustrated below, but the present invention is not limited thereto. In specific examples, R represents a hydrogen atom, an alkyl group which may have a substituent, or a halogen atom, preferably a hydrogen atom, a methyl group, a hydroxymethyl group or an acetoxymethyl group.

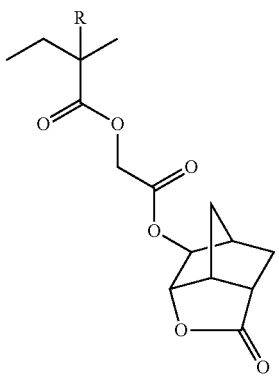

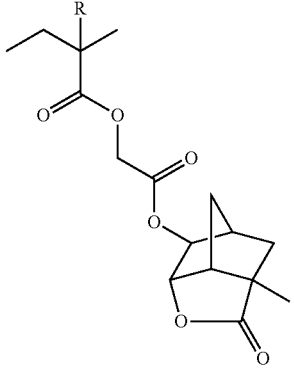

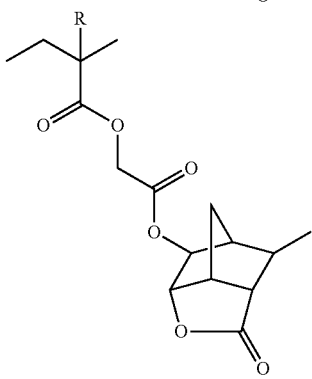

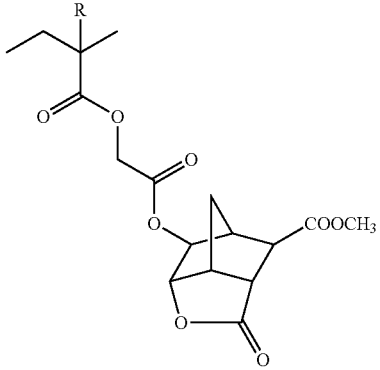

31
-continued
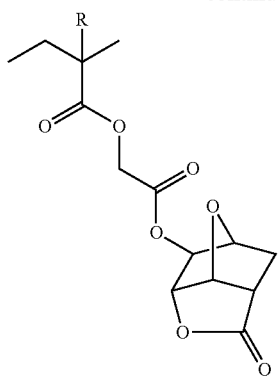
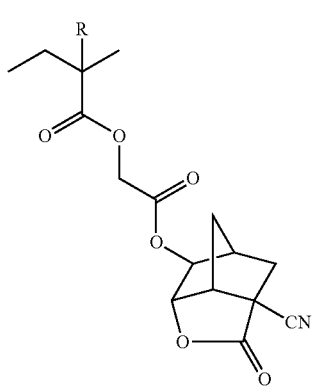
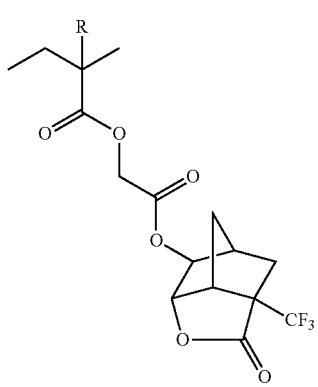
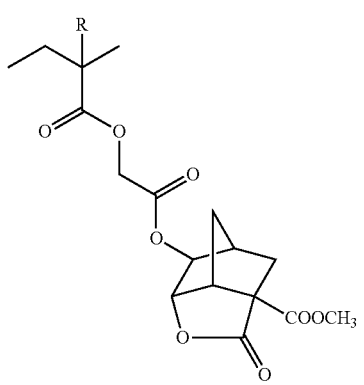
32
-continued
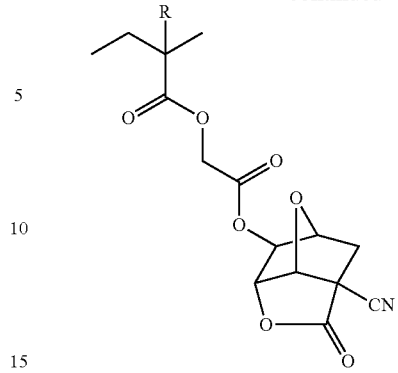
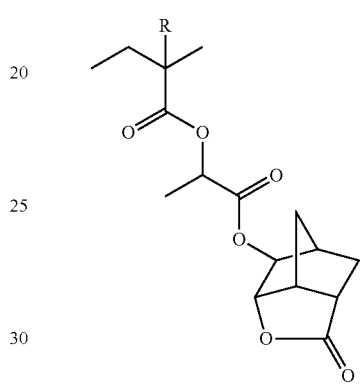
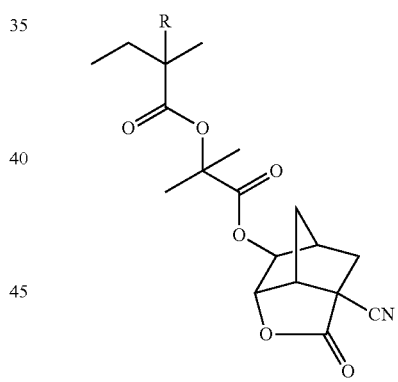
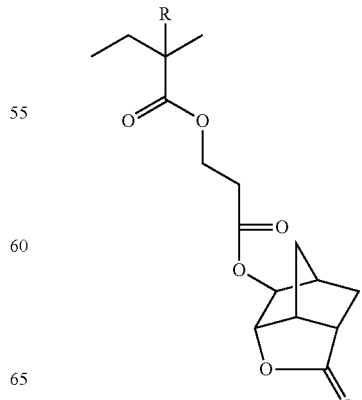

33
-continued
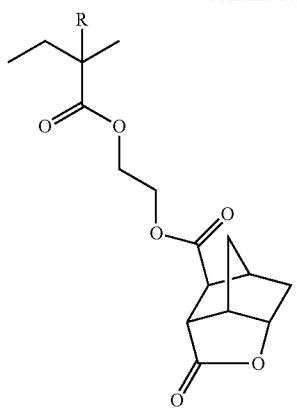
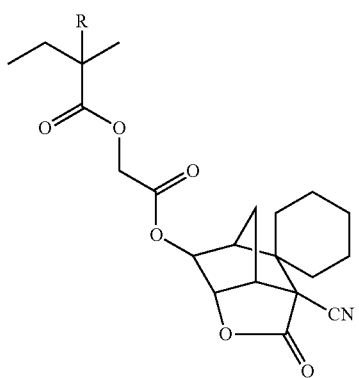
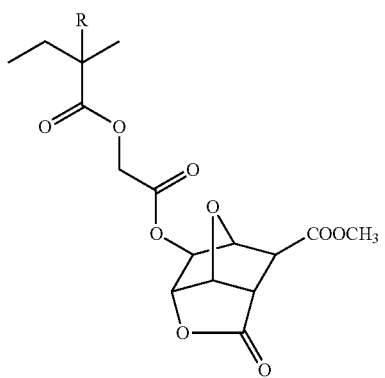
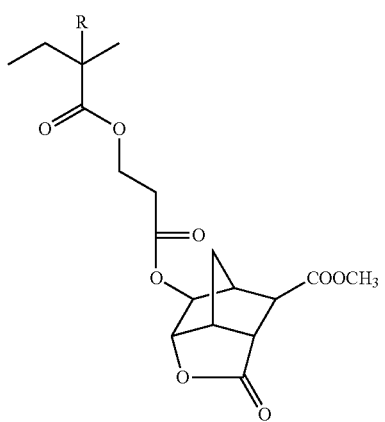
34
-continued
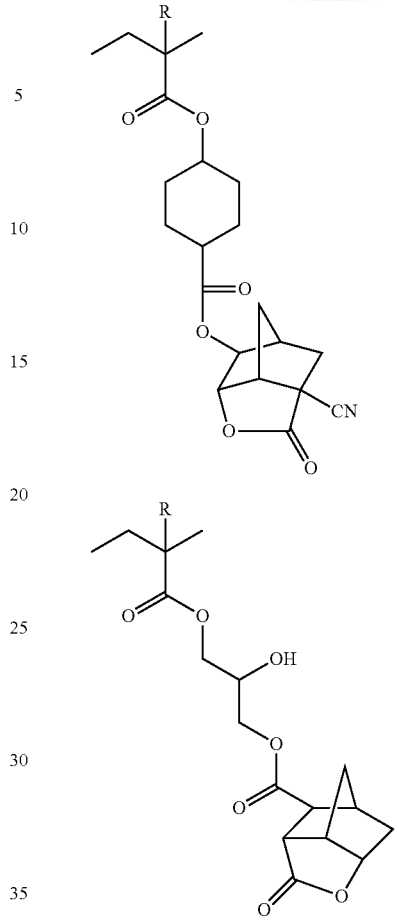
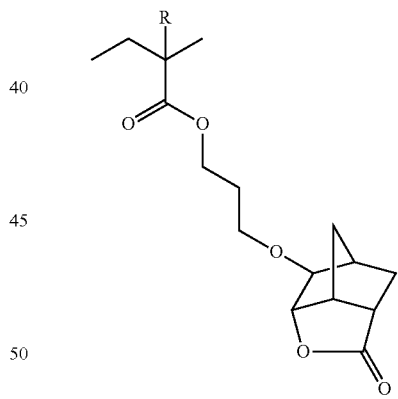
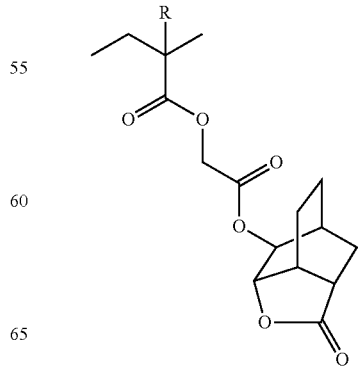

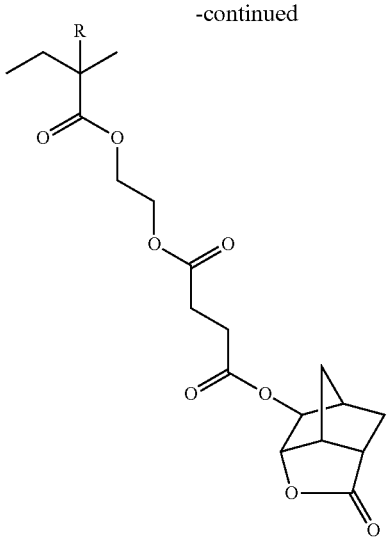
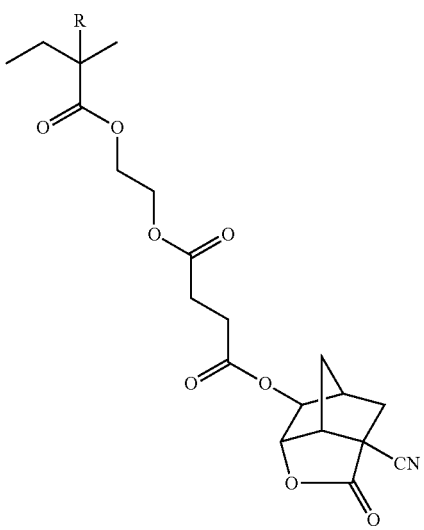
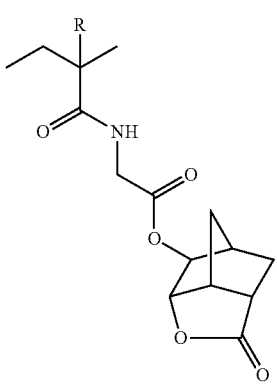
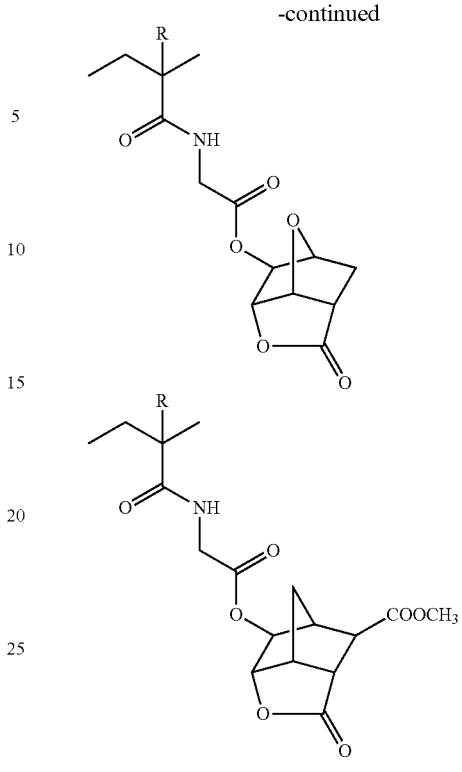

Two or more kinds of lactone repeating units may be also used in combination for raising the effects of the present invention. In the case of a combination use, it is also preferred that out of formula (III), two or more kinds of lactone repeating units where n is 1 are selected and used in combination.

(a4) Repeating Unit Having Acid-Decomposable Group

The resin (A) may contain a repeating unit having a group capable of decomposing by the action of an acid to produce a polar group (hereinafter sometimes referred to as an "acid-decomposable group"), on either one or both of the main chain and the side chain of the resin. It is considered that when a polar group is produced in the resin (A), the affinity for an organic solvent-containing developer is reduced and insolubilization or difficult solubilization (negative conversion) is more accelerated. Also, by virtue of containing an acid-decomposable unit, the line width roughness (LWR) performance is improved.

The acid-decomposable group preferably has a structure where a polar group is protected with a group capable of decomposing and leaving by the action of an acid.

The polar group is not particularly limited as long as it is a group capable of being insolubilized in an organic solvent-containing developer, but an acidic group (a group capable of dissociating in an aqueous 2.38 mass % tetramethylammonium hydroxide solution which is conventionally used as the developer for resist) such as carboxyl group, fluorinated alcohol group (preferably hexafluoroisopropanol) and sulfonic acid group is preferred.

The group preferred as the acid-decomposable group is a group where a hydrogen atom of the group above is substituted for by a group capable of leaving by the action of an acid.

Examples of the group capable of leaving by the action of an acid include —C($R_{36}$)($R_{37}$)($R_{38}$), —C($R_{36}$)($R_{37}$)(O$R_{39}$) and —C($R_{01}$)($R_{02}$)(O$R_{39}$).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably a cumyl ester group, an enol ester group, an acetal ester group, a tertiary alkyl ester group or the like, more preferably a tertiary alkyl ester group.

The acid-decomposable group-containing repeating unit which can be contained in the resin (A) is preferably a repeating unit represented by the following formula (AI):

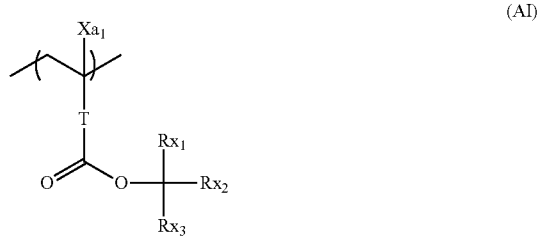

(AI)

In formula (AI), $Xa_1$ represents a hydrogen atom, a methyl group which may have a substituent, or a group represented by —$CH_2$—$R_9$. $R_9$ represents a hydroxyl group or a monovalent organic group. Examples of the monovalent organic group include an alkyl group having a carbon number of 5 or less and an acyl group having a carbon number of 5 or less. Of these, an alkyl group having a carbon number of 3 or less is preferred, and a methyl group is more preferred. $Xa_1$ is preferably a hydrogen atom, a methyl group, a trifluoromethyl group or a hydroxymethyl group, more preferably a hydrogen atom, a methyl group or a hydroxymethyl group.

T represents a single bond or a divalent linking group.

Each of $Rx_1$ to $Rx_3$ independently represents an alkyl group (linear or branched) or a cycloalkyl group (monocyclic or polycyclic).

$Rx_2$ and $Rx_3$ may combine to form a cycloalkyl group (monocyclic or polycyclic).

Examples of the divalent linking group of T include an alkylene group, a —COO-Rt- group, a —O-Rt- group, and a group formed by combining two or more thereof, and a linking group having a total carbon number of 1 to 12 is preferred. In the formulae, Rt represents an alkylene group or a cycloalkylene group.

T is preferably a single bond or a —COO-Rt- group. Rt is preferably an alkylene group having a carbon number of 1 to 5, more preferably a —$CH_2$— group, a —$(CH_2)_2$— group or a —$(CH_2)_3$— group.

The alkyl group of $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group of $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group formed by combining $Rx_2$ and $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group. Above all, a monocyclic cycloalkyl group having a carbon number of 5 to 6 is preferred.

An embodiment where $Rx_1$ is a methyl group or an ethyl group and $Rx_2$ and $Rx_3$ are combined to form the above-described cycloalkyl group is preferred.

Each of the groups above may have a substituent, and examples of the substituent include an alkyl group (having a carbon number of 1 to 4), a cycloalkyl group (having a carbon number of 3 to 15), a halogen atom, a hydroxyl group, an alkoxy group (having a carbon number of 1 to 4), a carboxyl group and an alkoxycarbonyl group (having a carbon number of 2 to 6). The carbon number is preferably 8 or less.

Specific preferred examples of the repeating unit having an acid-decomposable group are illustrated below, but the present invention is not limited thereto.

In specific examples, each of Rx and $Xa_1$ represents a hydrogen atom, $CH_3$, $CF_3$ or $CH_2OH$, and each of Rxa and Rxb represents an alkyl group having a carbon number of 1 to 4. Z represents a substituent containing a polar group, and when a plurality of Z's are present, each is independent from every others. p represents 0 or a positive integer. Specific examples and preferred examples of Z are the same as specific examples and preferred examples of $R_{10}$ in formula (2-1) described later.

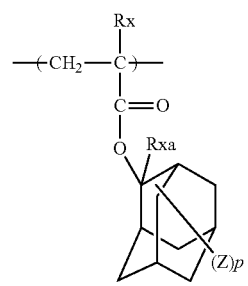

1

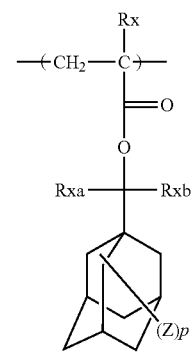

2

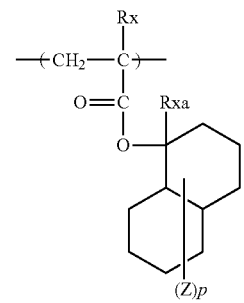

3

4
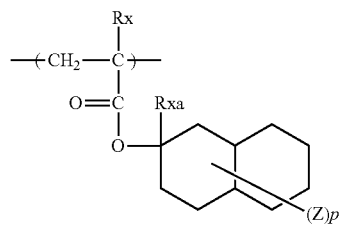
5
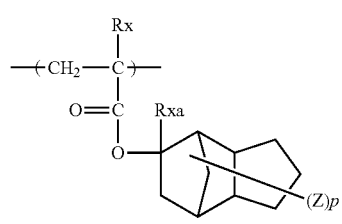
6
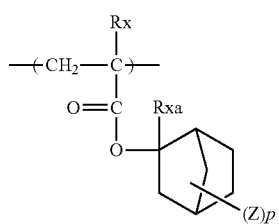
7
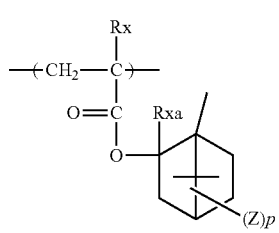
8
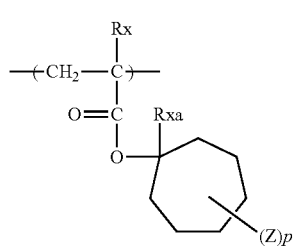
9
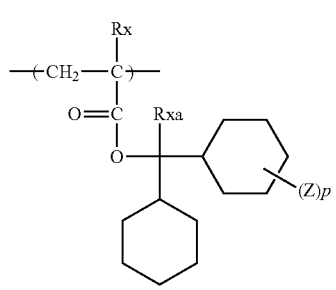
10
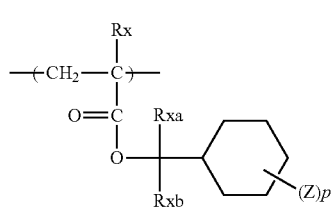
11
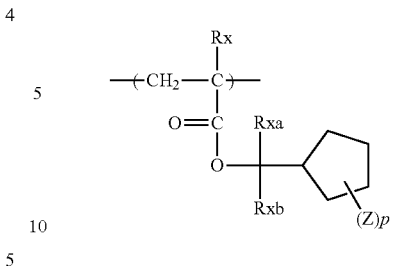
12
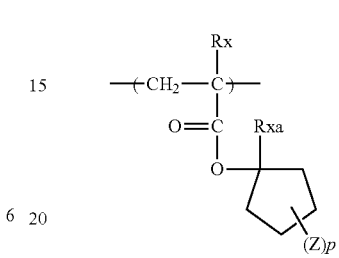
13
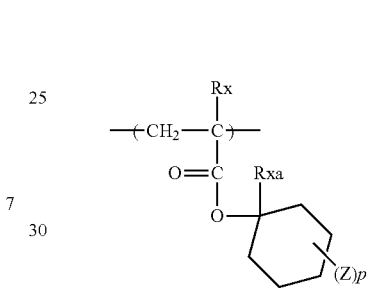
14
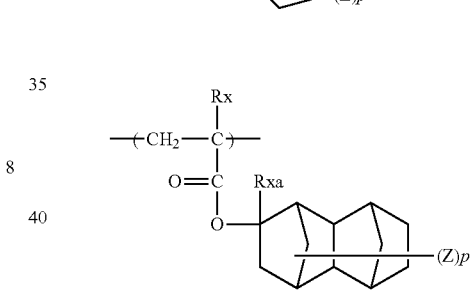
15
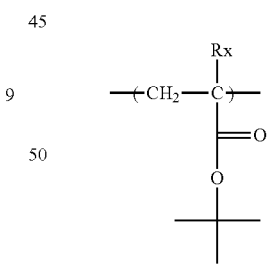
16
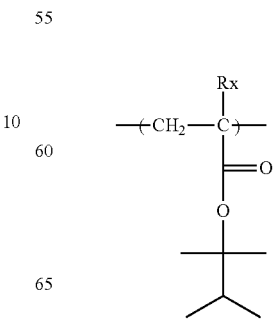

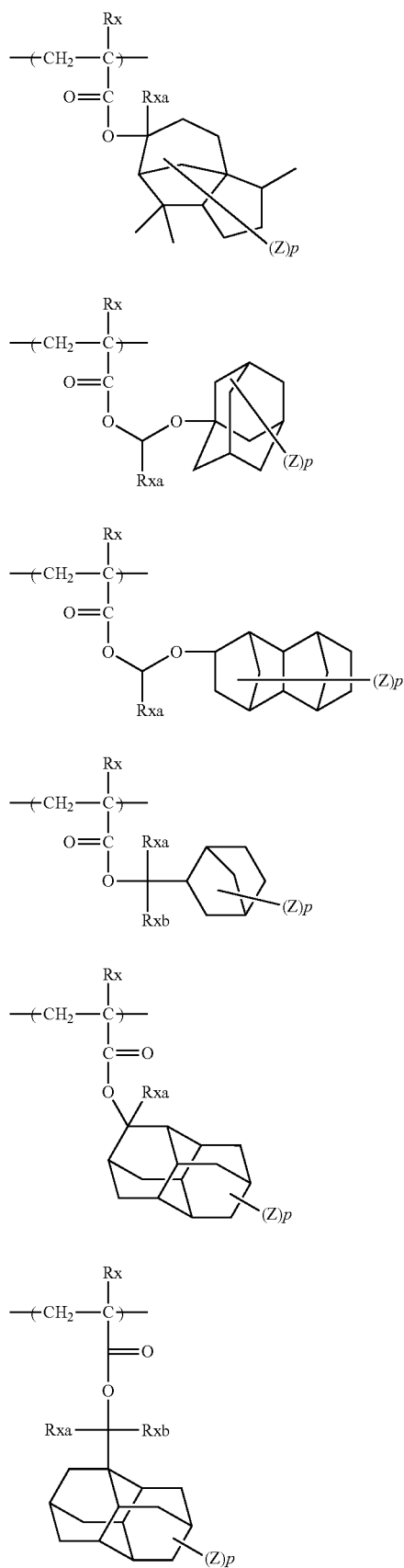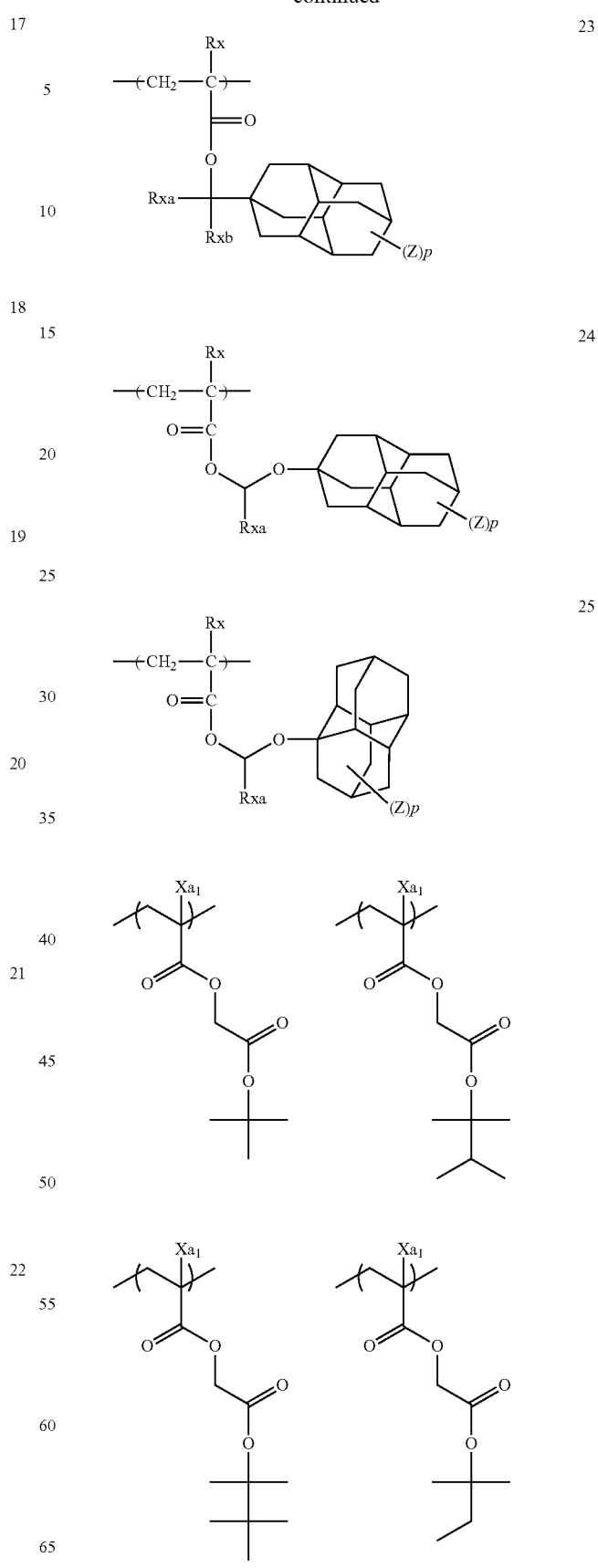

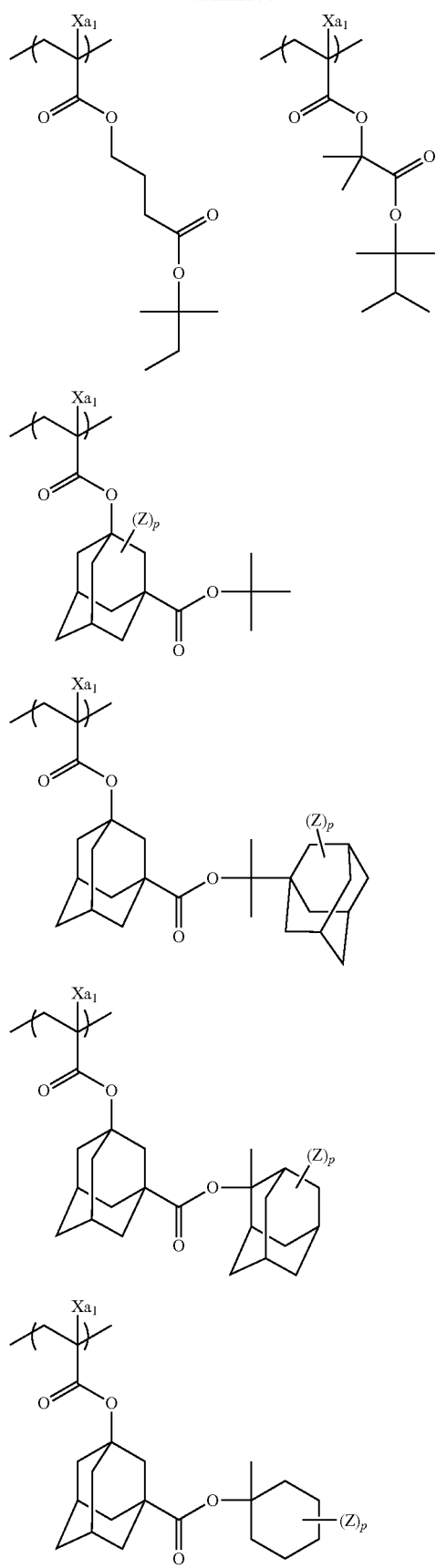
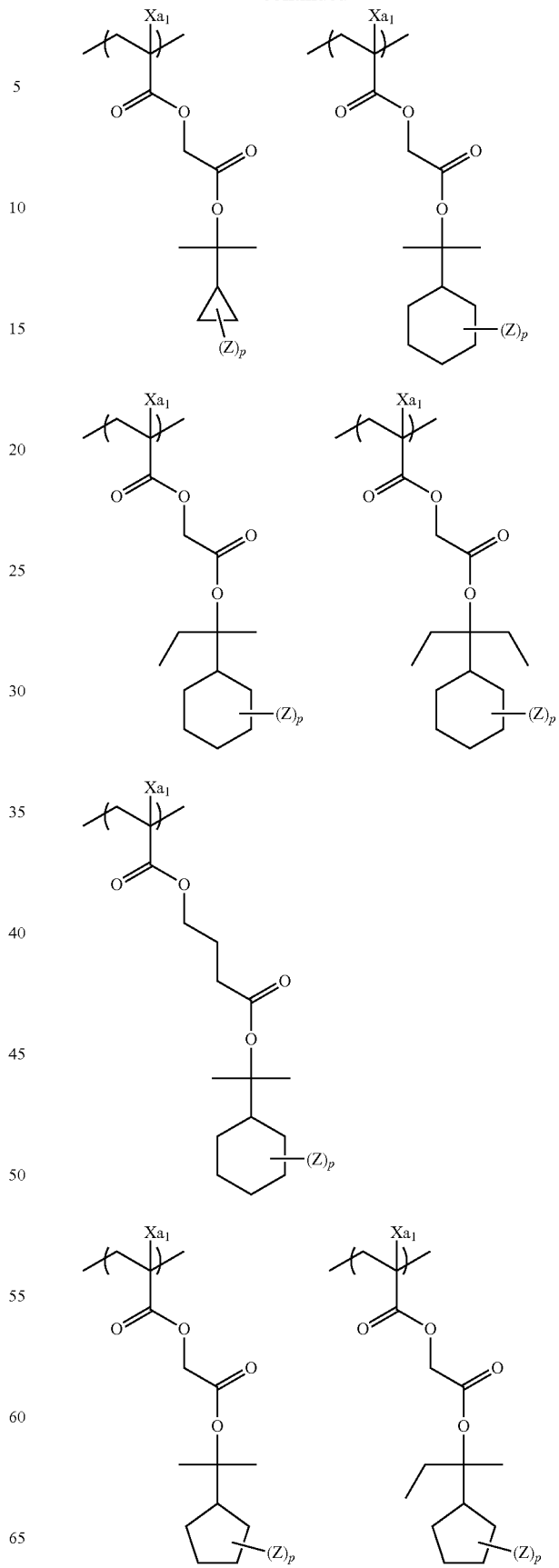

-continued
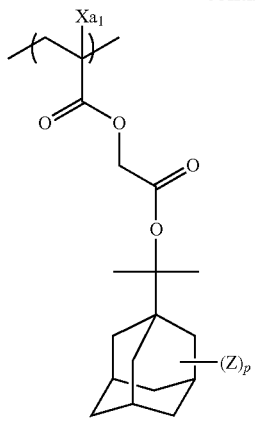 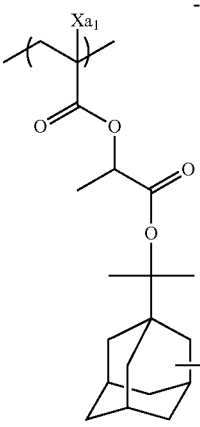 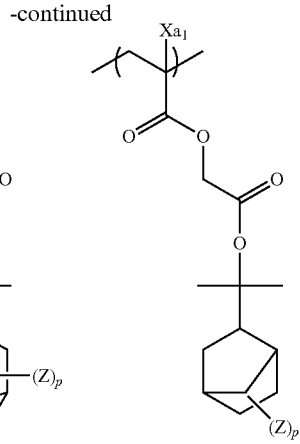
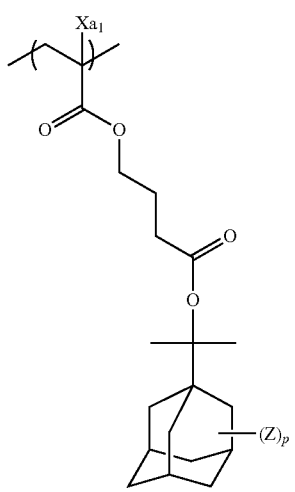 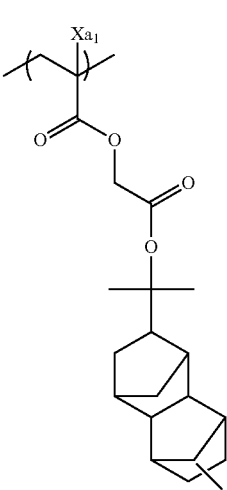 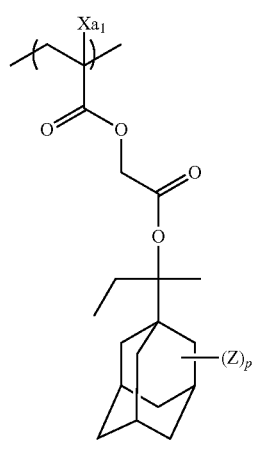
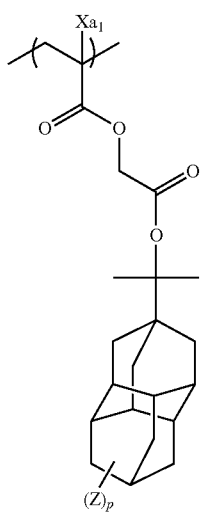 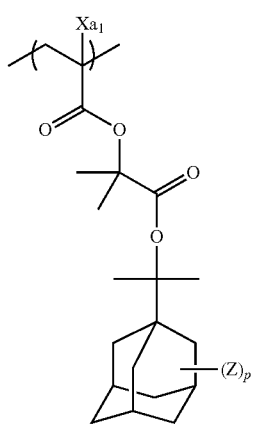 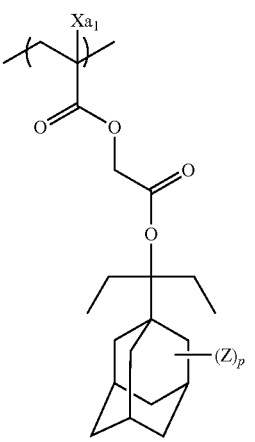 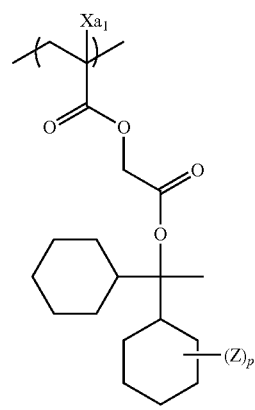

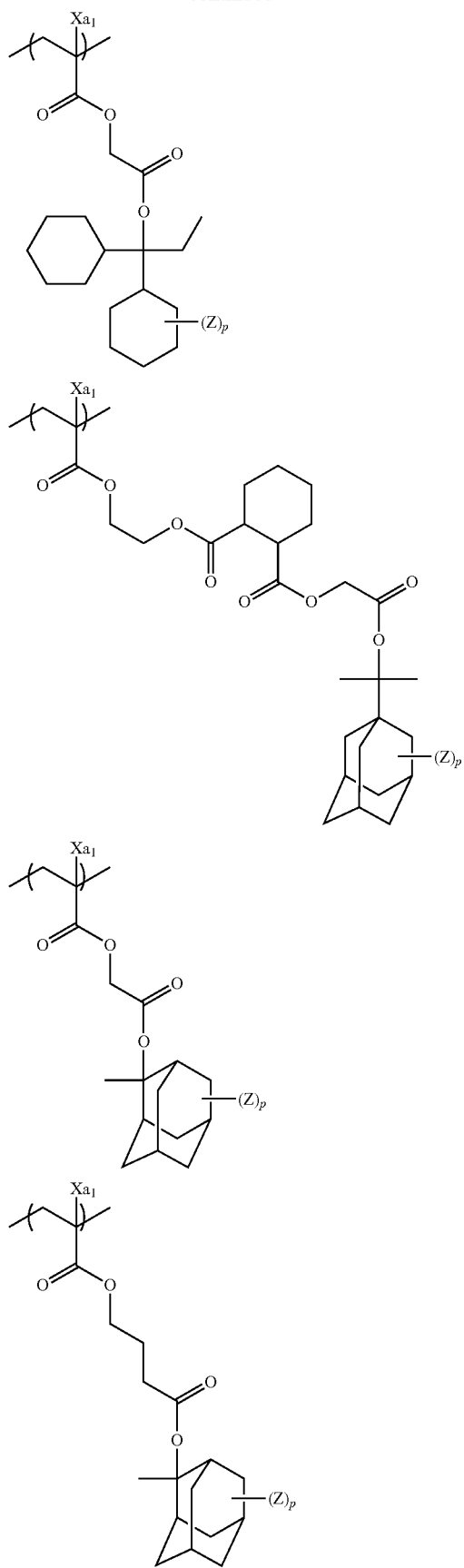
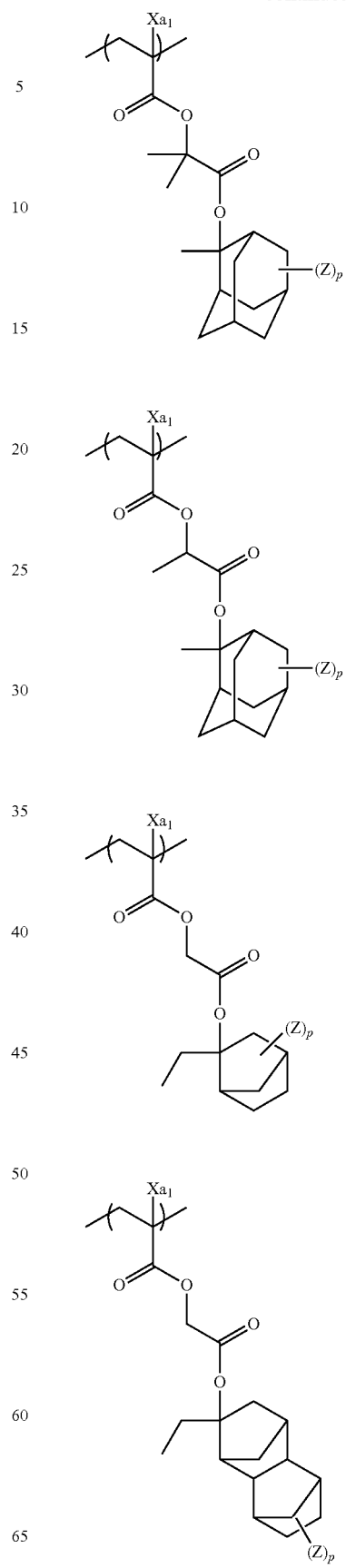

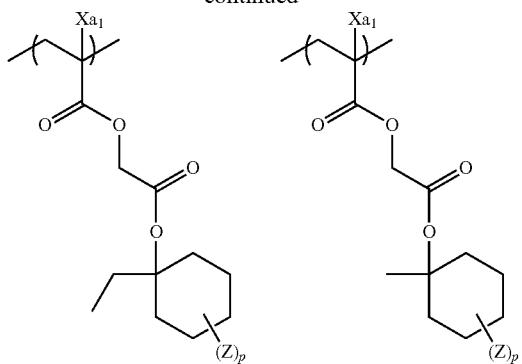

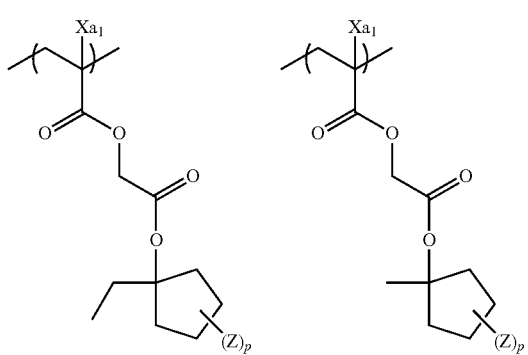

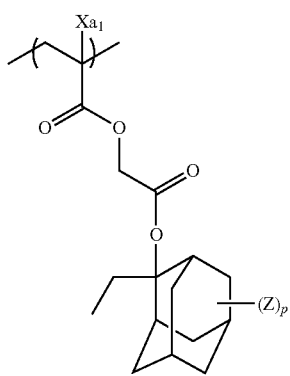

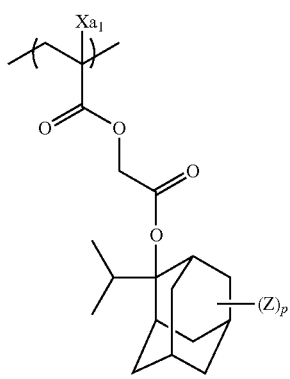

The resin (A) is more preferably a resin containing, as the repeating unit represented by formula (AI), at least either a repeating unit represented by formula (1) or a repeating unit represented by formula (2).

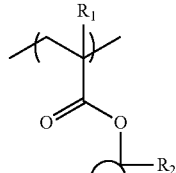

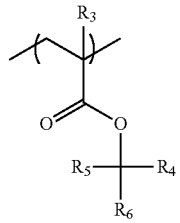

In formulae (1) and (2), each of $R_1$ and $R_3$ independently represents a hydrogen atom, a methyl group which may have a substituent, or a group represented by —$CH_2$—$R_9$. $R_9$ represents a hydroxyl group or a monovalent organic group.

Each of $R_2$, $R_4$, $R_5$ and $R_6$ independently represents an alkyl group or a cycloalkyl group.

R represents an atomic group necessary for forming an alicyclic structure together with the carbon atom.

Each of $R_1$ and $R_3$ is preferably a hydrogen atom, a methyl group, a trifluoromethyl group or a hydroxymethyl group. Specific examples and preferred examples of the monovalent organic group in $R_9$ are the same as those described for $R_9$ in formula (AI).

The alkyl group in $R_2$ may be linear or branched and may have a substituent.

The cycloalkyl group in $R_2$ may be monocyclic or polycyclic and may have a substituent.

$R_2$ is preferably an alkyl group, more preferably an alkyl group having a carbon number of 1 to 10, still more preferably an alkyl group having a carbon number of 1 to 5, and examples thereof include a methyl group and an ethyl group.

R represents an atomic group necessary for forming an alicyclic structure together with the carbon atom. The alicyclic structure formed by R together with the carbon atom is preferably a monocyclic alicyclic structure, and the carbon number thereof is preferably from 3 to 7, more preferably 5 or 6.

The alkyl group in $R_4$, $R_5$ and $R_6$ may be linear or branched and may have a substituent. The alkyl group is preferably an alkyl group having a carbon number of 1 to 4, such as methyl group, ethyl group, n-propyl group, isopropyl group, n-butyl group, isobutyl group and tert-butyl group.

The cycloalkyl group in $R_4$, $R_5$ and $R_6$ may be monocyclic or polycyclic and may have a substituent. The cycloalkyl group is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

Examples of the repeating unit represented by formula (1) include a repeating unit represented by the following formula (I-a). In the formula, $R_1$ and $R_2$ have the same meanings as those in formula (1).

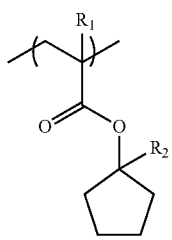
(1-a)

The repeating unit represented by formula (2) is preferably a repeating unit represented by the following formula (2-1):

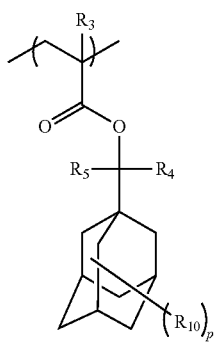
(2-1)

In formula (2-1), $R_3$ to $R_5$ have the same meanings as those in formula (2).

$R_{10}$ represents a polar group-containing substituent. In the case where a plurality of $R_{10}$'s are present, each $R_{10}$ may be the same as or different from every other $R_{10}$. Examples of the polar group-containing substituent include a hydroxyl group, a cyano group, an amino group, an alkylamide group, a sulfonamide group itself, and a linear or branched alkyl group or cycloalkyl group having at least one of these groups. An alkyl group having a hydroxyl group is preferred, and a branched alkyl group having a hydroxyl group is more preferred. The branched alkyl group is preferably an isopropyl group.

p represents an integer of 0 to 15. p is preferably an integer of 0 to 2, more preferably 0 or 1.

The resin (A) may contain a plurality of repeating units having an acid-decomposable group.

The resin (A) is still more preferably a resin containing, as the repeating unit represented by formula (AI), a repeating unit represented by formula (1) and a repeating unit represented by formula (2). In another embodiment, the resin is preferably a resin containing, as the repeating unit represented by formula (AI), at least two kinds of repeating units represented by formula (1).

It is also possible that the resist composition of the present invention contains a plurality of kinds of resins (A) and the acid-decomposable group-containing repeating units contained in the plurality of resins (A) differ from each other. For example, a resin (A) containing a repeating unit represented by formula (1) and a resin (A) containing a repeating unit represented by formula (2) may be used in combination.

In the case where the resin (A) contains a plurality of acid-decomposable group-containing repeating units or where a plurality of resins (A) have different acid-decomposable group-containing repeating units, preferred examples of the combination are illustrated below. In the formulae below, each R independently represents a hydrogen atom or a methyl group.

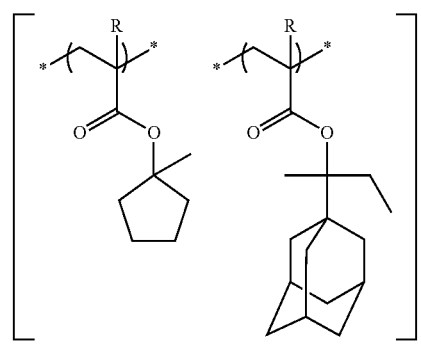

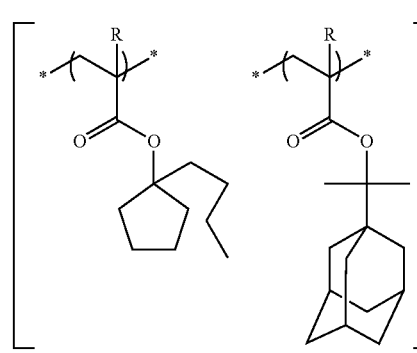

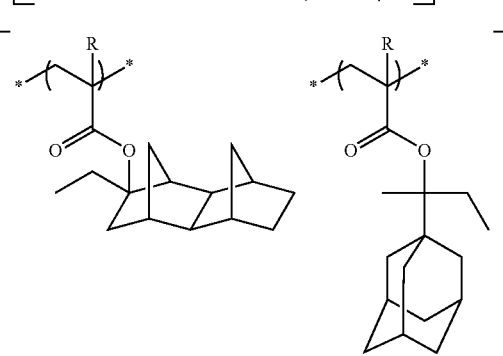

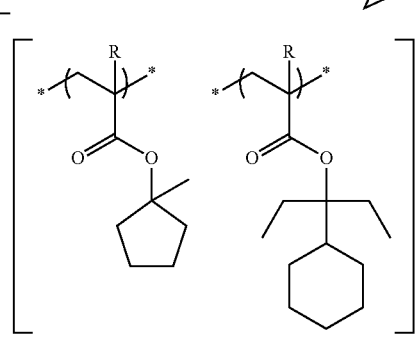

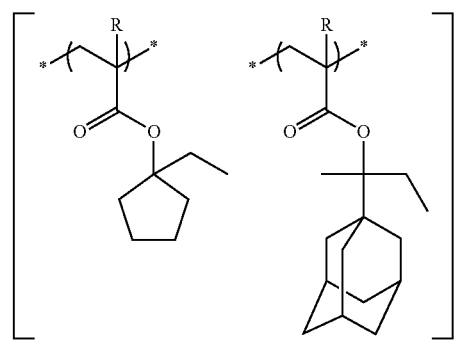

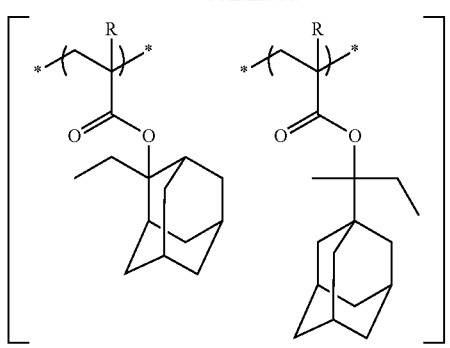
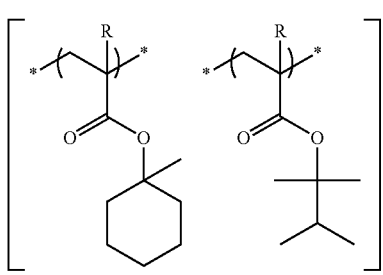
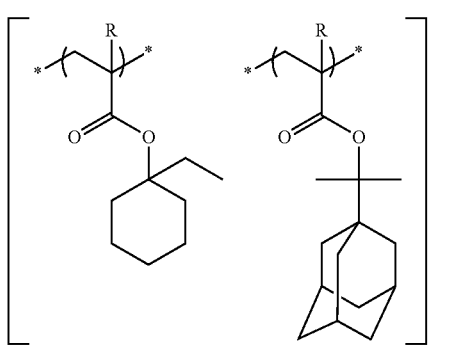
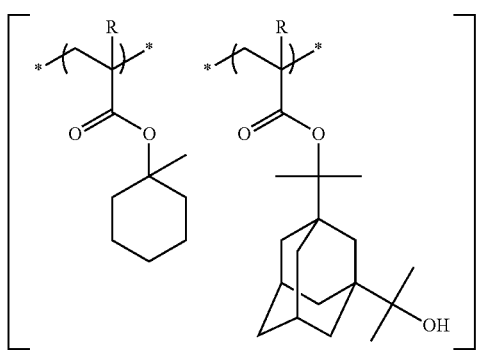
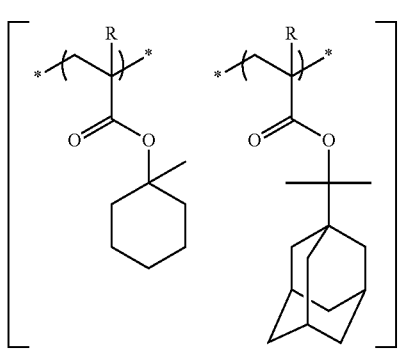
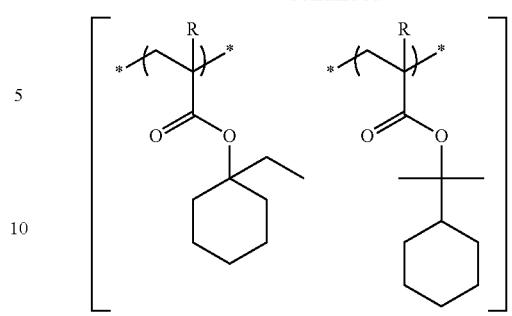
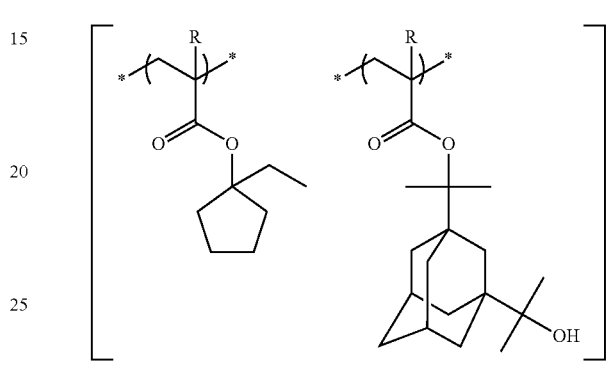
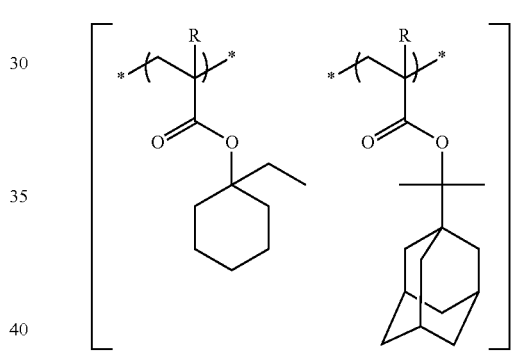
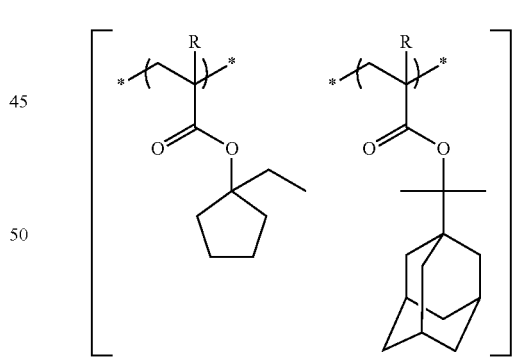
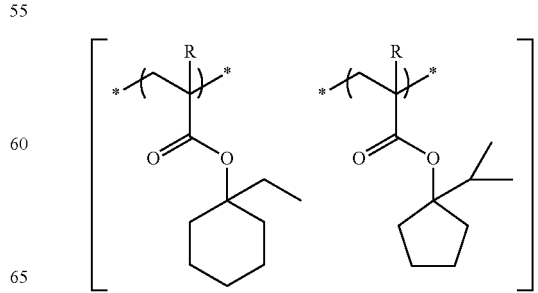

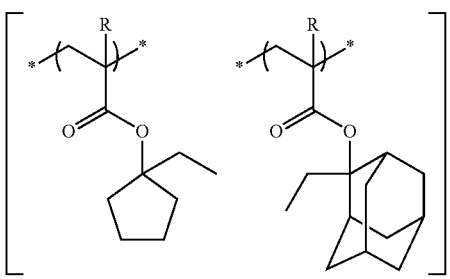

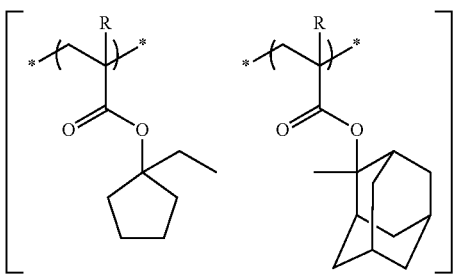

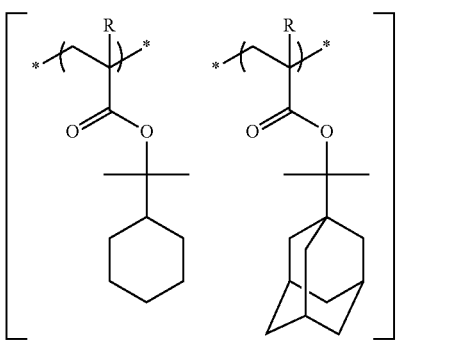

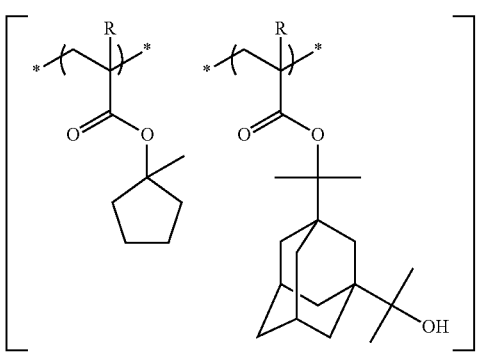

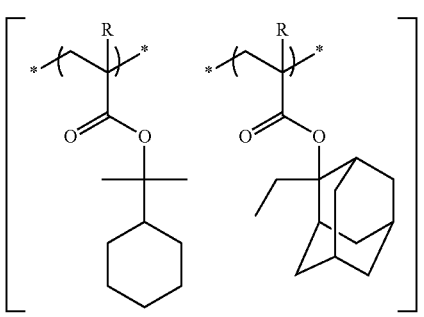

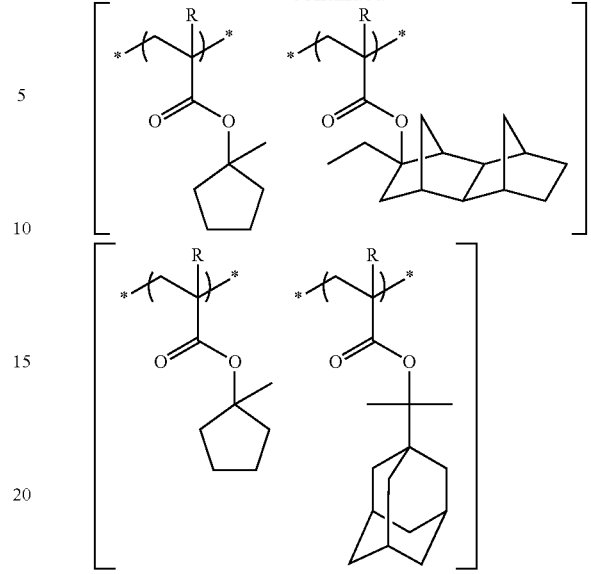

In view of defocus latitude characteristics, it is also preferred that the resin (A) does not contain (a4) a repeating unit having an acid-decomposable group.

The resin (A) may contain, in addition to the above-described repeating structural units, various repeating structural units for the purpose of controlling the dry etching resistance, suitability for standard developer, adherence to substrate, resist profile and properties generally required of a resist, such as resolution, heat resistance and sensitivity.

Examples of such a repeating structural unit include, but are not limited to, repeating structural units corresponding to the monomers described below.

Thanks to these repeating units, the performance required of the resin for use in the composition of the present invention, particularly (1) solubility for coating solvent,
(2) film-forming property (glass transition temperature),
(3) alkali developability,
(4) film loss (selection of hydrophilic, hydrophobic or alkali-soluble group),
(5) adherence of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

The resin (A) may be a resin obtained by mixing two or more kinds of resins and, for example, a resin obtained by mixing a resin containing the repeating unit (a1) and a resin containing the repeating unit (a2) may be used for the purpose of controlling the dry etching resistance, suitability for standard developer, adherence to substrate, resist profile and properties generally required of a resist, such as resolution, heat resistance and sensitivity.

It is also preferred to use a resin containing the repeating unit (a4) and a resin not containing the repeating unit (a4) by mixing these resins.

In the case where the composition of the present invention is used for ArF exposure, in view of transparency to ArF light, the resin (A) for use in the composition of the present invention preferably has substantially no aromatic group (specifically, the ratio of an aromatic group-containing repeating unit in the resin is preferably 5 mol % or less, more preferably 3 mol % or less, and ideally 0 mol %, that is, the resin does not have an aromatic group), and the resin (A) preferably has a monocyclic or polycyclic alicyclic hydrocarbon structure.

Incidentally, in the case where the resin (A) contains the later-described hydrophobic resin, the resin (A) preferably contains no fluorine atom and no silicon atom in view of compatibility with the hydrophobic resin.

In the present invention, the content of each repeating unit is as follows. As for each repeating unit, a plurality of kinds may be contained and in the case of containing a plurality of kinds of repeating units, the content below is their total amount.

The content of the (a1) repeating unit having a crosslinking group (preferably a repeating unit having an alcoholic hydroxyl group) is generally from 10 to 100 mol %, preferably from 10 to 80 mol %, more preferably from 10 to 60 mol %, based on all repeating units constituting the resin (A).

In the case of containing (a2) a repeating unit having a nonpolar group, the content thereof is generally from 5 to 80 mol %, preferably from 5 to 60 mol %, based on all repeating units constituting the resin (A).

In the case of containing (a3) a repeating unit having lactone, the content thereof is preferably from 15 to 60 mol %, more preferably from 20 to 50 mol %, still more preferably from 30 to 50 mol %, based on all repeating units in the resin.

In the case of containing (a4) a repeating unit having an acid-decomposable group, the content thereof is preferably from 20 to 70 mol %, more preferably from 30 to 60 mol %, based on all repeating units in the resin.

In the resin (A), the molar ratio of respective repeating units contained can be appropriately set to control the dry etching resistance of resist, suitability for standard developer, adherence to substrate, resist profile and performances generally required of a resist, such as resolution, heat resistance and sensitivity.

In the case of irradiating the composition of the present invention with KrF excimer laser light, electron beam, X-ray or high-energy beam at a wavelength of 50 nm or less (e.g., EUV), the resin (A) preferably further contains a hydroxystyrene-based repeating unit. It is more preferred to contain a hydroxystyrene-based repeating unit, a hydroxystyrene-based repeating unit protected by an acid-decomposable group, and an acid-decomposable repeating unit such as tertiary alkyl (meth)acrylate.

Preferred examples of the hydroxystyrene-based repeating unit having an acid-decomposable group include repeating units composed of a tert-butoxycarbonyloxystyrene, a 1-alkoxyethoxystyrene and a tertiary alkyl(meth)acrylate. Repeating units composed of a 2-alkyl-2-adamantyl(meth)acrylate and a dialkyl(1-adamantyl)methyl(meth)acrylate are more preferred.

The resin (A) can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the photosensitive composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is poured in a solvent, and the desired polymer is collected by such a method as powder or solid recovery. The concentration at the reaction is from 5 to 50 mass %, preferably from 10 to 30 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of combining water washing and an appropriate solvent to remove residual monomers or oligomer components; a purification method in a solution sate, such as ultrafiltration of removing by extraction only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

The weight average molecular weight of the resin (A) is preferably from 1,000 to 200,000, more preferably from 2,000 to 20,000, still more preferably from 3,000 to 15,000, yet still more preferably from 3,000 to 12,000, in terms of polystyrene by the GPC method. When the weight average molecular weight is from 1,000 to 200,000, reduction in the heat resistance and dry etching resistance can be avoided and at the same time, the film-forming property can be prevented from deterioration due to impairment of developability or increase in the viscosity.

The polydispersity (molecular weight distribution) is usually from 1.0 to 3.0, preferably from 1.0 to 2.6, more preferably from 1.0 to 2.0, still more preferably from 1.4 to 1.9. As the molecular weight distribution is smaller, the resolution and resist profile are more excellent, the side wall of the resist pattern is smoother, and the roughness is more improved.

In the resist composition of the present invention, the blending amount of the resin (A) in the entire composition is preferably from 65 to 97 mass %, more preferably from 78 to 95 mass %, still more preferably from 78 to 94 mass %, based on the entire solid content.

As for the resin (A) used in the present invention, one kind of a resin may be used or a plurality of kinds of resins may be used in combination.

[2] (B) Nonionic Compound Capable of Generating Acid Upon Irradiation with Actinic Ray or Radiation The resist composition of the present invention contains a nonionic compound capable of generating an acid upon irradiation with an actinic ray or radiation (hereinafter sometimes referred to as a "compound (B)").

The compound (B) is not particularly limited as long as it is a nonionic acid generator, and examples thereof include an iminosulfonate derivative, an oximesulfonate derivative, a disulfone derivative and a diazosulfone derivative.

The compound (B) is preferably a compound represented by the following formula (B1), which is an iminosulfonate derivative, or a compound represented by the following formula (B2), which is an oximesulfonate derivative.

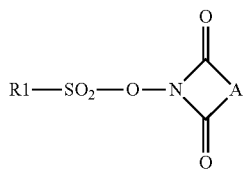

(B1)

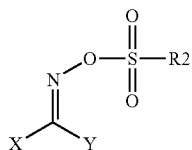

(B2)

In formulae (B1) and (B2), each of R1 and R2 independently represents an organic group.

A represents an alkylene group, a cycloalkylene group, an alkenylene group, a cycloalkenylene group or an arylene group.

Each of X and Y independently represents an alkyl group, a cycloalkyl group, an aryl group, a cyano group or a nitro group, and X and Y may combine with each other to form a ring.

X or Y in a compound represented by formula (B2) may combine with X or Y in another compound represented by formula (B2) through a linking group.

A, X, Y and the linking group above may further have a substituent, and examples of the further substituent include an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group, an alkylamide group (for example, having a carbon number of 1 to 15), an alkylthio group (for example, having a carbon number of 1 to 15), and an aryl thio group (for example, having a carbon number of 6 to 14).

The ring formed by combining X and Y may further have a substituent, and examples of the further substituent include, in addition to those described as the substituent which A, X, Y and the linking group may further have, an aryl(cyano)methylene group (for example, having a carbon number of 8 to 15) and an alkylaryl(cyano)methylene group (for example, having a carbon number of 9 to 20). It is also possible that the ring formed by combining X and Y further has two substituents and these two substituents are combined with each other to further form a ring. Such a further ring includes a saturated or unsaturated hydrocarbon ring, and a saturated or unsaturated heterocyclic ring, and the ring is preferably a 5- or 6-membered ring.

The alkylene group of A is preferably an alkylene group having a carbon number of 1 to 12, more preferably an alkylene group having a carbon number of 1 to 6. Specific examples of the alkylene group as A include a methylene group, an ethylene group, a propylene group, an isopropylene group, a butylene group and an isobutylene group.

The cycloalkylene group of A may have a monocyclic structure or a polycyclic structure and is preferably a cycloalkenylene group having a carbon number of 3 to 12, more preferably a cycloalkylene group having a carbon number of 5 to 10. Specific examples of the cycloalkylene group as A include a cyclopentylene group, a cyclohexylene group, a cycloheptylene group, a cyclooctylene group, a cyclododecylene group and an adamantylene group.

The alkenylene group of A is preferably an alkenylene group having a carbon number of 2 to 12, more preferably an alkenylene group having a carbon number of 2 to 6. Specific examples of the alkenylene group as A include an ethynylene group, a propenylene group and a butenylene group.

The cycloalkenylene group of A may have a monocyclic structure or a polycyclic structure and is preferably a cycloalkenylene group having a carbon number of 3 to 12, more preferably a cycloalkenylene group having a carbon number of 5 to 10. Specific examples of the cycloalkenylene group as A include a cyclopropenylene group, a cyclohexenylene group, a cyclooctenylene group, and a norbornylene group.

The arylene group of A is preferably an arylene group having a carbon number of 6 to 10. Specific examples of the arylene group as A include a phenylene group, a tolylene group and a naphthylene group.

Incidentally, the cycloalkylene group and cycloalkenylene group as A may contain, as a ring member, a heteroatom such as nitrogen atom, oxygen atom and sulfur atom.

The alkyl group as X and Y may be linear or branched and is preferably an alkyl group having a carbon number of 1 to 15, more preferably an alkyl group having a carbon number of 1 to 5. Specific examples of the alkyl group as X and Y include a methyl group, an ethyl group, a propyl group, an n-butyl group, a sec-butyl group and a tert-butyl group.

The cycloalkyl group as X and Y may have a monocyclic structure or a polycyclic structure and is preferably a cycloalkyl group having a carbon number of 3 to 15, more preferably a cycloalkyl group having a carbon number of 3 to 10. Specific examples of the cycloalkyl group as X and Y include a cyclopropyl group, a cyclobutyl group and a cyclohexyl group.

The aryl group as X and Y is preferably an aryl group having a carbon number of 6 to 15. Specific examples of the aryl group as X and Y include a phenyl group, a naphthyl group and a fluorenyl group.

Examples of the ring which may be formed by combining X and Y include a hydrocarbon ring and a heterocyclic ring. The ring which may be formed by combining X and Y is preferably a 5- or 6-membered ring.

It is preferred that X is a fluoroalkyl group, a cyano group or a nitro group and Y is an alkyl group or an aryl group, and it is more preferred that X is a fluoroalkyl group or a cyano group and Y is an aryl group.

When X or Y in a compound represented by formula (B2) combines with X or Y in another compound represented by formula (B2) through a linking group, examples of the linking group include —COO—, —OCO—, —CO—, —O—, —S—, —SO—, —SO$_2$—, an alkylene group, a cycloalkylene group, an alkenylene group, and a group composed of a combination thereof. The number of atoms constituting the linking group is preferably from 1 to 20.

Specific preferred examples of the ring formed by combining X and Y include a cyclohexane ring, a 1,2,3,4-tetrahydronaphthalene ring and a 2,5-dihydro-5-[(2-methylphenyl)(cyano)methylene]thiophene ring.

In formulae (B1) and (B2), examples of the organic group of R1 and R2 include an alkyl group and the later-described group represented by formula (1).

The alkyl group as R1 and R2 may be linear or branched and is preferably an alkyl group having a carbon number of 1 to 15, more preferably an alkyl group having a carbon number of 1 to 5. Specific examples of the alkyl group as R include a methyl group, an ethyl group, a propyl group, an n-butyl group, a sec-butyl group and a tert-butyl group.

The alkyl group as R1 and R2 may further have a substituent, and examples of the further substituent include a cycloalkyl group (for example, having a carbon number of 3 to 15), an aryl group (for example, having a carbon number of 6 to 14), an alkoxy group (for example, having a carbon number of 1 to 15), a halogen atom and a hydroxyl group, with a fluorine atom being preferred.

The alkyl group as R1 and R2 is preferably a fluoroalkyl group (preferably having a carbon number of 1 to 15, more preferably from 1 to 5). In this case, the sulfonic acid generated in the exposed area is a strong acid and therefore, the sensitivity can be more increased, as a result, not only EL and DOF can be more enhanced but also LWR and scum defect can be more reduced.

The fluoroalkyl group as R1 and R2 is preferably a perfluoroalkyl group.

The organic group of R1 and R2 is more preferably a group represented by the following formula (1). The cyclic organic group represented by Cy in formula (1) is bulky compared with a chain group and facilitates confinement of a sulfonic acid generated in the exposed area to the exposed area, and the fear of diffusion of the acid into the unexposed area to cause an unintended reaction can be more reduced, as a result, not only EL and DOF can be more enhanced but also LWR and scum defect can be more reduced.

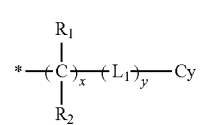

(I)

In formula (I), each of $R_1$ and $R_2$ independently represents a hydrogen atom, a fluorine atom and an alkyl group, and when a plurality of $R_1$'s or $R_2$'s are present, each $R_1$ or $R_2$ may be the same as or different from every other $R_1$ or $R_2$.

$L_1$ represents a divalent linking group and when a plurality of $L_1$'s are present, each $L_1$ may be the same as or different from every other $L_1$.

Cy represents a cyclic organic group.

x represents an integer of 0 to 20.

y represents an integer of 0 to 10.

* represents a bond to a sulfonyl group.

The alkyl group in $R_1$ and $R_2$ may have a substituent (preferably fluorine atom) and is preferably an alkyl group having a carbon number of 1 to 4, more preferably a perfluoroalkyl group having a carbon number of 1 to 4. Specific examples of $R_1$ and $R_2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

Each of $R_1$ and $R_2$ is preferably a fluorine atom or $CF_3$.

$L_1$ is not particularly limited and includes, for example, —COO—, —OCO—, —CO—, —O—, —S—, —SO—, —SO$_2$—, an alkylene group, a cycloalkylene group and an alkenylene group, and the number of atoms constituting $L_1$ is preferably from 1 to 20, more preferably from 1 to 3. Among these, —COO—, —OCO—, —CO— and —O— are preferred, and —COO— and —OCO— are more preferred.

The cyclic organic group of Cy is not particularly limited, and examples thereof include an alicyclic group, an aryl group and a heterocyclic group (including an aromatic heterocyclic ring and a non-aromatic heterocyclic ring, such as tetrahydropyrane ring and lactone ring structure).

The alicyclic group as Cy may be monocyclic or polycyclic and is preferably a monocyclic cycloalkyl group such as cyclopentyl group, cyclohexyl group and cyclooctyl group, or a polycyclic cycloalkyl group such as norbornyl group, norbornan-1-yl group, tricyclodecanyl group, tetracyclodecanyl group, tetracyclododecanyl group and adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint that the diffusion in the film at the PEB (post-exposure baking) step can be suppressed and MEEF (mask error enhancement factor) can be improved.

The aryl group as Cy includes a benzene ring, a naphthalene ring, a phenanthrene ring and an anthracene ring. Among these, naphthalene having low absorbance is preferred in view of absorbance at 193 nm.

The heterocyclic group as Cy may have a monocyclic structure or a polycyclic structure and includes, for example, those derived from a furan ring, a thiophene ring, a benzofuran ring, a benzothiophene ring, a dibenzofuran ring, a dibenzothiophene ring, a pyridine ring, a piperidine ring and a decahydroisoquinoline ring. In particular, those derived from a furan ring, a thiophene ring, a pyridine ring, a piperidine ring and a decahydroisoquinoline ring are preferred.

The cyclic organic group also includes a lactone structure, and specific examples thereof include lactone structures represented by formulae (LC1-1) to (LC1-17), which may be contained in the resin (A).

The cyclic organic group may have a substituent, and examples of the substituent include a halogen atom, an alkyl group (may be either linear or branched, preferably having a carbon number of 1 to 12), a cycloalkyl group (may be any of monocyclic, polycyclic or spirocyclic, preferably having a carbon number of 3 to 20), an aryl group (preferably having a carbon number of 6 to 14), a hydroxy group, a cyano group, an alkoxy group, an ester bond, an amide bond, a urethane bond, a ureido group, an ether bond, a thioether bond, a sulfonamide bond, a sulfonic acid ester bond, and a group formed by combining two or more members selected from these bonds and groups. Incidentally, the carbon constituting the cyclic organic group (the carbon contributing to ring formation) may be carbonyl carbon.

x is preferably from 0 to 12, more preferably from 0 to 4, still more preferably 0 or 1.

y is preferably from 0 to 8, more preferably from 0 to 4.

The group represented by formula (1) is more preferably a group represented by the following formula (II) or (III):

$$*-(\underset{Xf}{\overset{Xf}{\underset{|}{C}}})_{x'}-(\underset{R_4}{\overset{R_3}{\underset{|}{C}}})_{y'}-(L_2)_{z'}-Cy \quad (II)$$

$$*-\underset{Ar}{\bigcirc}-(R_5)_p \quad (III)$$

In formula (II), each Xf independently represents a fluorine atom or an alkyl group substituted with at least one fluorine atom, each of $R_3$ and $R_4$ independently represents a hydrogen atom or an alkyl group, and when a plurality of $R_3$'s or $R_4$'s are present, each $R_3$ or $R_4$ may be the same as or different from every other $R_3$ or $R_4$, $L_2$ represents a divalent linking group and when a plurality of $L_2$'s are present, each $L_2$ may be the same as or different from every other $L_2$, Cy represents a cyclic organic group, x' represents an integer of 0 to 20, y' represents an integer of 0 to 10, and z' represents an integer of 0 to 10, provided that $1 \leq x'+y'z'$.

In formula (III),

Ar represents an aryl group and may have a substituent other than $R_5$, $R_5$ represents a group containing a hydrocarbon group, and p represents an integer of 0 or more.

In formulae (II) and (III), * represents a bond to a sulfonyl group.

The group represented by formula (II) is described in detail below.

The alkyl group in the fluorine atom-substituted alkyl group of Xf is preferably an alkyl group having a carbon number of 1 to 10, more preferably from 1 to 4. Also, the fluorine atom-substituted alkyl group of Xf is preferably a perfluoroalkyl group.

Xf is preferably a fluorine atom or a perfluoroalkyl group having a carbon number of 1 to 4. Specific examples of Xf include a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with a fluorine atom and $CF_3$ being preferred. In particular, it is preferred that both Xfs are a fluorine atom.

Examples of the alkyl group of $R_3$ and $R_4$ are the same as those of the alkyl group in $R_1$ and $R_2$.

x' is preferably an integer of 1 to 10, more preferably an integer of 1 to 5.

y' is preferably an integer of 0 to 4, more preferably 0.

z' is preferably an integer of 0 to 8, more preferably an integer of 0 to 4.

The divalent linking group of $L_2$ is not particularly limited and examples thereof are the same as those of the linking group in $L_1$ (here, z' represents the repetition number of $L_2$).

Examples of the cyclic organic group of Cy are the same as those in formula (1).

The group represented by formula (III) is described in detail below.

In formula (III), the aryl group of Ar is preferably an aromatic ring having a carbon number of 6 to 30.

Specific examples thereof include a benzene ring, a naphthalene ring, a pentalene ring, an indene ring, an azulene ring, a heptalene ring, an indecene ring, a perylene ring, a pentacene ring, an acenaphthalene ring, phenanthrene ring, an anthracene ring, a naphthacene ring, a pentacene ring, a chrysene ring, a triphenylene ring, an indene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring and a phenazine ring. Among these, a benzene ring, a naphthalene ring and an anthracene ring are preferred, and a benzene ring is more preferred.

Ar may have a substituent other than $R_5$, and examples of the substituent other than $R_5$ include a halogen atom (e.g., fluorine, chlorine, bromine, iodine), a hydroxyl group, a cyano group, a nitro group and a carboxyl group. In the case of having two or more substituents, at least two substituents may combine to form a ring.

Examples of $R_5$ include an alkoxy group such as methoxy group, ethoxy group and tert-butoxy group, an aryloxy group such as phenoxy group and p-tolyloxy group, an alkylthioxy group such as methylthioxy group, ethylthioxy group and tert-butylthioxy group, an arylthioxy group such as phenylthioxy group and p-tolylthioxy group, an alkoxycarbonyl group such as methoxycarbonyl group, butoxycarbonyl group and phenoxycarbonyl group, an acetoxy group, a linear or branched alkyl group such as methyl group, ethyl group, propyl group, butyl group, heptyl group, hexyl group, dodecyl group and 2-ethylhexyl group, an alkenyl group such as vinyl group, propenyl group and hexenyl group, an acetylene group, an alkynyl group such as propynyl group and hexynyl group, an aryl group such as phenyl group and tolyl group, and an acyl group such as benzoyl group, acetyl group and tolyl group.

The hydrocarbon group in the hydrocarbon group-containing group, represented by $R_5$ includes, for example, an acyclic hydrocarbon group and a cyclic aliphatic group and is preferably a group having a carbon number of 3 or more.

As for $R_5$, the carbon atom adjacent to Ar is preferably a tertiary or quaternary carbon atom.

Examples of the acyclic hydrocarbon group as $R_5$ include an isopropyl group, a tert-butyl group, a tert-pentyl group, a neopentyl group, a s-butyl group an isobutyl group, an isohexyl group, a 3,3-dimethylpentyl group and a 2-ethylhexyl group. The upper limit of the carbon number of the alicyclic hydrocarbon group is preferably 12 or less, more preferably 10 or less.

Examples of the cyclic aliphatic group as $R_5$ include a cycloalkyl group such as cyclobutyl group, cyclopentyl group, cyclohexyl group, cycloheptyl group and cyclooctyl group, an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group. These groups may have a substituent. The upper limit of the carbon number of the cyclic aliphatic group is preferably 15 or less, more preferably 12 or less.

In the case where the acyclic hydrocarbon group or cyclic aliphatic group has a substituent, examples of the substituent include a halogen atom such as fluorine atom, chlorine atom, bromine atom and iodine atom, an alkoxy group such as methoxy group, ethoxy group and tert-butoxy group, an aryloxy group such as phenoxy group and p-tolyloxy group, an alkylthioxy group such as methylthioxy group, ethylthioxy group and tert-butylthioxy group, an arylthioxy group such as phenylthioxy group and p-tolylthioxy group, an alkoxycarbonyl group such as methoxycarbonyl group, butoxycarbonyl group and phenoxycarbonyl group, an acetoxy group, a linear or branched alkyl group such as methyl group, ethyl group, propyl group, butyl group, heptyl group, hexyl group, dodecyl group and 2-ethylhexyl group, a cyclic alkyl group such as cyclohexyl group, an alkenyl group such as vinyl group, propenyl group and hexenyl group, an acetylene group, an alkynyl group such as propynyl group and hexynyl group, an aryl group such as phenyl group and tolyl group, a hydroxy group, a carboxy group, a sulfonic acid group, a carbonyl group, and a cyano group.

Specific examples of the cyclic or acyclic hydrocarbon group as $R_5$ are illustrated below. * indicates a bond to Ar.

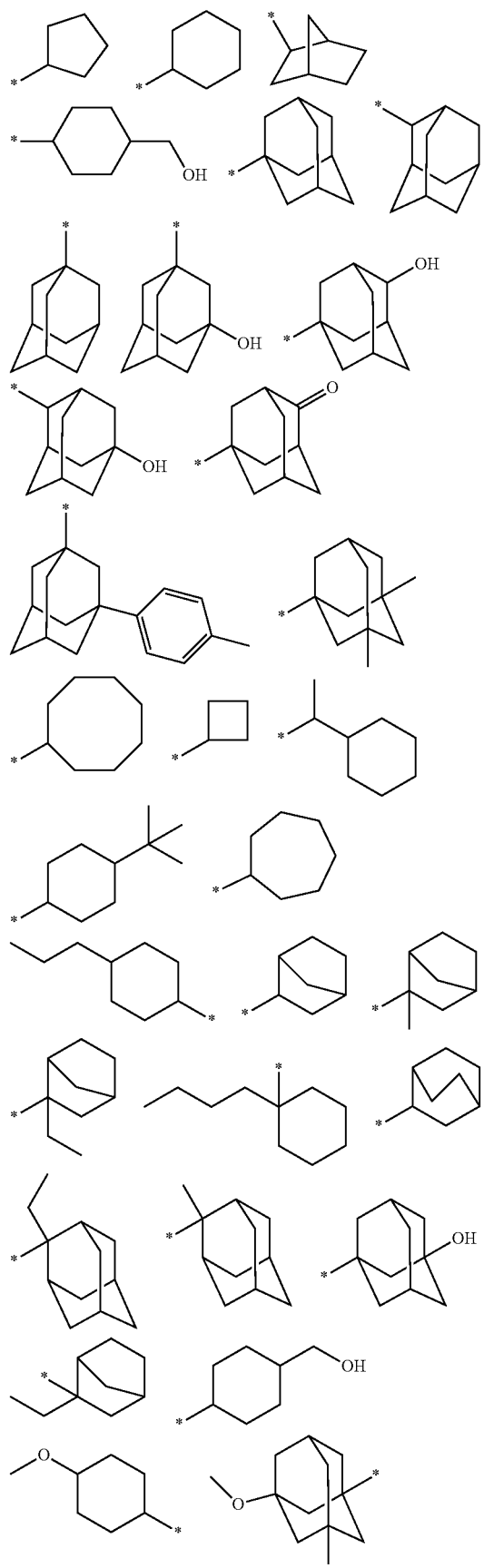

-continued

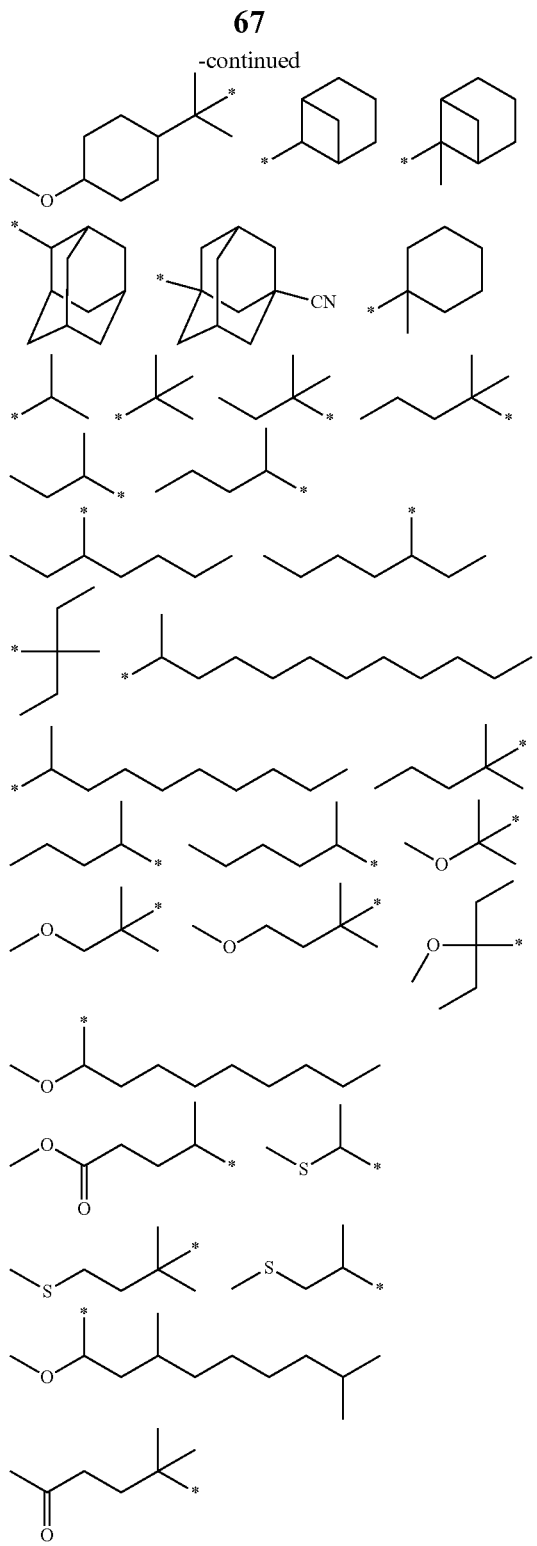

Among these, the following structures are more preferred in view of suppressing acid diffusion.

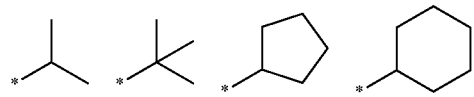

-continued

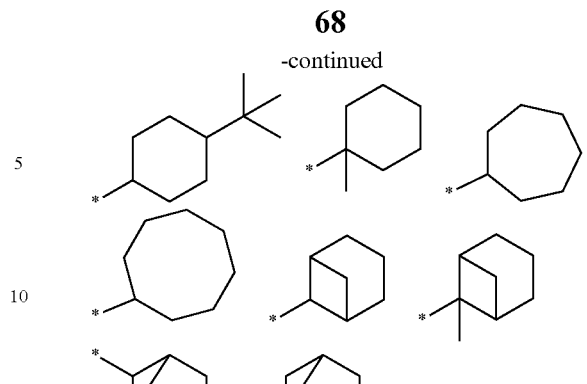

p represents an integer of 0 or more, and the upper limit thereof is not particularly limited as long as it is a chemically possible number. From the standpoint of suppressing acid diffusion, p is an integer of usually from 0 to 5, preferably from 1 to 4, more preferably 2 or 3, and most preferably 3.

In the light of suppressing acid diffusion, $R_5$ is preferably substituted on the o-position with respect to the sulfonic acid group of the aryl ring, and a structure where substituted on two o-positions is more preferred.

In one embodiment, the group represented by formula (III) is a group represented by the following formula (BII):

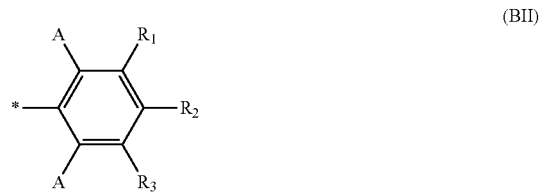

(BII)

In the formula, A is the same as $R_5$ in formula (III), and two A's may be the same or different. Each of $R_1$ to $R_3$ independently represents a hydrogen atom, a hydrocarbon group-containing group, a halogen atom, a hydroxyl group, a cyano group or a nitro group. Specific examples of the hydrocarbon group-containing group are the same as the groups exemplified above.

It is more preferred that the organic group represented by formula (II) or (III) is an organic group represented by formula (II) and x' is an integer of 1 to 10. According to such an embodiment, the sulfonic acid generated in the exposed area is a strong acid and therefore, the sensitivity can be more increased, as a result, not only EL and DOF can be more enhanced but also LWR and scum defect can be more reduced.

Specific examples of the group represented by formula (I) are illustrated below.

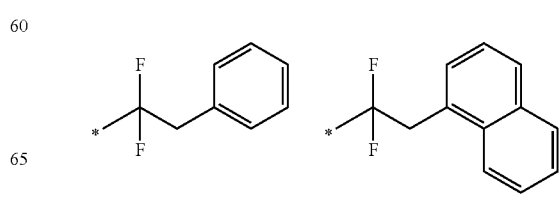

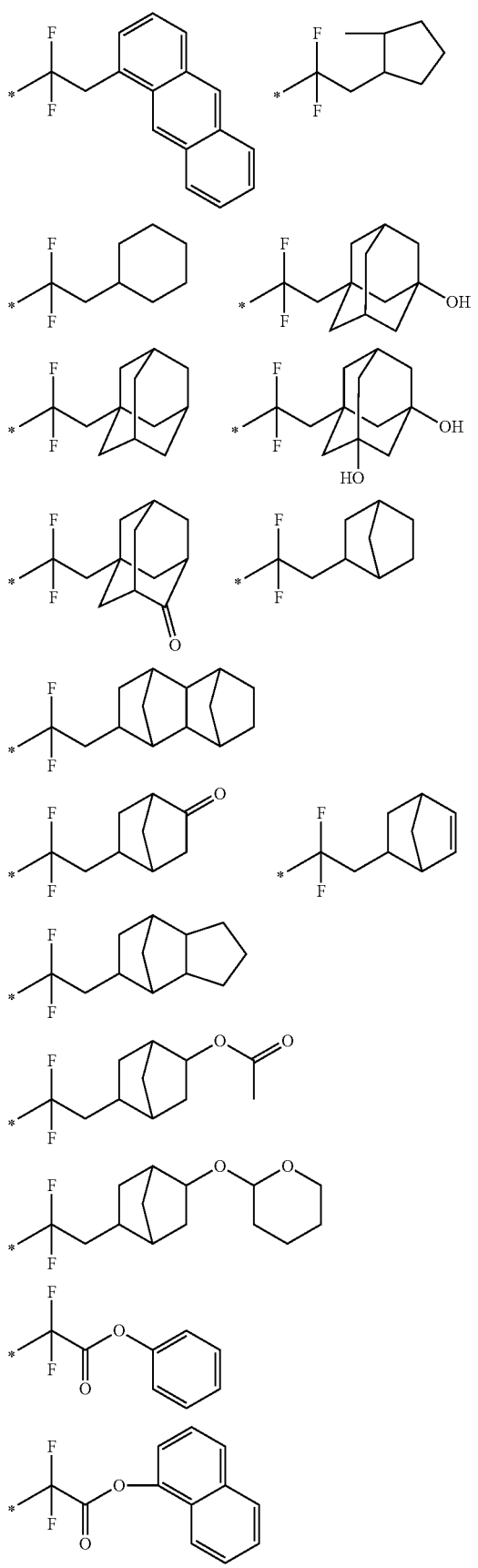
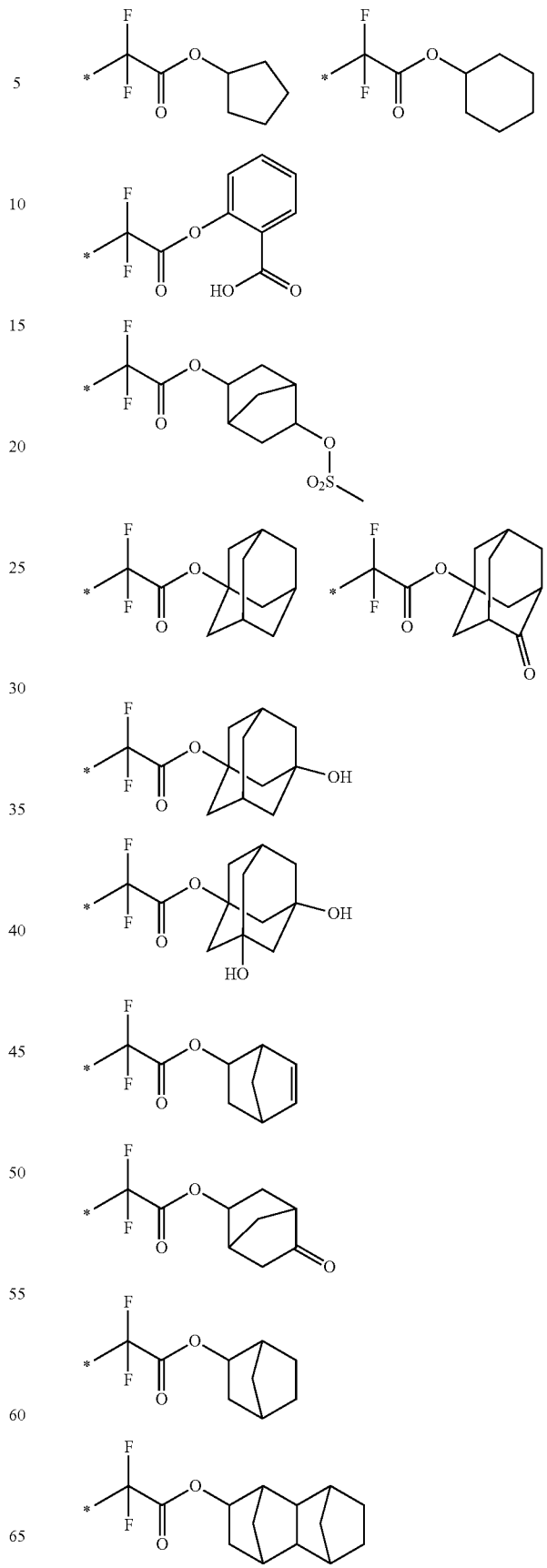

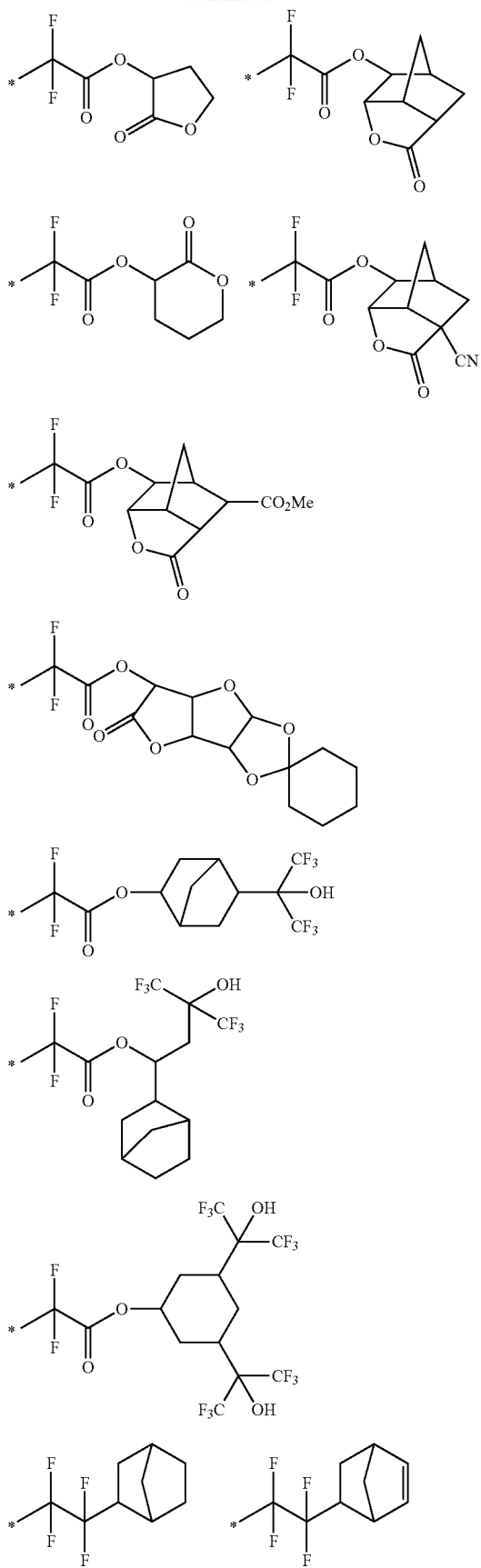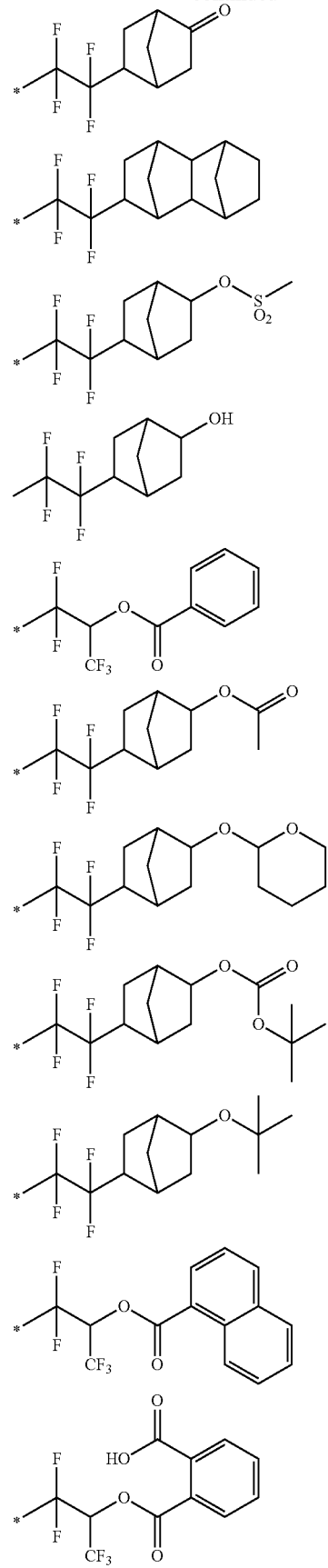

-continued
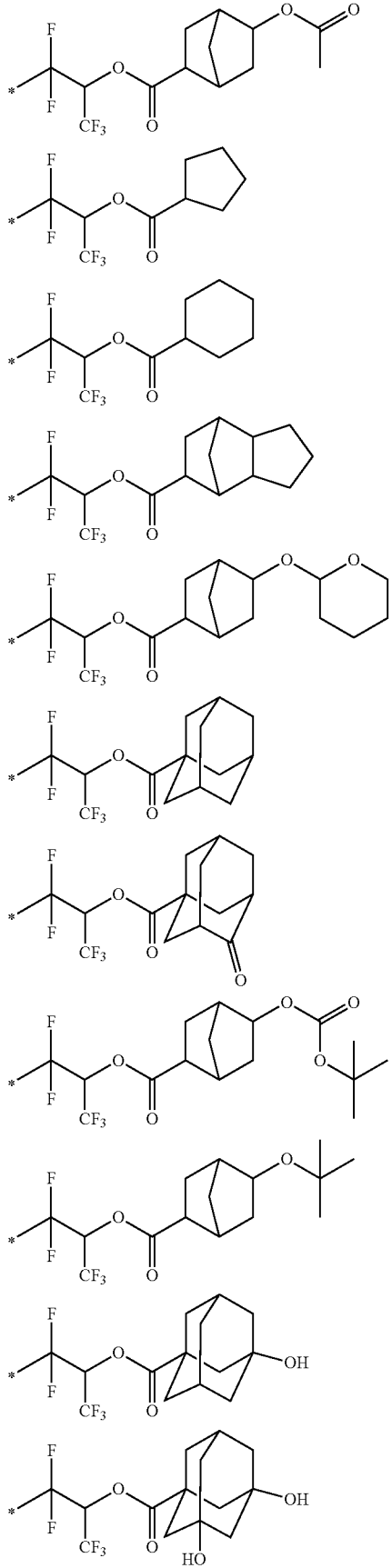
-continued
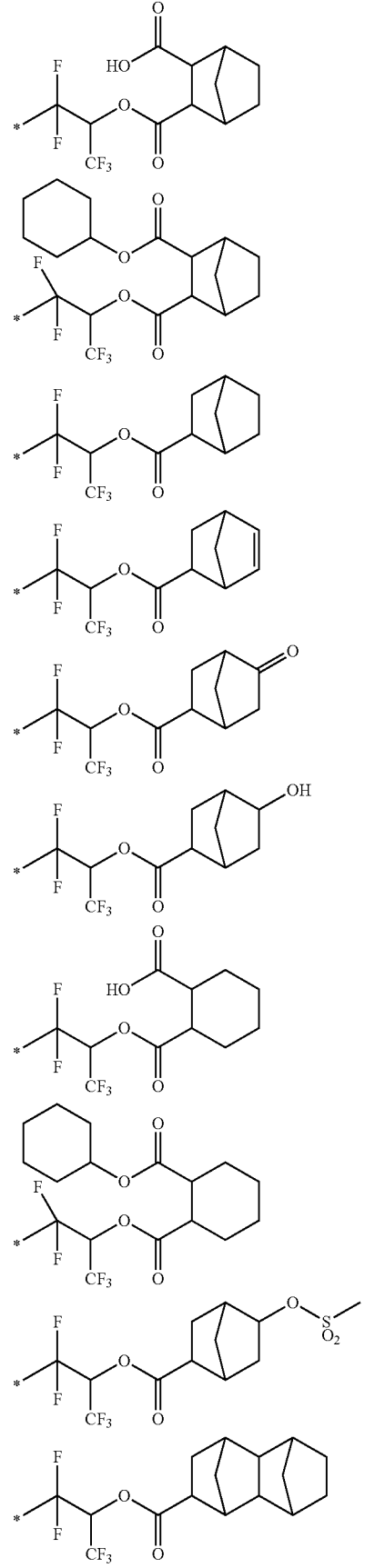

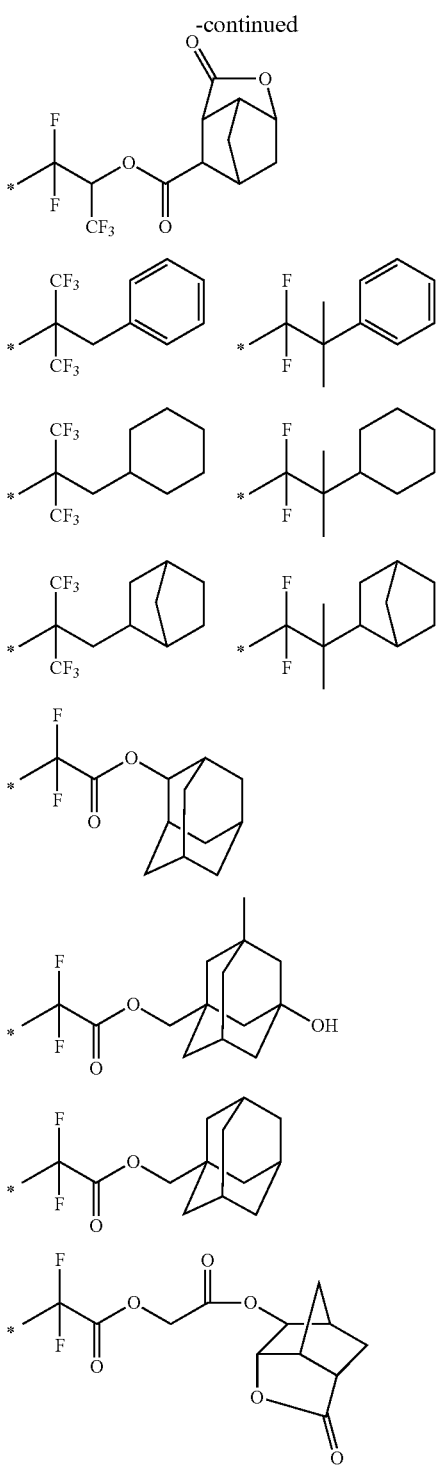

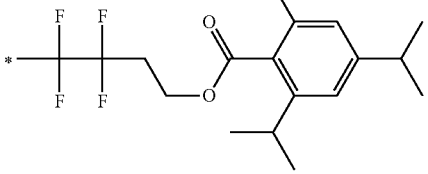

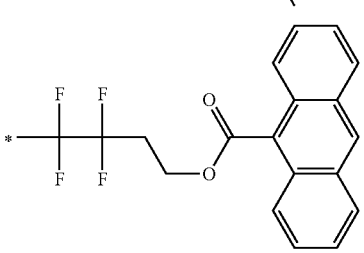

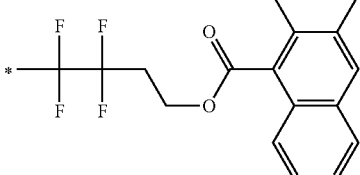

The compound (B) may be also a compound represented by the following formula (B3), which is a disulfone derivative, or a compound represented by the following formula (B4), which is a diazosulfone derivative.

 (B3)

 (B4)

In formula (B3), each of $Ar_1$ and $Ar_2$ independently represents an aryl group.

In formula (B4), each of $Ra_1$ to $Ra_2$ independently represents an alkyl group, a cycloalkyl group or an aryl group.

Examples of the aryl group as $Ar_1$, $Ar_2$, $Ra_1$ and $Ra_2$ include those described for the aryl group as X and Y of formula (B2).

Examples of the alkyl group and cycloalkyl group as $Ra_1$ and $Ra_2$ include those described for the alkyl group and cycloalkyl group as X and Y of formula (B2).

$Ar_1$, $Ar_2$, $Ra_1$ and $Ra_2$ may further have a substituent, and examples of the further substituent include those described for the further substituent of X and Y in formula (B2).

The molecular weight of the compound (B) is preferably from 100 to 1,500, more preferably from 200 to 1,000.

Specific examples of the compound (B) include, but are not limited to, the compounds illustrated below.

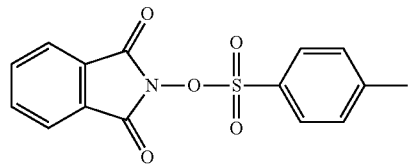 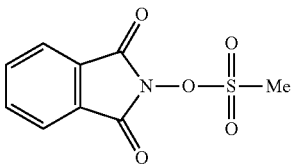 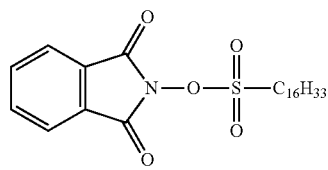

-continued
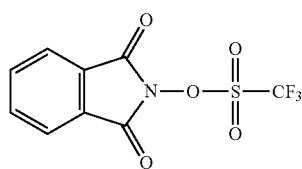
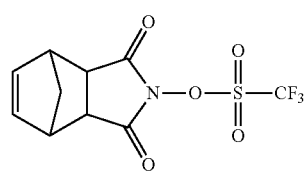
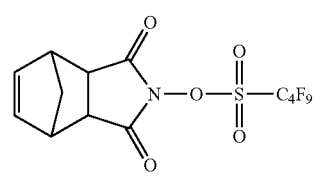
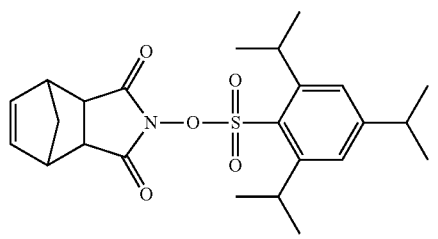
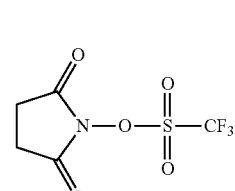
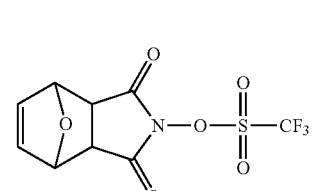
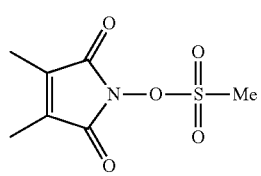
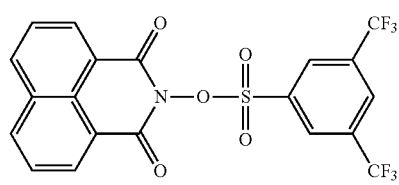
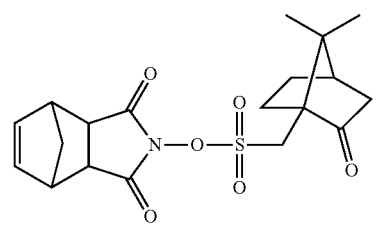
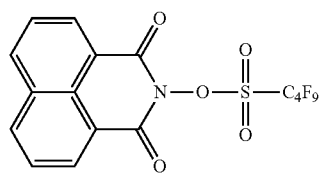
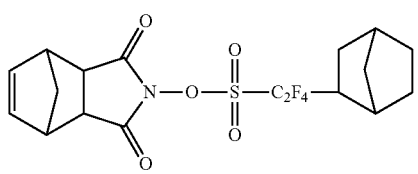
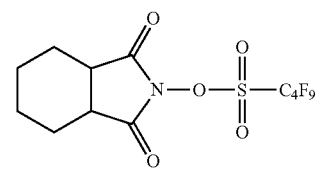
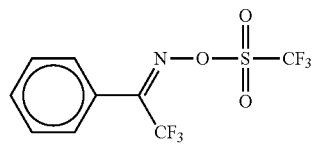
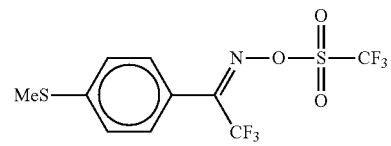
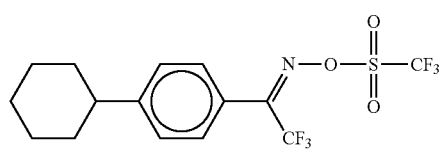
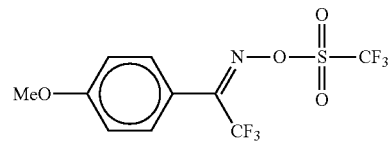
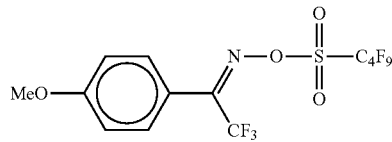
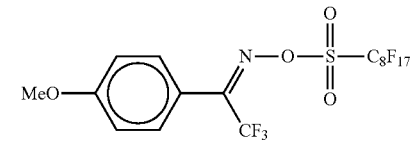
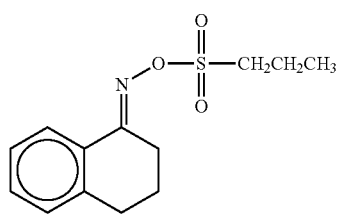
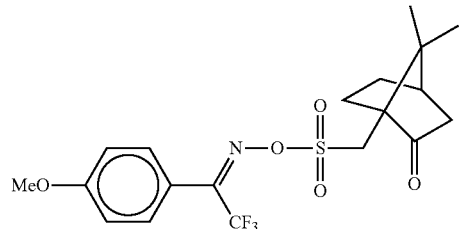
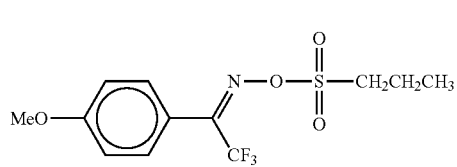
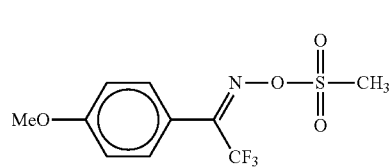
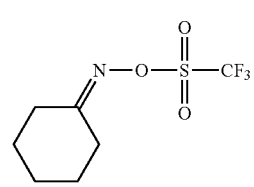

-continued
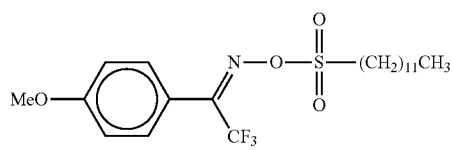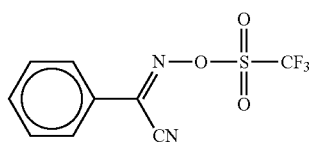
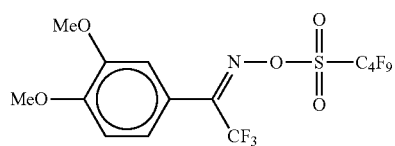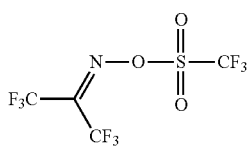
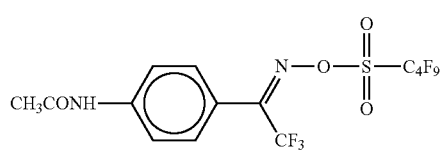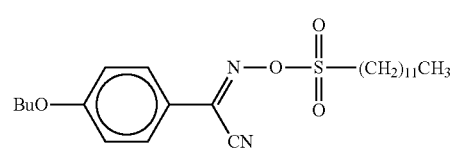
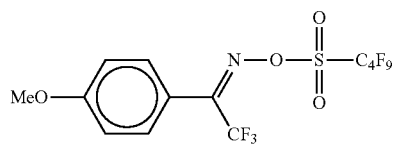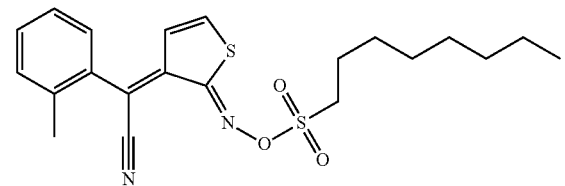
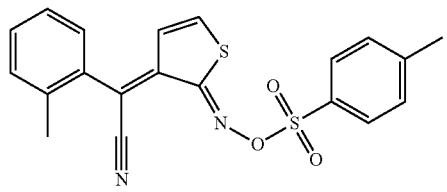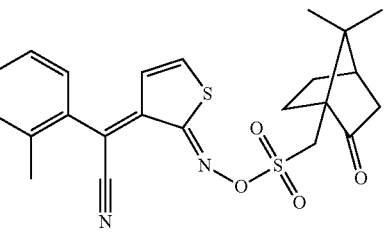
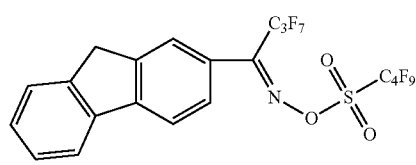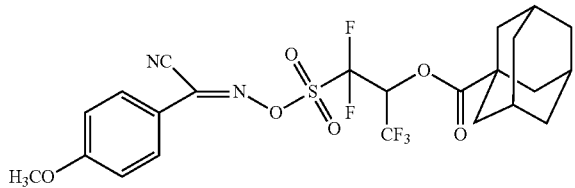
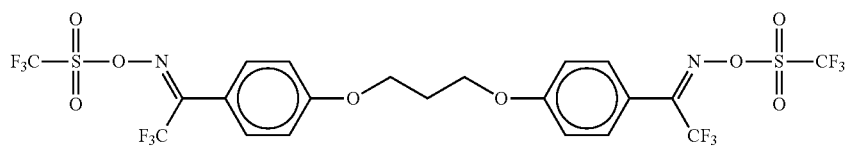
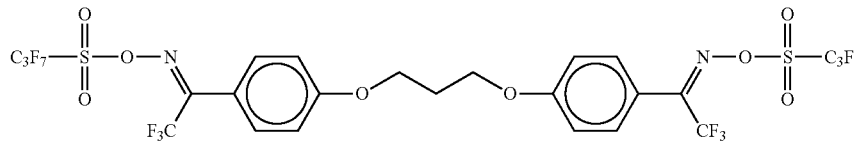
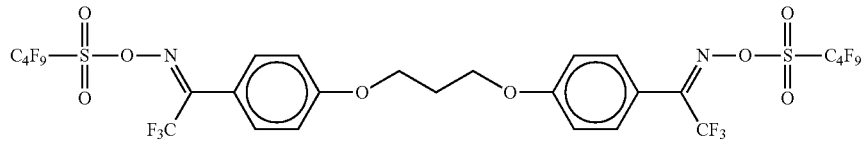
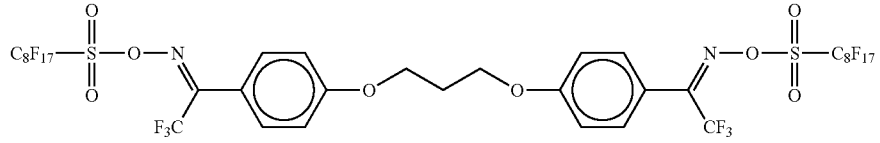

-continued
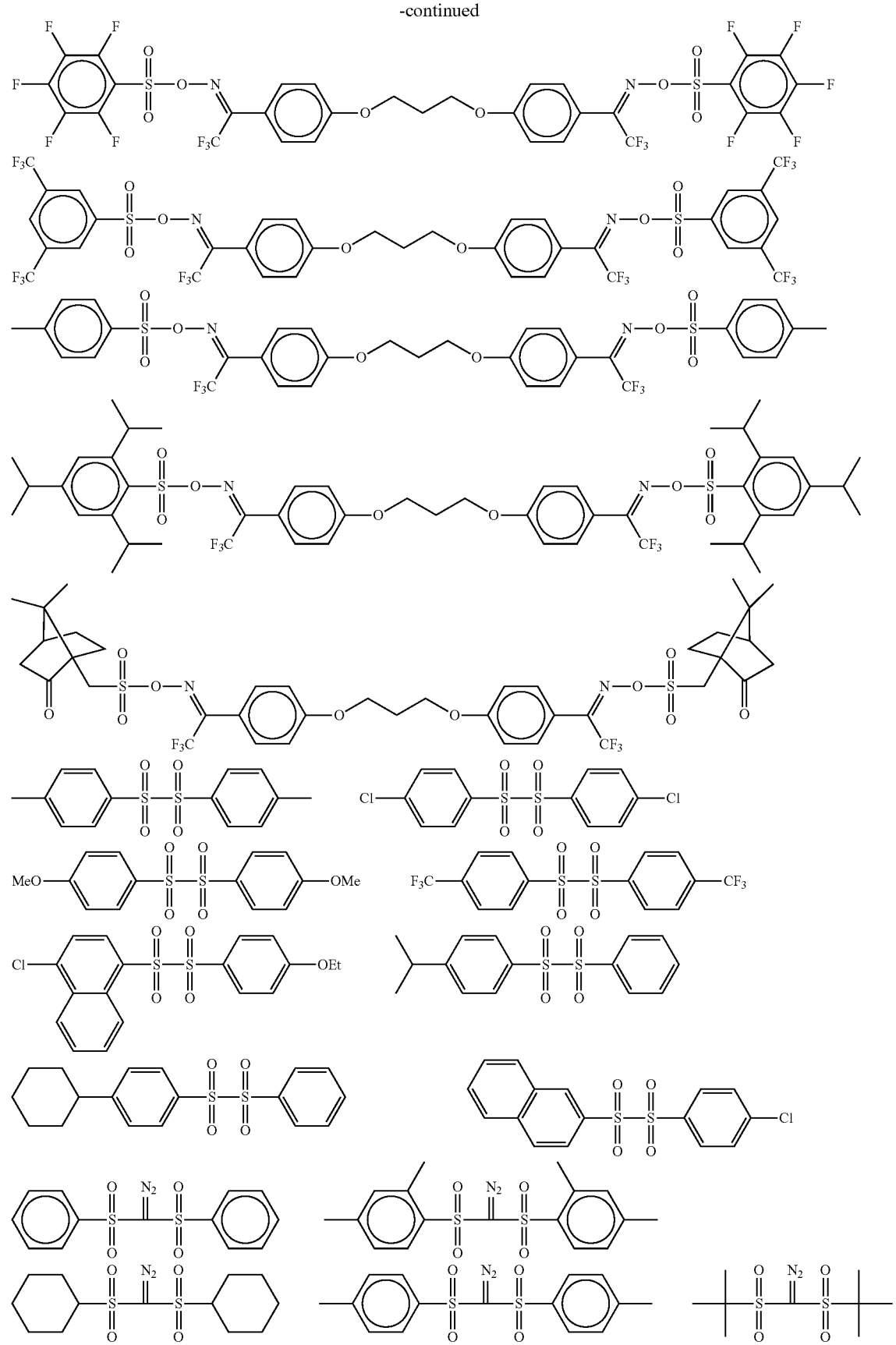

As for the compound (B), one kind of a compound may be used, or two or more kinds of compounds may be used in combination.

The content of the compound (B) in the resist composition is preferably from 0.1 to 15 mass %, more preferably from 0.5 to 12 mass %, still more preferably from 1 to 10 mass %, yet still more preferably from 2.5 to 7 mass %, based on the entire solid content of the resist composition.

The compound (B) may be also used in combination with an acid generator (hereinafter sometimes referred to as a "compound (B')") other than the compound (B).

The compound (B') is not particularly limited as long as it is a known compound, but a compound represented by formula (ZI) or (ZII) is preferred.

In formula (ZI), each of $R_{201}$, $R_{202}$ and $R_{203}$ independently represents an organic group.

The number of carbons in the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

$Z^-$ represents a non-nucleophilic anion (an anion having an extremely low ability of causing a nucleophilic reaction).

Examples of $Z^-$ include a sulfonate anion (such as aliphatic sulfonate anion, aromatic sulfonate anion and camphorsulfonate anion), a carboxylate anion (such as aliphatic carboxylate anion, aromatic carboxylate anion and aralkylcarboxylate anion), a sulfonylimide anion, a bis(alkylsulfonyl)imide anion and a tris(alkylsulfonyl)methide anion.

The aliphatic moiety in the aliphatic sulfonate anion and aliphatic carboxylate anion may be an alkyl group or a cycloalkyl group but is preferably a linear or branched alkyl group having a carbon number of 1 to 30 or a cycloalkyl group having a carbon number of 3 to 30.

The aromatic group in the aromatic sulfonate anion and aromatic carboxylate anion is preferably an aryl group having a carbon number of 6 to 14, and examples thereof include a phenyl group, a tolyl group and a naphthyl group.

These alkyl, cycloalkyl and aryl groups may have a substituent. Specific examples thereof include a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 2 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). As for the aryl group or ring structure in each group, examples of the substituent further include an alkyl group (preferably having a carbon number of 1 to 15).

The aralkyl group in the aralkylcarboxylate anion is preferably an aralkyl group having a carbon number of 6 to 12, and examples thereof include a benzyl group, a phenethyl group, a naphthylmethyl group, a naphthylethyl group and a naphthylbutyl group.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples of the substituent of this alkyl group include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom and a fluorine atom-substituted alkyl group being preferred.

Other examples of $Z^-$ include fluorinated phosphorus, fluorinated boron and fluorinated antimony.

$Z^-$ is preferably an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion (more preferably having a carbon number of 4 to 8) or a fluorine atom-containing benzenesulfonate anion, still more preferably nonafluorobutanesulfonate anion, perfluorooctanesulfonate anion, pentafluorobenzenesulfonate anion or 3,5-bis(trifluoromethyl)benzenesulfonate anion.

As regards the acid strength, the pKa of the acid generated is preferably −1 or less for enhancing the sensitivity.

Examples of the organic group of $R_{201}$, $R_{202}$ and $R_{203}$ include an aryl group (preferably having a carbon number of 6 to 15), a linear or branched alkyl group (preferably having a carbon number of 1 to 10), and a cycloalkyl group (preferably having a carbon number of 3 to 15).

At least one of $R_{201}$, $R_{202}$ and $R_{203}$ is preferably an aryl group, and it is more preferred that those three members all are an aryl group. The aryl group may be, for example, a phenyl group or a naphthyl group and may be also a heteroaryl group such as indole residue structure and pyrrole residue structure. This aryl group may further have a substituent, and examples of the substituent include, but are not limited to, a nitro group, a halogen atom such as fluorine atom, a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), and an alkoxycarbonyloxy group (preferably having a carbon number of 2 to 7).

Also, two members selected from $R_{201}$, $R_{202}$ and $R_{203}$ may combine through a single bond or a linking group. Examples of the linking group include, but are not limited to, an alkylene group (preferably having a carbon number of 1 to 3), —O—, —S—, —CO—, and —SO$_2$—.

Preferred structures where at least one of $R_{201}$, $R_{202}$ and $R_{203}$ is not an aryl group include cation structures such as compounds described in paragraphs 0046 and 0047 of JP-A-2004-233661 and paragraphs 0040 to 0046 of JP-A-2003-35948, compounds illustrated as formulae (I-1) to (I-70) in U.S. Patent Application Publication No. 2003/0224288A1, and compounds illustrated as formulae (IA-1) to (IA-54) and formulae (IB-1) to (IB-24) in U.S. Patent Application Publication No. 2003/0077540A1.

In formula (ZII), each of $R_{204}$ and $R_{205}$ independently represents an aryl group, an alkyl group or a cycloalkyl group.

The aryl group, alkyl group and cycloalkyl group of $R_{204}$ and $R_{205}$ are the same as the aryl group, alkyl group and cycloalkyl group of $R_{201}$ to $R_{203}$ in the compound (ZI).

The aryl group, alkyl group and cycloalkyl group of $R_{204}$ and $R_{205}$ may have a substituent. Examples of the substituent include those of the substituent which the aryl group, alkyl group and cycloalkyl group of $R_{201}$ to $R_{203}$ in the compound (ZI) may have.

$Z^-$ represents a non-nucleophilic anion, and examples thereof are the same as those of the non-nucleophilic anion of $Z^-$ in formula (ZI).

Among the compounds (B'), particularly preferred examples are illustrated below.

-continued (z16) (z17) (z18) (z19) (z20) (z21) (z22) (z23) (z24) (z25)

-continued (z26) (z27) (z28) (z29) (z30) (z31) (z32) (z33)

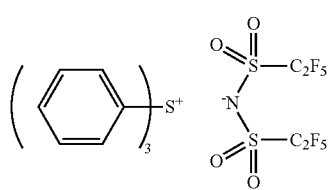 (z34)
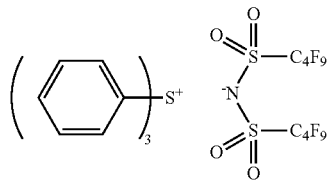 (z35)
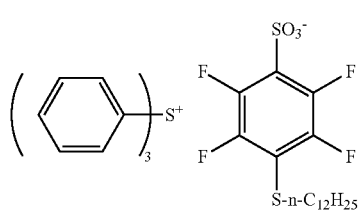 (z36)
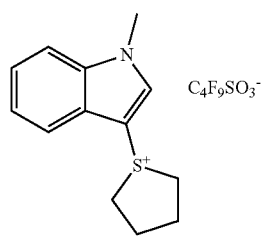 (z37)
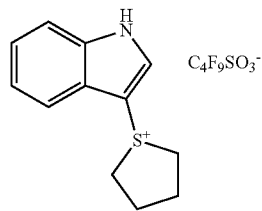 (z38)
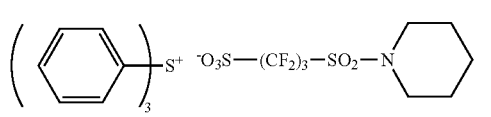 (z39)
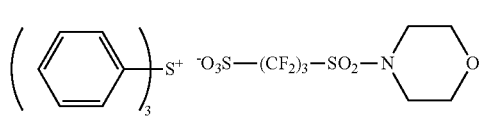 (z40)
 (z41)
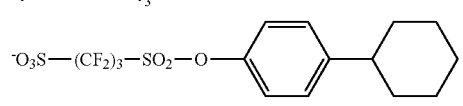 (z42)
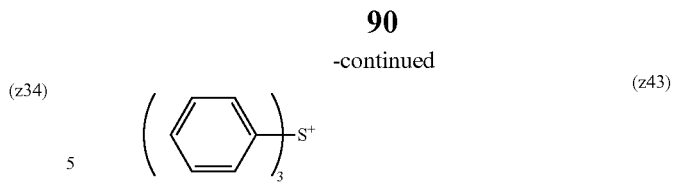 (z43)
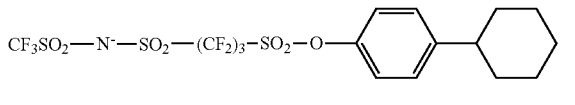 (z44)
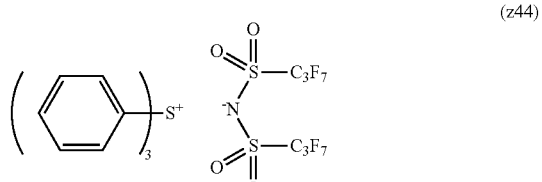 (z45)
 (z46)
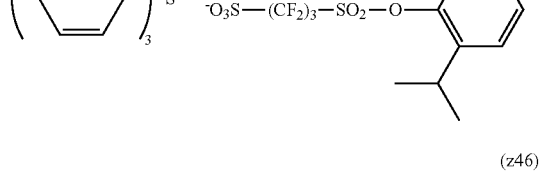 (z47)
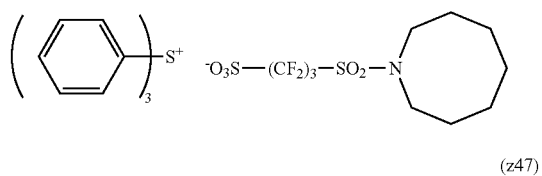 (z48)
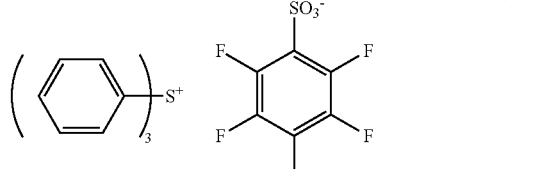 (z49)
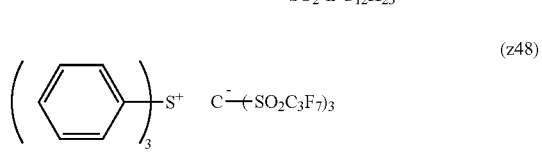 (z50)
(z51)

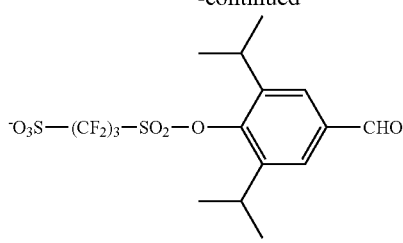
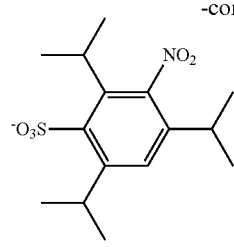
(z52)
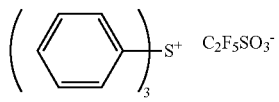
(z53)
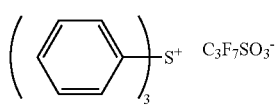
(z54)
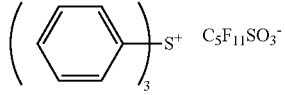
(z55)
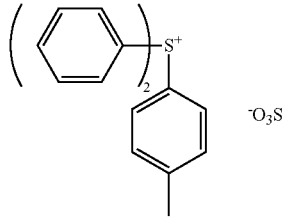
(z56)
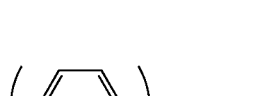
(z57)
(z58)
(z59)
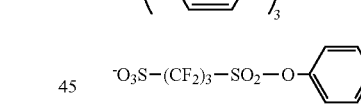
(z60)
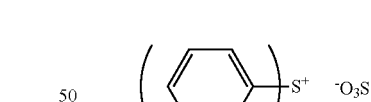
(z61)
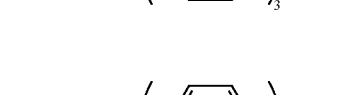
(z62)
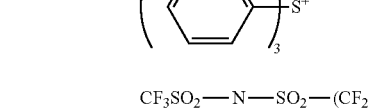
(z63)
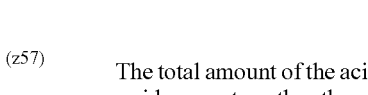
The total amount of the acid generator (in the case of using an acid generator other than the compound (B) in combination, including the amount of this acid generator) is preferably from 0.1 to 20 mass %, more preferably from 0.5 to 17 mass %, still more preferably from 1 to 12 mass %, yet still more preferably from 2.5 to 9 mass %, based on the entire solid content of the resist composition.

In the case of using the compound (B) and the compound (B') in combination, the amount of acid generators used is, in terms of the molar ratio (compound (B)/compound (B')), usually from 99/1 to 20/80, preferably from 99/1 to 40/60, more preferably from 99/1 to 50/50.

[3] (C) Crosslinking Agent

In the present invention, a compound capable of crosslinking the resin (A) by the action of an acid (hereinafter referred to as a "crosslinking agent") is used together with the resin (A). Here, a known crosslinking agent can be effectively used.

The crosslinking agent (C) is a compound having a crosslinking group capable of crosslinking the resin (A), and examples of the crosslinking group include a hydroxymethyl group, an alkoxymethyl group, a vinyl ether group and an epoxy group. The crosslinking agent (C) preferably has two or more of such crosslinking groups.

The crosslinking agent (C) is preferably a crosslinking agent composed of a melamine-based compound, a urea-based compound, an alkylene urea-based compound or a glycoluril-based compound.

Preferred examples of the crosslinking agent include a compound having an N-hydroxymethyl group, an N-alkoxymethyl group or an N-acyloxymethyl group.

The compound having an N-hydroxymethyl group, an N-alkoxymethyl group or an N-acyloxymethyl group is preferably a compound having two or more (more preferably from two to eight) partial structures represented by the following formula (CLNM-1):

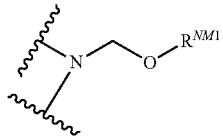

(CLNM-1)

In formula (CLNM-1), $R^{NM1}$ represents a hydrogen atom, an alkyl group, a cycloalkyl group or an oxoalkyl group. The alkyl group of $R^{NM1}$ in formula (CLNM-1) is preferably a linear or branched alkyl group having a carbon number of 1 to 6, and the cycloalkyl group of $R^{NM1}$ is preferably a cycloalkyl group having a carbon number of 5 or 6. The oxoalkyl group of $R^{NM1}$ is preferably an oxoalkyl group having a carbon number of 3 to 6, and examples thereof include a β-oxopropyl group, a β-oxobutyl group, a β-oxopentyl group and a β-oxohexyl group.

More preferred embodiments of the compound having two or more partial structures represented by formula (CLNM-1) include a urea-based crosslinking agent represented by the following formula (CLNM-2), an alkylene urea-based crosslinking agent represented by the following formula (CLNM-3), a glycoluril-based crosslinking agent represented by the following formula (CLNM-4) and a melamine-based crosslinking agent represented by the following formula (CLNM-5).

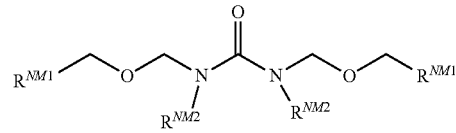

(CLNM-2)

In formula (CLNM-2), each $R^{NM1}$ independently has the same meaning as $R^{NM1}$ in formula (CLNM-1).

Each $R^{NM2}$ independently represents a hydrogen atom, an alkyl group (preferably having a carbon number of 1 to 6) or a cycloalkyl group (preferably having a carbon number of 5 to 6).

Specific examples of the urea-based crosslinking agent represented by formula (CLNM-2) include N,N-di(methoxymethyl)urea, N,N-di(ethoxymethyl)urea, N,N-di(propoxymethyl)urea, N,N-di(isopropoxymethyl)urea, N,N-di(butoxymethyl)urea, N,N-di(tert-butoxymethyl)urea, N,N-di(cyclohexyloxymethyl)urea, N,N-di(cyclopentyloxymethyl)urea, N,N-di(adamantyloxymethyl)urea and N,N-di(norbornyloxymethyl)urea.

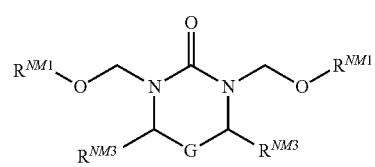

(CLNM-3)

In formula (CLNM-3), each $R^{NM1}$ independently has the same meaning as $R^{NM1}$ in formula (CLNM-1).

Each $R^{NM3}$ independently represents a hydrogen atom, a hydroxyl group, a linear or branched alkyl group (preferably having a carbon number of 1 to 6), a cycloalkyl group (preferably having a carbon number of 5 to 6), an oxoalkyl group (preferably having a carbon number of 3 to 6), an alkoxy group (preferably having a carbon number of 1 to 6) or an oxoalkoxy group (preferably having a carbon number of 1 to 6).

G represents a single bond, an oxygen atom, a sulfur atom, an alkylene group (preferably having a carbon number of 1 to 3) or a carbonyl group. Specific examples thereof include a methylene group, an ethylene group, a propylene group, a 1-methylethylene group, a hydroxymethylene group and a cyanomethylene group.

Specific examples of the alkylene urea-based crosslinking agent represented by formula (CLNM-3) include N,N-di(methoxymethyl)-4,5-di(methoxymethyl)ethylene urea, N,N-di(ethoxymethyl)-4,5-di(ethoxymethyl)ethylene urea, N,N-di(propoxymethyl)-4,5-di(propoxymethyl)ethylene urea, N,N-di(isopropoxymethyl)-4,5-di(isopropoxymethyl)ethylene urea, N,N-di(butoxymethyl)-4,5-di(butoxymethyl)ethylene urea, N,N-di(tert-butoxymethyl)-4,5-di(tert-butoxymethyl)ethylene urea, N,N-di(cyclohexyloxymethyl)-4,5-di(cyclohexyloxymethyl)ethylene urea, N,N-di(cyclopentyloxymethyl)-4,5-di(cyclopentyloxymethyl)ethylene urea, N,N-di(adamantyloxymethyl)-4,5-di(adamantyloxymethyl)ethylene urea and N,N-di(norbornyloxymethyl)-4,5-di(norbornyloxymethyl)ethylene urea.

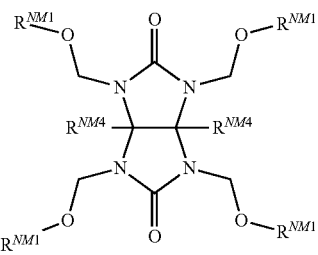

(CLNM-4)

In formula (CLNM-4), each $R^{NM1}$ independently has the same meaning as $R^{NM1}$ in formula (CLNM-1).

Each $R^{NM4}$ independently represents a hydrogen atom, a hydroxyl group, an alkyl group, a cycloalkyl group or an alkoxy group.

Specific examples of the alkyl group (preferably having a carbon number of 1 to 6), cycloalkyl group (preferably having a carbon number of 5 or 6) and alkoxy group (preferably having a carbon number of 1 to 6) of $R^{NM4}$ include a methyl group, an ethyl group, a butyl group, a cyclopentyl group, a cyclohexyl group, a methoxy group, an ethoxy group and a butoxy group.

Specific examples of the glycoluril-based crosslinking agent represented by formula (CLNM-4) include N,N,N,N-tetra(methoxymethyl)glycoluril, N,N,N,N-tetra(ethoxymethyl)glycoluril, N,N,N,N-tetra(propoxymethyl)glycoluril, N,N,N,N-tetra(isopropoxymethyl)glycoluril, N,N,N,N-tetra(butoxymethyl)glycoluril, N,N,N,N-tetra(tert-butoxymethyl)glycoluril, N,N,N,N-tetra(cyclohexyloxymethyl)glycoluril, N,N,N,N-tetra(cyclopentyloxymethyl)glycoluril, N,N,N,N-tetra(adamantyloxymethyl)glycoluril and N,N,N,N-tetra(norbornyloxymethyl)glycoluril.

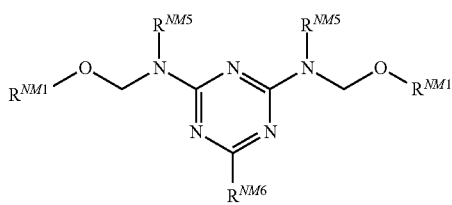

(CLNM-5)

In formula (CLNM-5), each $R^{NM1}$ independently has the same meaning as $R^{NM1}$ in formula (CLNM-1).

Each $R^{NM5}$ independently represents a hydrogen atom, an alkyl group, a cycloalkyl group, an aryl group or an atomic group represented by the following formula (CLNM-5').

$R^{NM6}$ represents a hydrogen atom, an alkyl group, a cycloalkyl group, an aryl group or an atomic group represented by the following formula (CLNM-5").

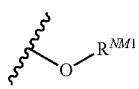

(CLNM-5')

(CLNM-5")

In formula (CLNM-5'), $R^{NM1}$ has the same meaning as $R^{NM1}$ in formula (CLNM-1).

In formula (CLNM-5"), $R^{NM1}$ has the same meaning as $R^{NM1}$ in formula (CLNM-1), and $R^{NM5}$ has the same meaning as $R^{NM5}$ in formula (CLNM-5).

Specific examples of the alkyl group (preferably having a carbon number of 1 to 6), cycloalkyl group (preferably having a carbon number of 5 or 6) and aryl group (preferably having a carbon number of 6 to 10) of $R^{NM5}$ and $R^{NM6}$ include a methyl group, an ethyl group, a propyl group, an isopropyl group, a butyl group, an isobutyl group, a tert-butyl group, a pentyl group, a cyclopentyl group, a hexyl group, a cyclohexyl group, a phenyl group and a naphthyl group.

Examples of the melamine-based crosslinking agent represented by formula (CLNM-5) include N,N,N,N,N,N-hexa(methoxymethyl)melamine, N,N,N,N,N,N-hexa(ethoxymethyl)melamine, N,N,N,N,N,N-hexa(propoxymethyl)melamine, N,N,N,N,N,N-hexa(isopropoxymethyl)melamine, N,N,N,N,N,N-hexa(butoxymethyl)mel amine, N,N,N,N,N,N-hexa(tert-butoxymethyl)mel amine, N,N,N,N,N,N-hexa(cyclohexyloxymethyl)mel amine, N,N,N,N,N,N-hexa(cyclopentyloxymethyl)melamine, N,N,N,N,N,N-hexa(adamantyloxymethyl)melamine, N,N,N,N,N,N-hexa(norbornyloxymethyl)melamine, N,N,N,N,N,N-hexa(methoxymethyl)acetoguanamine, N,N,N,N,N,N-hexa(ethoxymethyl)acetoguanamine, N,N,N,N,N,N-hexa(propoxymethyl)acetoguanamine, N,N,N,N,N,N-hexa(isopropoxymethyl)acetoguanamine, N,N,N,N,N,N-hexa(butoxymethyl)acetoguanamine, N,N,N,N,N,N-hexa(tert-butoxymethyl)acetoguanamine, N,N,N,N,N,N-hexa(methoxymethyl)benzoguanamine, N,N,N,N,N,N-hexa(ethoxymethyl)benzoguanamine, N,N,N,N,N,N-hexa(propoxymethyl)benzoguanamine, N,N,N,N,N,N-hexa(isopropoxymethyl)benzoguanamine, N,N,N,N,N,N-hexa(butoxymethyl)benzoguanamine and N,N,N,N,N,N-hexa(tert-butoxymethyl)benzoguanamine.

The groups represented by $R^{NM1}$ to $R^{NM6}$ in formulae (CLNM-1) to (CLNM-5) may further have a substituent. Examples of the substituent which $R^{NM1}$ to $R^{NM6}$ may have include a halogen atom, a hydroxyl group, a nitro group, a cyano group, a carboxyl group, a cycloalkyl group (preferably having a carbon number of 3 to 20), an aryl group (preferably having a carbon number of 6 to 14), an alkoxy group (preferably having a carbon number of 1 to 20), a cycloalkoxy group (preferably having a carbon number of 4 to 20), an acyl group (preferably having a carbon number of 2 to 20) and an acyloxy group (preferably having a carbon number of 2 to 20).

The crosslinking agent (C) may be a phenol compound having a benzene ring in the molecule.

The phenol compound is preferably a phenol derivative having a molecular weight of 1,200 or less, containing from three to five benzene rings in the molecule and further having two or more hydroxymethyl groups or alkoxymethyl groups in total, where the hydroxymethyl groups or alkoxymethyl groups are bonded in a concentrated manner to at least any one benzene ring or distributed among the benzene rings. By using such a phenol derivative, the effects of the present invention can be more remarkably brought out. The alkoxymethyl group bonded to the benzene ring is preferably an alkoxymethyl group having a carbon number of 6 or less. Specifically, a methoxymethyl group, an ethoxymethyl group, an n-propoxymethyl group, an i-propoxymethyl group, an n-butoxymethyl group, an i-butoxymethyl group, a sec-butoxymethyl group, or a tert-butoxymethyl group is preferred. An alkoxy-substituted alkoxy group such as 2-methoxyethoxy group and 2-methoxy-1-propyl group is also preferred.

The phenol compound is more preferably a phenol compound containing two or more benzene rings in the molecule and is preferably a phenol compound containing no nitrogen atom.

Specifically, a phenol compound having from two to eight crosslinking groups capable of crosslinking the resin (A) per molecule is preferred, and it is more preferred to have from three to six crosslinking groups.

Out of these phenol derivatives, particularly preferred compounds are illustrated below. In the formulae, each of $L^1$ to $L^8$, which may be the same or different, represents a crosslinking group, and the crosslinking group is preferably a hydroxymethyl group, a methoxymethyl group or an ethoxymethyl group.

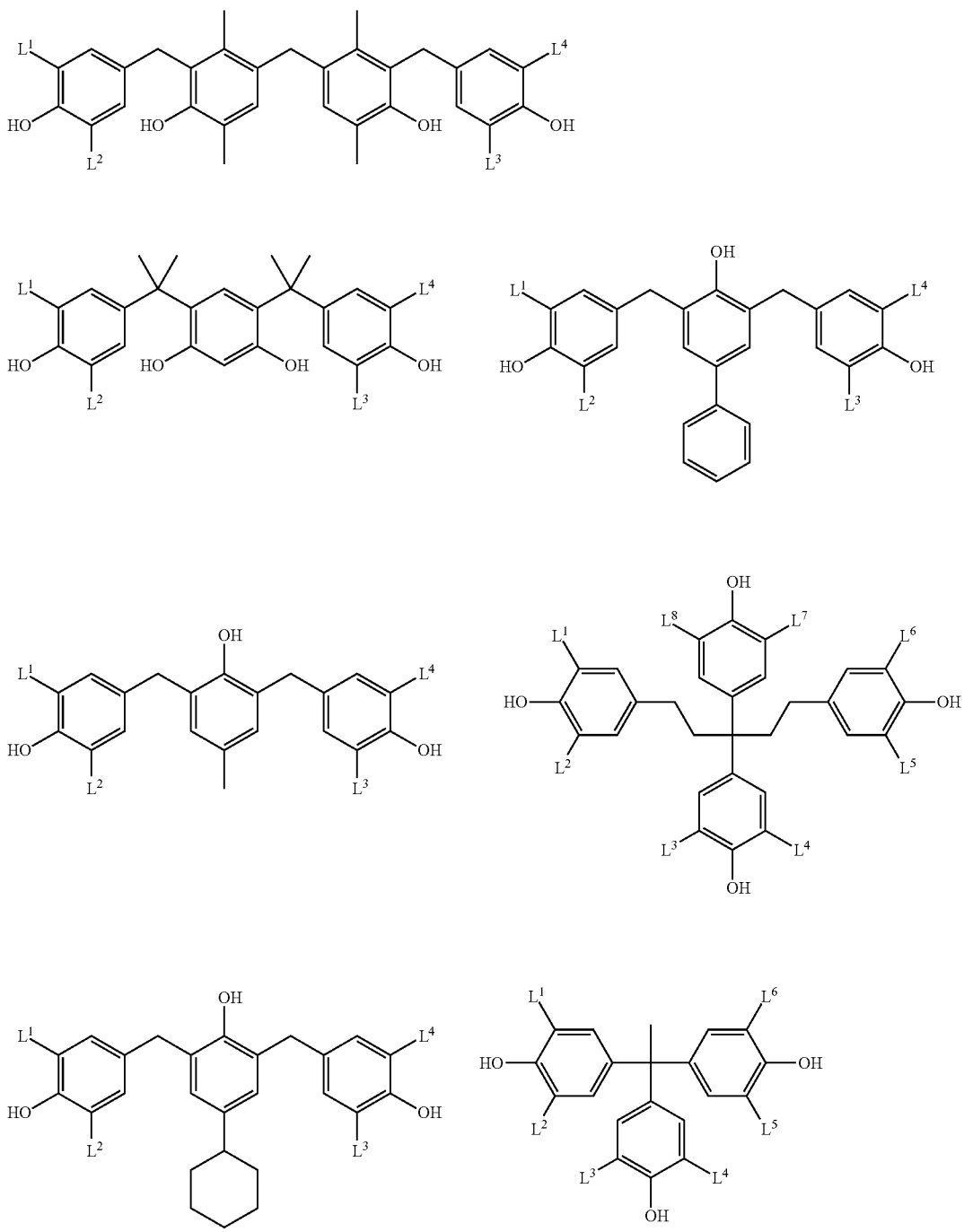

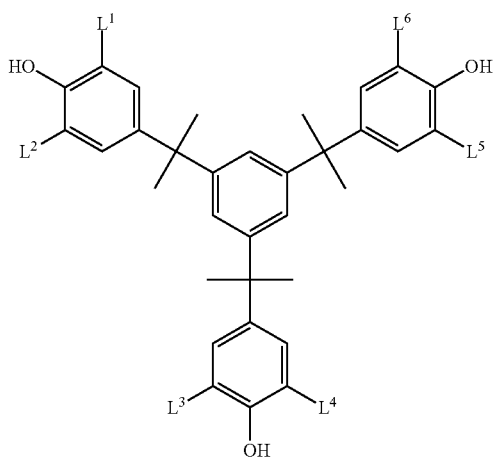
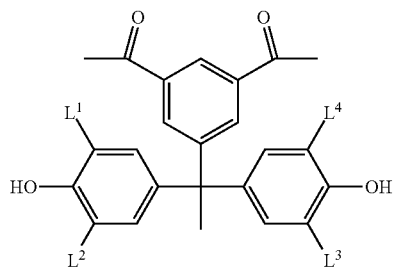
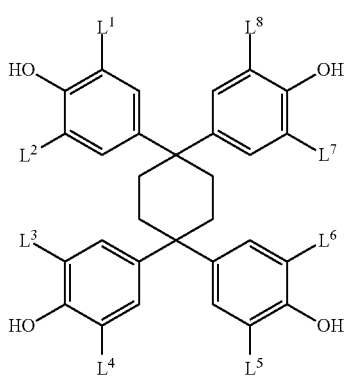
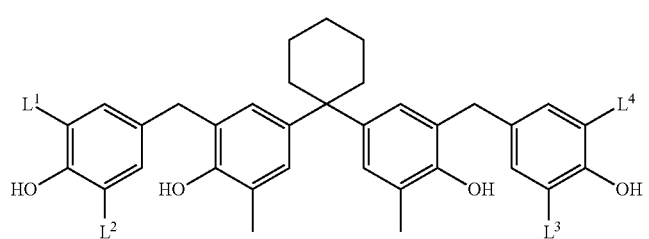
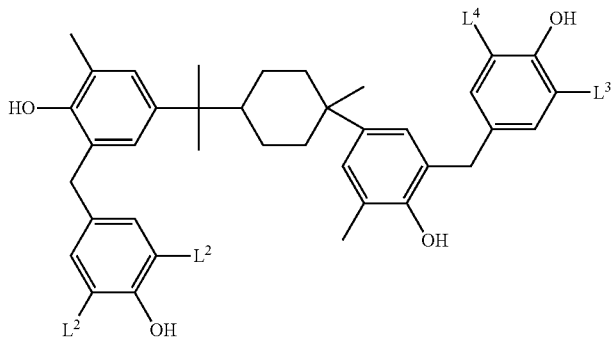
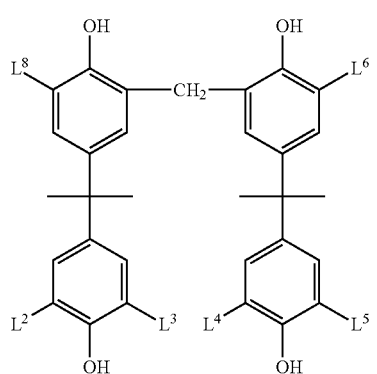
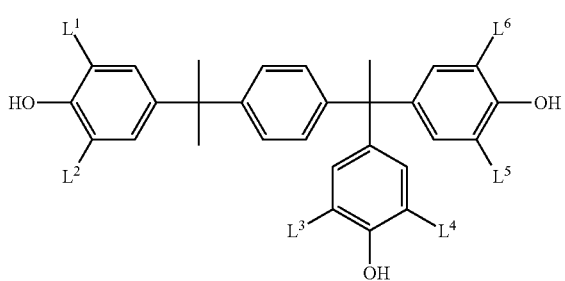
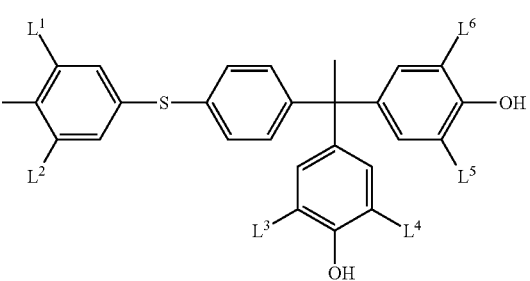
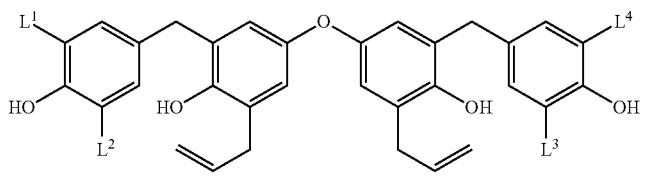

-continued

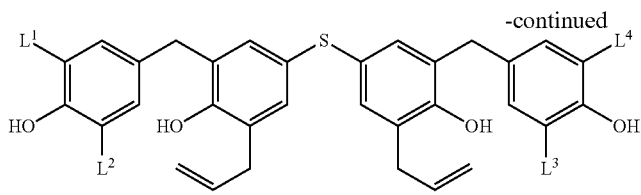

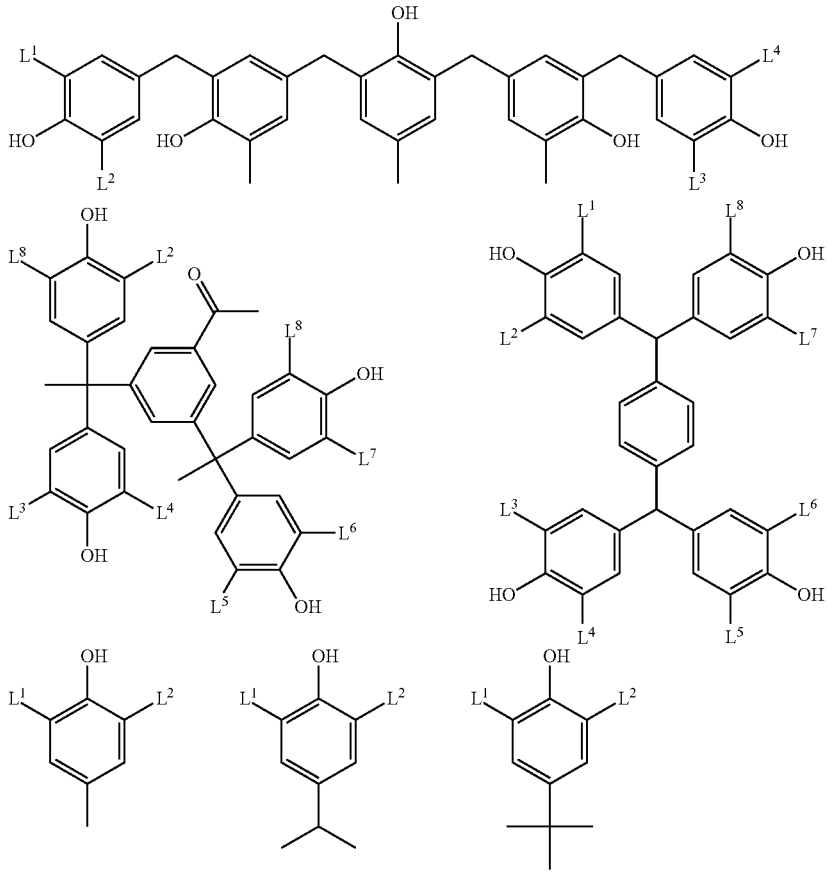

As for the phenol compound, a commercially available product may be used, or the compound may be synthesized by a known method. For example, a phenol derivative having a hydroxymethyl group can be obtained by reacting a phenol compound having no corresponding hydroxymethyl group (a compound where in the formulae above, each of $L^1$ to $L^8$ is a hydrogen atom) with formaldehyde in the presence of a base catalyst. At this time, in order to prevent resinification or gelling, the reaction is preferably performed at a temperature of 60° C. or less. Specifically, the compound can be synthesized by the method described, for example, in JP-A-6-282067 and JP-A-7-64285.

A phenol derivative having an alkoxymethyl group can be obtained by reacting a phenol derivative having a corresponding hydroxymethyl group with an alcohol in the presence of an acid catalyst. At this time, in order to prevent resinification or gelling, the reaction is preferably performed at a temperature of 100° C. or less. Specifically, the compound can be synthesized by the method described, for example, in EP632003A1. The thus-synthesized phenol derivative having a hydroxymethyl group or an alkoxymethyl group is preferred in view of stability during storage, and a phenol derivative having an alkoxymethyl group is particularly preferred in view of stability during storage. As for such a phenol derivative having two or more hydroxymethyl groups or alkoxymethyl groups in total which are bonded in a concentrated manner to any one benzene ring or distributed among the benzene rings, one kind of a phenol derivative may be used alone, or two or more kinds may be used in combination.

The crosslinking agent (C) may be an epoxy compound having an epoxy group in the molecule.

The epoxy compound includes a compound represented by the following formula (EP2).

In formula (EP2), each of $R^{EP1}$ to $R^{EP3}$ independently represents a hydrogen atom, a halogen atom, an alkyl group or a cycloalkyl group, and these alkyl group and cycloalkyl group may have a substituent. Also, $R^{EP1}$ and $R^{EP2}$, or $R^{EP2}$ and $R^{EP3}$ may combine with each other to form a ring structure.

Examples of the substituent which the alkyl group and cycloalkyl group may have include a hydroxyl group, a cyano group, an alkoxy group, an alkylcarbonyl group, an alkoxycarbonyl group, an alkylcarbonyloxy group, an alkylthio group, an alkylsulfone group, an alkylsulfonyl group, an alkylamino group and an alkylamide group.

$Q^{EP}$ represents a single bond or an $n^{EP}$-valent organic group. $R^{EP1}$ to $R^{EP3}$ may combine not only with each other but also with $Q^{EP}$ to form a ring structure.

$n^{EP}$ represents an integer of 2 or more and is preferably an integer of 2 to 10, more preferably from 2 to 6. However, when $Q^{EP}$ is a single bond, $n^{EP}$ is 2.

In the case where $Q^{EP}$ is an $n^{EP}$-valent organic group, for example, a chain or cyclic saturated hydrocarbon structure (preferably having a carbon number of 2 to 20), an aromatic ring structure (preferably having a carbon number of 6 to 30), or a structure where these structures are linked by a structure such as ether, ester, amide and sulfonamide, is preferred.

Specific examples of the compound having an epoxy structure are illustrated below, but the present invention is not limited thereto.

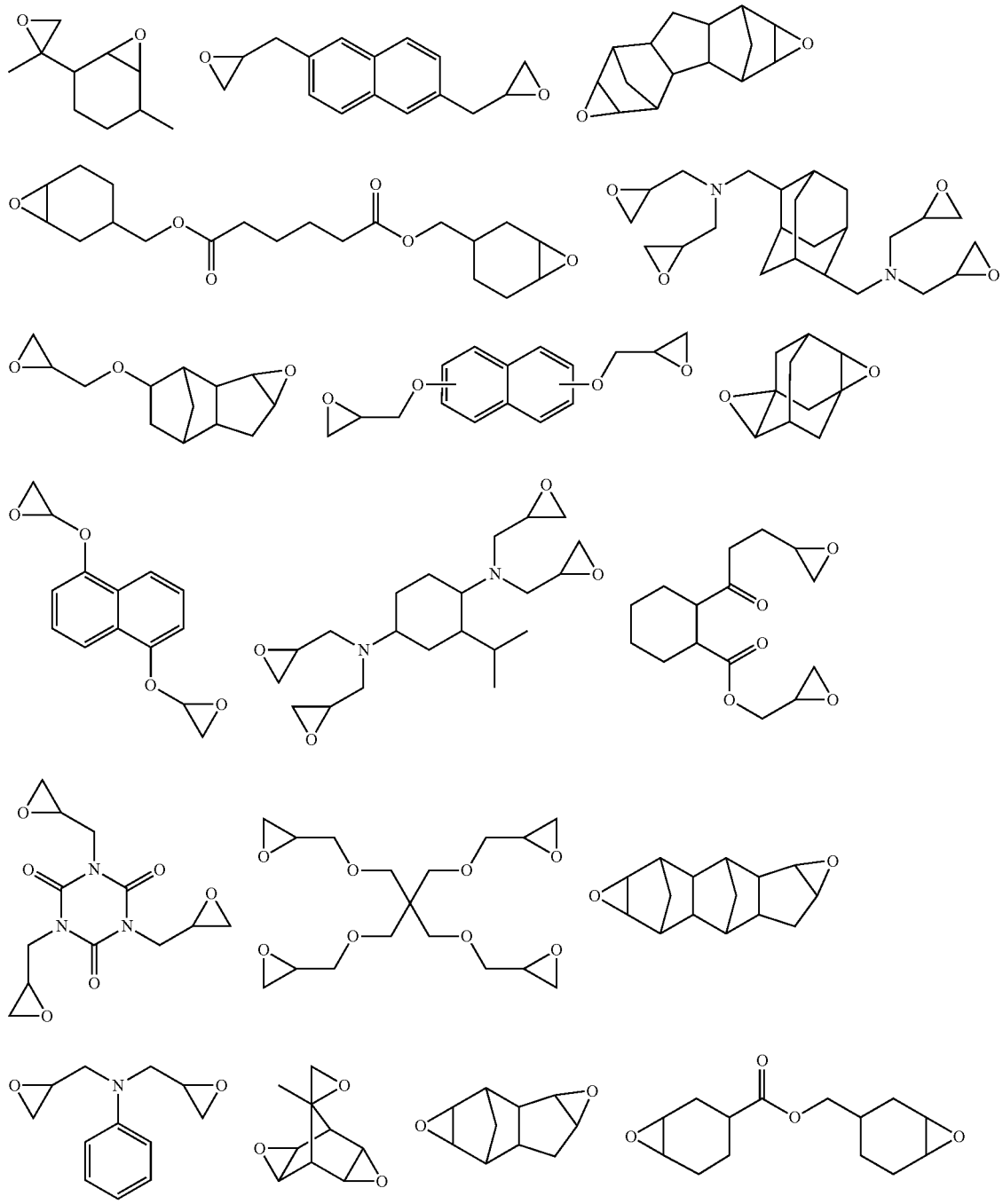

105
-continued
106
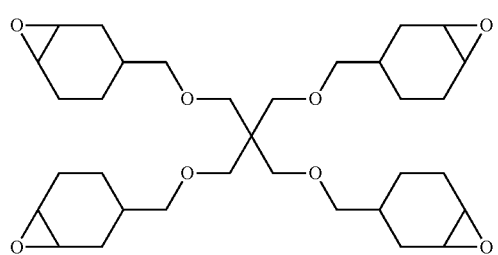
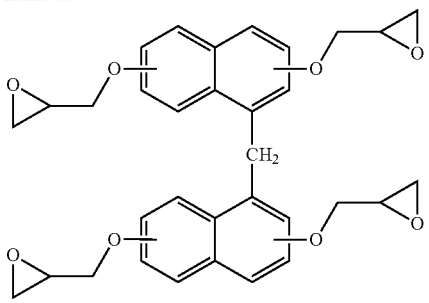
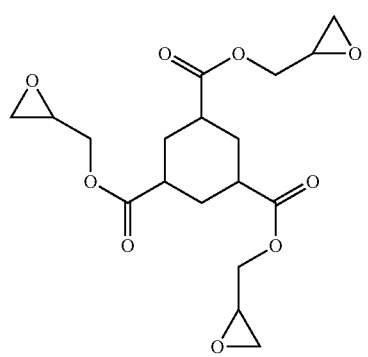
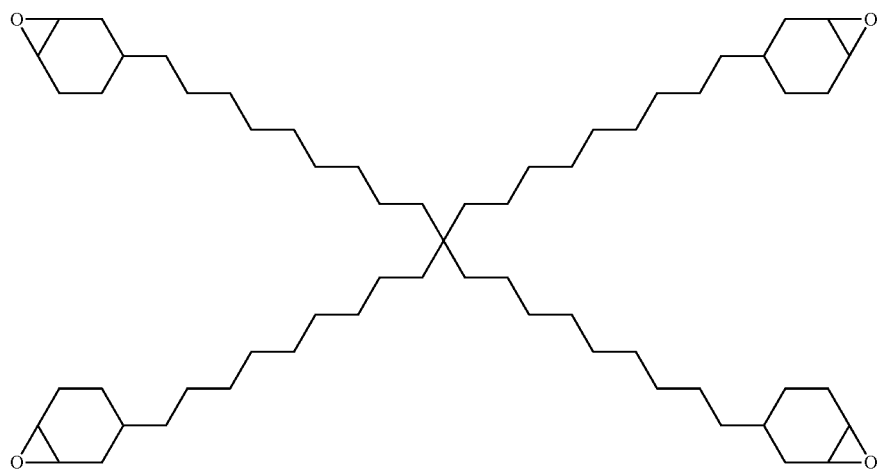
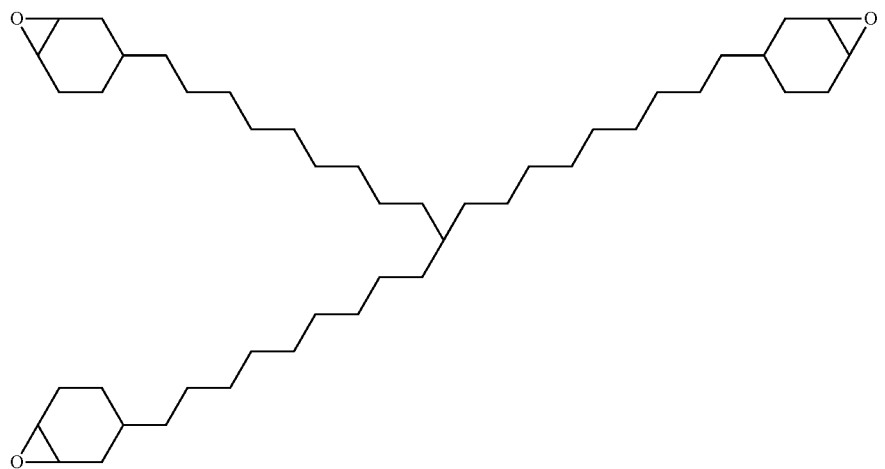

-continued

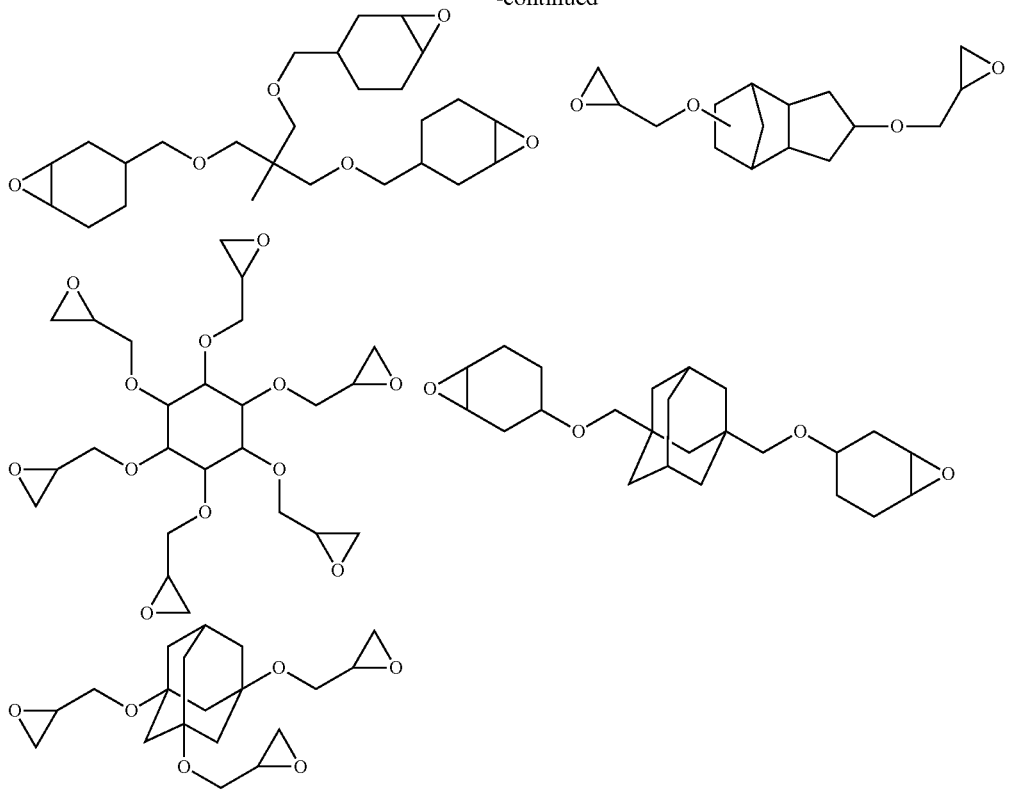

In the present invention, one crosslinking agent may be used alone, or two or more crosslinking agents may be used in combination.

The content of the crosslinking agent in the resist composition is preferably from 3 to 15 mass %, more preferably from 4 to 12 mass %, still more preferably form 5 to 10 mass %, based on the entire solid content of the resist composition.

[4] (D) Solvent

Examples of the solvent which can be used at the time of preparing the resist composition of the present invention include an organic solvent such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may contain a ring, alkylene carbonate, alkyl alkoxyacetate and alkyl pyruvate.

Specific examples of these solvents include those described in paragraphs [0441] to [0455] of U.S. Patent Application Publication 2008/0187860.

In the present invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably an alkylene glycol monoalkyl ether, an alkyl lactate or the like, more preferably propylene glycol monomethyl ether (PGME, another name: 1-methoxy-2-propanol) or ethyl lactate. The solvent not containing a hydroxyl group is preferably an alkylene glycol monoalkyl ether acetate, an alkyl alkoxypropionate, a monoketone compound which may contain a ring, a cyclic lactone, an alkyl acetate or the like, more preferably propylene glycol monomethyl ether acetate (PGMEA, another name: 1-methoxy-2-acetoxypropane), ethyl-3-ethoxy propionate (EEP), 2-heptanone, γ-butyrolactone, cyclohexanone or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, more preferably from 20/80 to 60/40. A mixed solvent in which the solvent not containing a hydroxyl group accounts for 50 mass % or more is particularly preferred in view of coating uniformity.

The solvent preferably contains propylene glycol monomethyl ether acetate and is preferably a solvent containing propylene glycol monomethyl ether acetate alone or a mixed solvent of two or more kinds of solvents containing propylene glycol monomethyl ether acetate.

[5] (E) Hydrophobic Resin

The resist composition of the present invention may contain a hydrophobic resin having at least either a fluorine atom or a silicon atom (hereinafter sometimes referred to as a "hydrophobic resin (E)" or simply as a "resin (E)") particularly when the resist composition is applied to immersion exposure. The hydrophobic resin (E) is unevenly distributed to the film surface layer and when the immersion medium is water, the static/dynamic contact angle on the resist film surface for water as well as the followability of immersion liquid can be enhanced.

The hydrophobic resin (E) is, as described above, unevenly distributed to the interface but unlike a surfactant, need not have necessarily a hydrophilic group in the molecule and may not contribute to uniform mixing of polar/nonpolar substances.

The hydrophobic resin typically contains a fluorine atom and/or a silicon atom. The fluorine atom and/or silicon atom in the hydrophobic resin (E) may be contained in the main chain of the resin or contained in the side chain.

In the case where the hydrophobic resin (E) contains a fluorine atom, the resin preferably contains, as a fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably from 1 to 4) is a linear or branched alkyl group with at least one hydrogen atom being substituted for by a fluorine atom and may further have a substituent other than the fluorine atom.

The fluorine atom-containing cycloalkyl group is a monocyclic or polycyclic cycloalkyl group with at least one hydrogen atom being substituted for by a fluorine atom and may further have a substituent other than the fluorine atom.

The fluorine atom-containing aryl group is an aryl group (e.g., phenyl, naphthyl) with at least one hydrogen atom being substituted for by a fluorine atom and may further have a substituent other than the fluorine atom.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

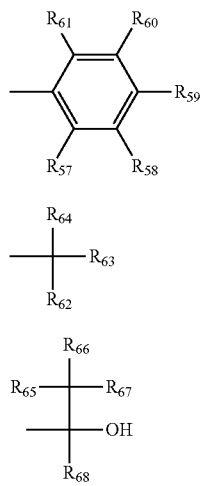

In formulae (F2) to (F4), each of $R_{57}$ to $R_{68}$ independently represents a hydrogen atom, a fluorine atom or an alkyl group (linear or branched). However, each of at least one of $R_{57}$ to $R_{61}$, at least one of $R_{62}$ to $R_{64}$, and at least one of $R_{65}$ to $R_{68}$ independently represents a fluorine atom or an alkyl group (preferably having a carbon number of 1 to 4) with at least one hydrogen atom being substituted for by a fluorine atom.

It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted for by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

The fluorine atom-containing partial structure may be bonded directly to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by combining two or more of these groups and bonds.

As the repeating unit having a fluorine atom, those shown below are preferred.

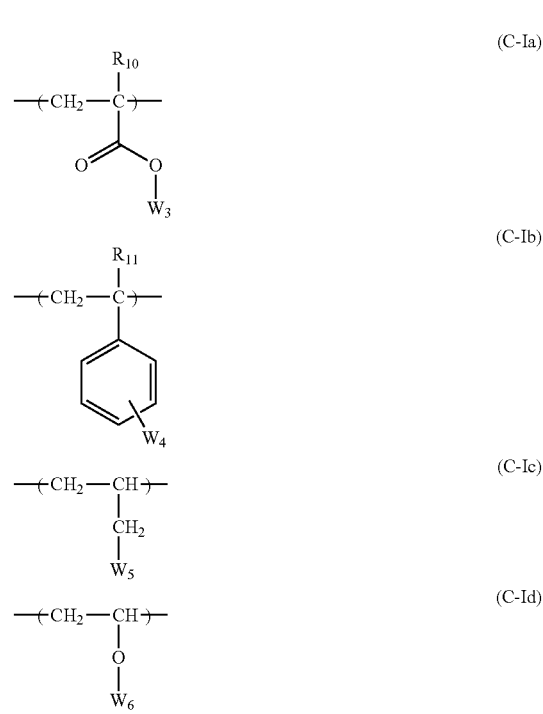

In the formulae, each of $R_{10}$ and $R_{11}$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

Each of $W_3$ to $W_6$ independently represents an organic group having at least one or more fluorine atoms and specifically includes the atomic groups of (F2) to (F4).

Other than these, the hydrophobic resin (E) may contain a unit shown below as the repeating unit having a fluorine atom.

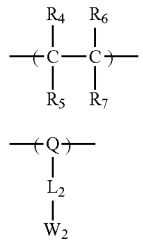
(C-II)

(C-III)

In the formulae, each of $R_4$ to $R_7$ independently represents a hydrogen atom, a fluorine atom or an alkyl group. The alkyl group is preferably a linear or branched alkyl group having a carbon number of 1 to 4 and may have a substituent, and the alkyl group having a substituent includes, in particular, a fluorinated alkyl group.

However, at least one of $R_4$ to $R_7$ represents a fluorine atom. $R_4$ and $R_5$, or $R_6$ and $R_7$ may form a ring.

$W_2$ represents an organic group having at least one fluorine atom and specifically includes the atomic groups of (F2) to (F4).

$L_2$ represents a single bond or a divalent linking group. The divalent linking group is a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or an alkyl group), —NHSO$_2$—, or a divalent linking group formed by combining a plurality of these groups.

Q represents an alicyclic structure. The alicyclic structure may have a substituent and may be monocyclic or polycyclic, and in the case of a polycyclic structure, the structure may be a crosslinked structure. The monocyclic structure is preferably a cycloalkyl group having a carbon number of 3 to 8, and examples thereof include a cyclopentyl group, a cyclohexyl group, a cyclobutyl group and a cyclooctyl group. Examples of the polycyclic structure include a group containing a bicyclo, tricyclo or tetracyclo structure having a carbon number of 5 or more. A cycloalkyl group having a carbon number of 6 to 20 is preferred, and examples thereof include an adamantyl group, a norbornyl group, a dicyclopentyl group, a tricyclodecanyl group and a tetracyclododecyl group. A part of carbon atoms in the cycloalkyl group may be substituted with a heteroatom such as oxygen atom. In particular, Q is preferably a norbornyl group, a tricyclodecanyl group, a tetracyclododecyl group or the like.

Specific examples of the repeating unit containing a fluorine atom are illustrated below, but the present invention is not limited thereto.

In specific examples, $X_1$ represents a hydrogen atom, —CH$_3$, —F or —CF$_3$, and $X_2$ represents —F or —CF$_3$.

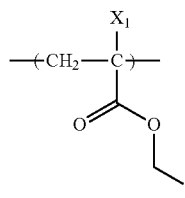
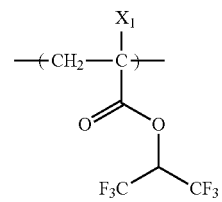

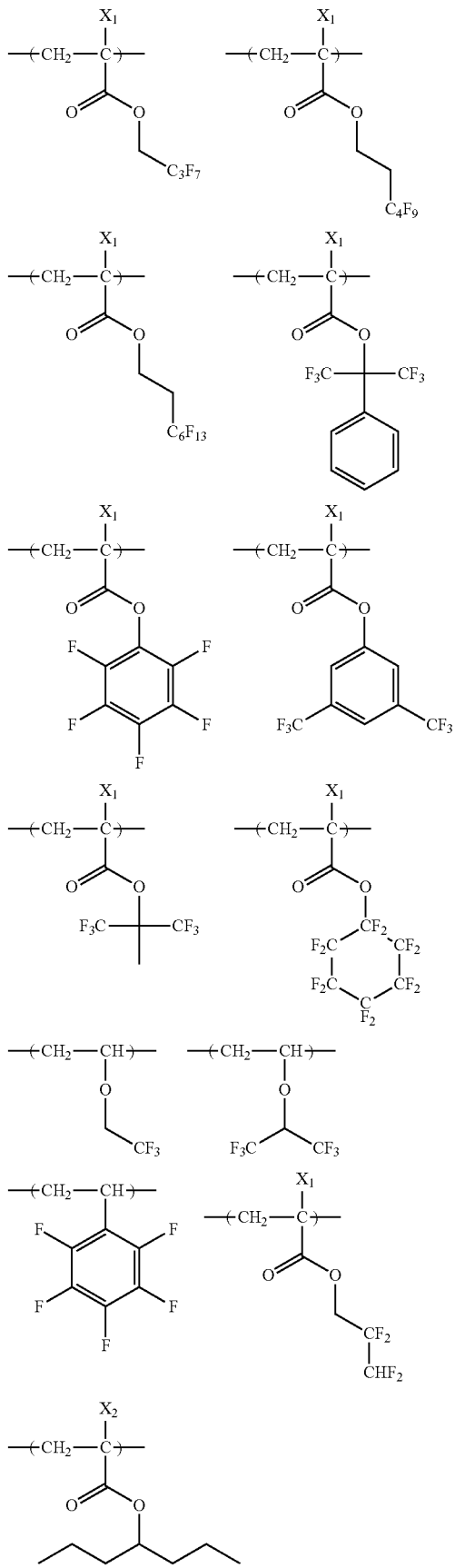

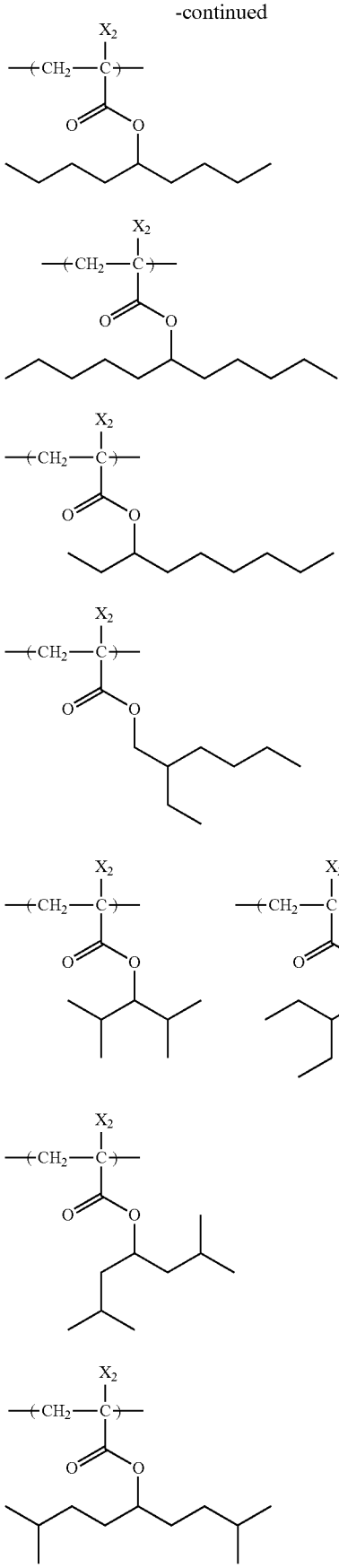
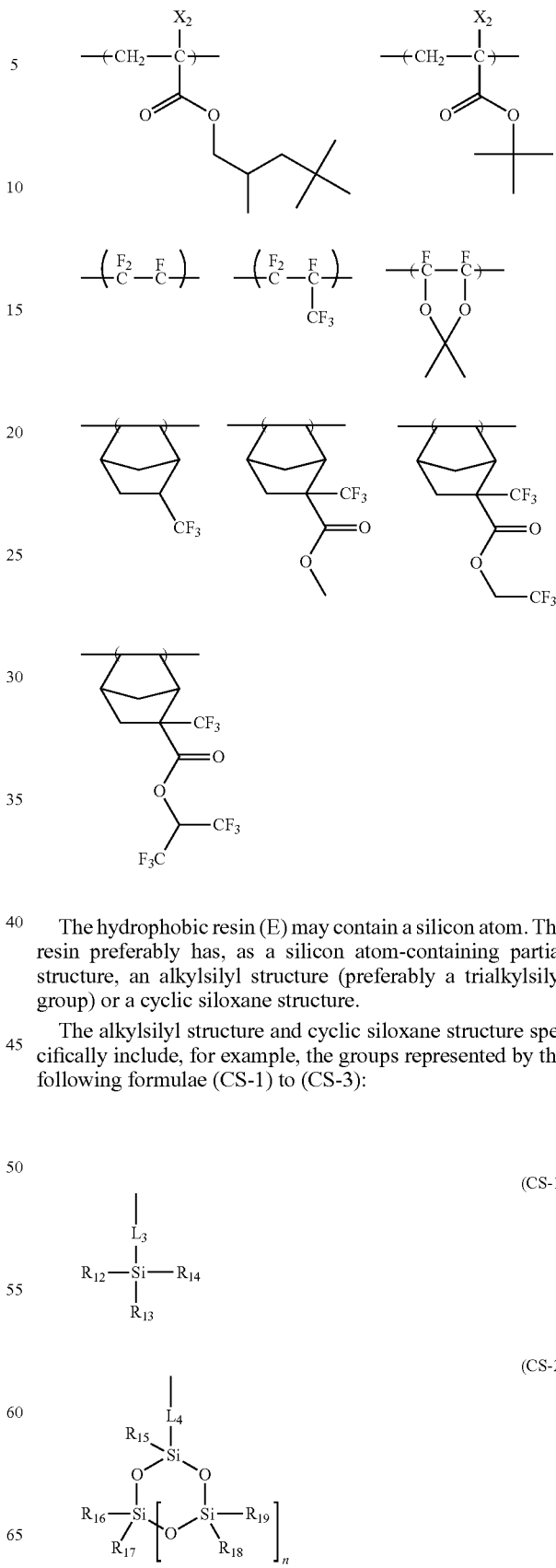

The hydrophobic resin (E) may contain a silicon atom. The resin preferably has, as a silicon atom-containing partial structure, an alkylsilyl structure (preferably a trialkylsilyl group) or a cyclic siloxane structure.

The alkylsilyl structure and cyclic siloxane structure specifically include, for example, the groups represented by the following formulae (CS-1) to (CS-3):

-continued (CS-3)

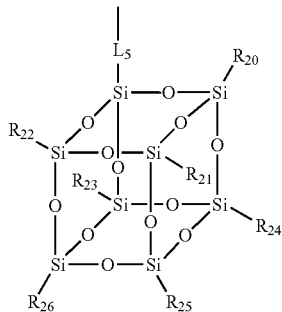

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole group or a combination of two or more groups (the total carbon number is preferably 12 or less), selected from the group consisting of an alkylene group, a phenylene group, an ether bond, a thio-ether bond, a carbonyl group, an ester bond, an amide bond, a urethane bond and a urea bond.

n represents an integer of 1 to 5. n is preferably an integer of 2 to 4.

Specific examples of the repeating unit having a group represented by formulae (CS-1) to (CS-3) are illustrated below, but the present invention is not limited thereto. In specific examples, $X_1$ represents a hydrogen atom, —$CH_3$, —F or —$CF_3$.

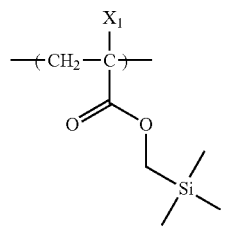
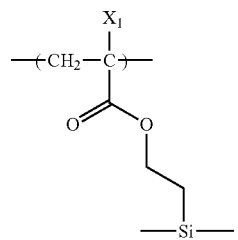
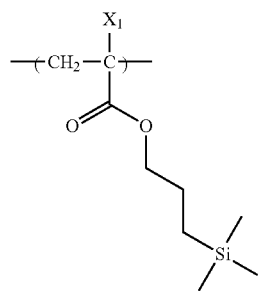
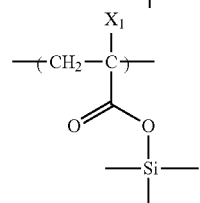
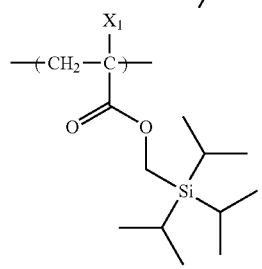

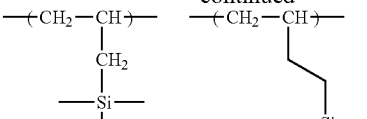
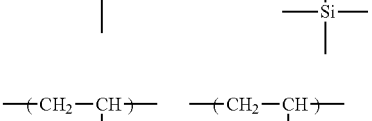
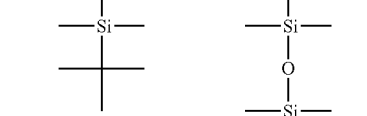
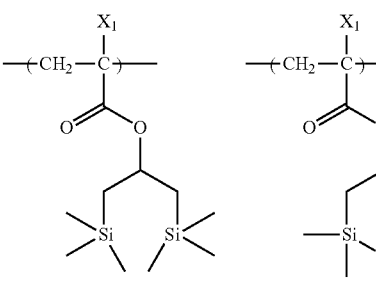
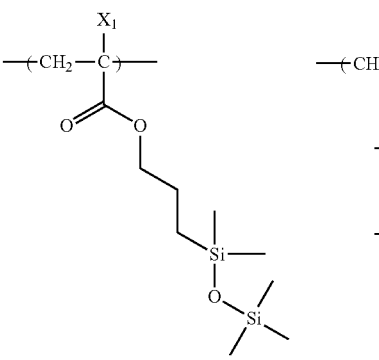
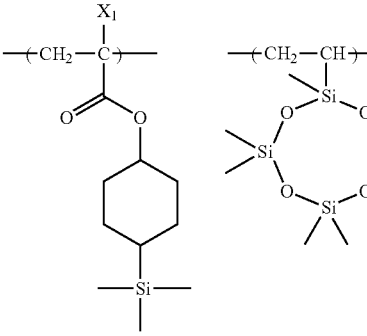
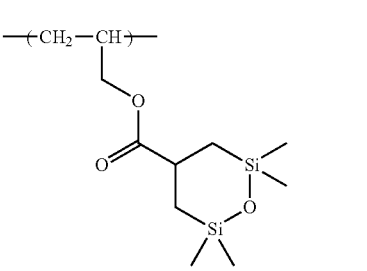

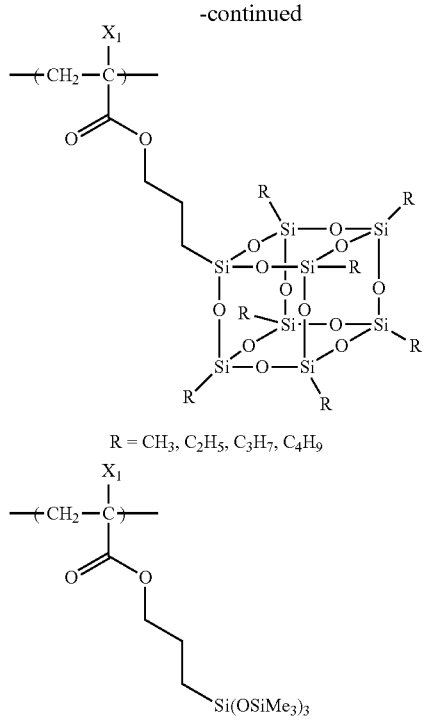

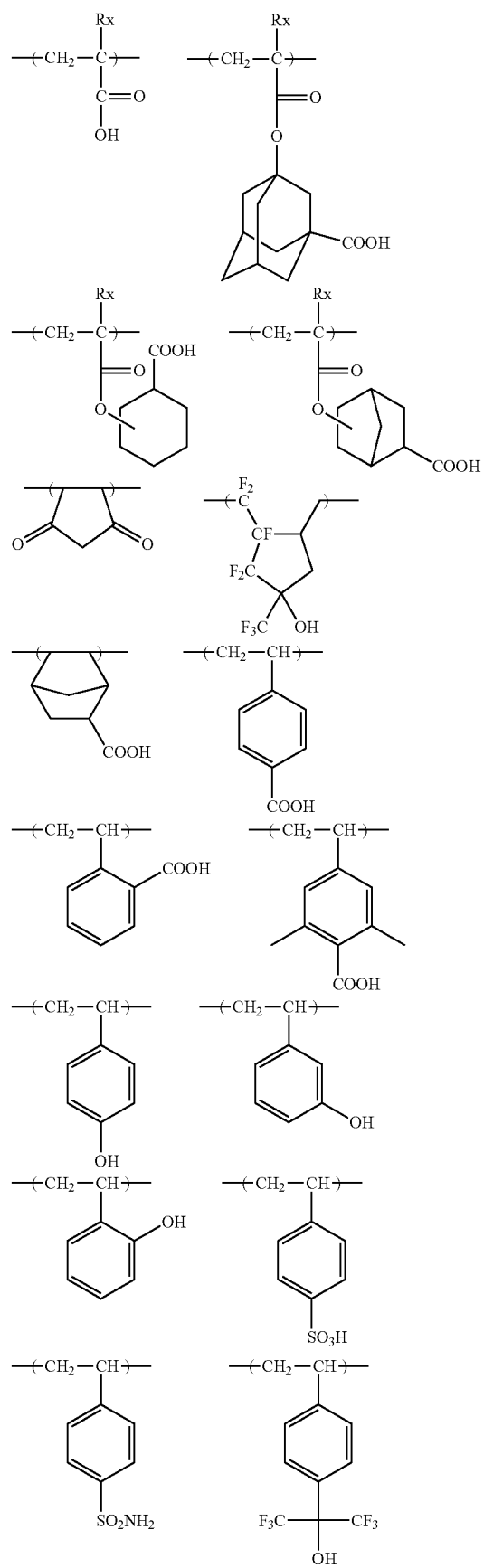

The hydrophobic resin (E) may further contain at least one group selected from the group consisting of the following (x) to (z):
(x) an acid group,
(y) a lactone structure-containing group, an acid anhydride group, or an acid imide group, and
(z) a group capable of decomposing by the action of an acid.

Examples of the (x) acid group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group and a tris(alkylsulfonyl)methylene group.

Preferred acid groups include a fluorinated alcohol group (preferably hexafluoroisopropanol group), a sulfonimide group and a bis(carbonyl)methylene group.

Examples of the repeating unit having (x) an acid group include a repeating unit where an acid group is directly bonded to the main chain of the resin, such as repeating unit by an acrylic acid or a methacrylic acid, and a repeating unit where an acid group is bonded to the main chain of the resin through a linking group. Furthermore, an acid group may be introduced into the terminal of the polymer chain by using an acid group-containing polymerization initiator or chain transfer agent at the polymerization. All of these cases are preferred. The repeating unit having (x) an acid group may have at least either a fluorine atom or a silicon atom.

The content of the repeating unit having (x) an acid group is preferably from 1 to 50 mol %, more preferably from 3 to 35 mol %, still more preferably from 5 to 20 mol %, based on all repeating units in the hydrophobic resin (E).

Specific examples of the repeating unit having (x) an acid group are illustrated below, but the present invention is not limited thereto. In the formulae, Rx represents a hydrogen atom, $CH_3$, $CF_3$ or $CH_2OH$.

-continued

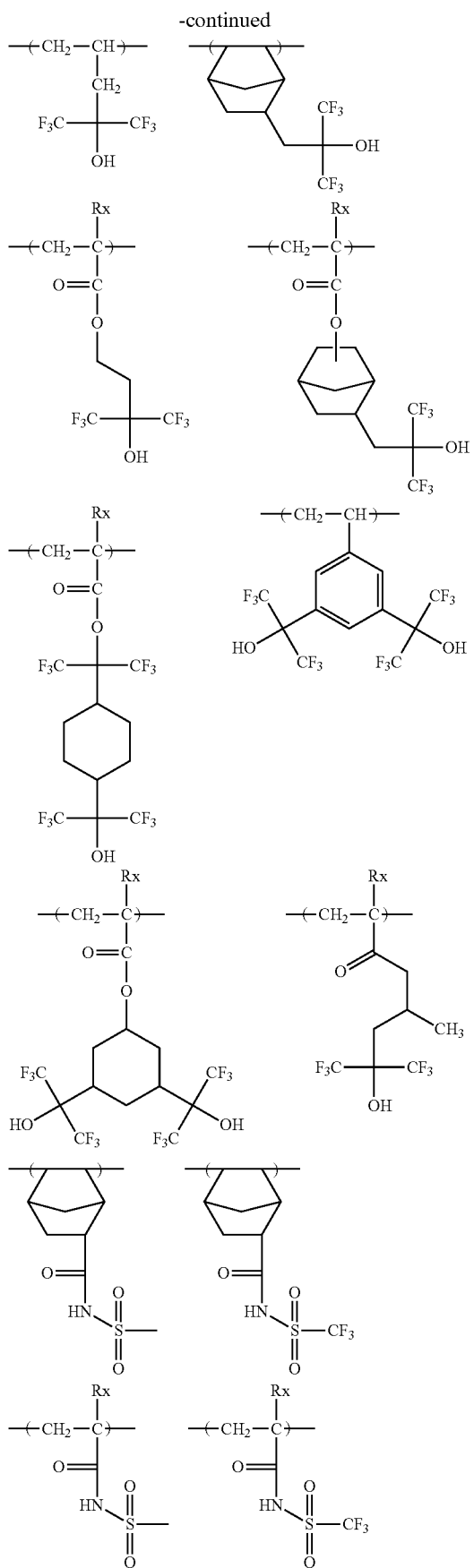
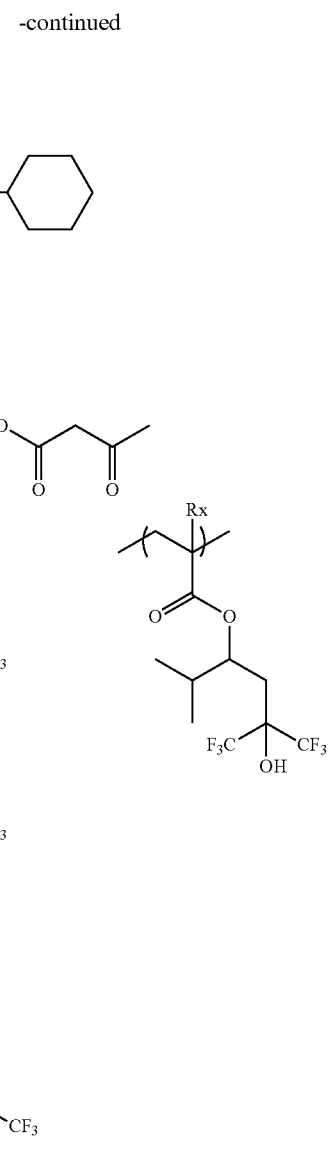

The (y) lactone structure-containing group, acid anhydride group or acid imide group is preferably a lactone structure-containing group.

The repeating unit having such a group is a repeating unit where the group is directly bonded to the main chain of the resin, such as repeating unit by an acrylic acid ester or a methacrylic acid ester. This repeating unit may be also a repeating unit where the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a lactone structure-containing group are the same as those of the repeating unit having a lactone structure described above in the paragraph of the (A) acid-decomposable resin.

The lactone structure-containing group is preferably a group having a partial structure represented by the following formula (KA-1). By virtue of having this structure, enhancement of, for example, the receding contact angle of the immersion liquid is expected.

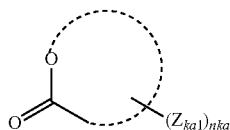

(KA-1)

In formula (KA-1), $Z_{ka1}$ represents an alkyl group, a cycloalkyl group, an ether group, a hydroxy group, an amide group, an aryl group, a lactone ring group or an electron-withdrawing group. In the case where nka is 2 or more, each $Z_{ka1}$ may be the same as or different from every other $Z_{ka1}$ and the plurality of $Z_{ka1}$'s may combine with each other to form a ring. Examples of the ring include a cycloalkyl ring and a heterocyclic ring such as cyclic ether ring and lactone ring.

nka represents an integer of 0 to 10. nka is preferably an integer of 0 to 8, more preferably an integer of 0 to 5, still more preferably an integer of 1 to 4, yet still more preferably an integer of 1 to 3.

Incidentally, the structure represented by formula (KA-1) is a partial structure present in the main chain, side chain, terminal or the like of the resin and is present as a monovalent or higher valent substituent by removing at least one hydrogen atom contained in the structure.

$Z_{ka1}$ is preferably an alkyl group, a cycloalkyl group, an ether group, a hydroxy group or an electron-withdrawing group, more preferably an alkyl group, a cycloalkyl group or an electron-withdrawing group. The ether group is preferably an alkyl ether group or a cycloalkyl ether group.

The alkyl group of $Z_{ka1}$ may be either linear or branched, and the alkyl group may further have a substituent.

The alkyl group of $Z_{ka1}$ is preferably an alkyl group having a carbon number of 1 to 4, such as methyl group, ethyl group, n-propyl group, i-propyl group, n-butyl group, i-butyl group and tert-butyl group.

The cycloalkyl group of $Z_{ka1}$ may be monocyclic or polycyclic. In the latter case, the cycloalkyl group may be of crosslinked type. That is, in this case, the cycloalkyl group may have a bridged structure. Incidentally, a part of carbon atoms in the cycloalkyl group may be substituted with a heteroatom such as oxygen atom.

The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group.

Examples of the polycyclic cycloalkyl group include a group containing a bicyclo, tricyclo or tetracyclo structure having a carbon number of 5 or more. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group and an androstanyl group.

These structures may further have a substituent. Examples of the substituent include an alkyl group, a halogen atom, a hydroxyl group, an alkoxy group, a carboxy group and an alkoxycarbonyl group.

The alkyl group as the substituent is preferably a lower alkyl group such as methyl group, ethyl group, propyl group, isopropyl group and butyl group, more preferably a methyl group, an ethyl group, a propyl group or an isopropyl group.

The alkoxy group as the substituent is preferably an alkoxy group having a carbon number of 1 to 4, such as methoxy group, ethoxy group, propoxy group and butoxy group.

The alkyl group and alkoxy group as the substituent may further have a substituent, and examples of the further substituent include a hydroxyl group, a halogen atom and an alkoxy group (preferably having a carbon number of 1 to 4).

Examples of the aryl group of $Z_{ka1}$ include a phenyl group and a naphthyl group.

Examples of the substituent which the alkyl group, cycloalkyl group and aryl group of $Z_{ka1}$ may further have include a hydroxyl group; a halogen atom; a nitro group; a cyano group; the above-described alkyl group; an alkoxy group such as methoxy group, ethoxy group, hydroxyethoxy group, propoxy group, hydroxypropoxy group, n-butoxy group, isobutoxy group, sec-butoxy group and tert-butoxy group; an alkoxycarbonyl group such as methoxycarbonyl group and ethoxycarbonyl group; an aralkyl group such as benzyl group, phenethyl group and cumyl group; an aralkyloxy group; an acyl group such as formyl group, acetyl group, butyryl group, benzoyl group, cinnamyl group and valeryl group; an acyloxy group such as butyryloxy group; an alkenyl group; an alkenyloxy group such as vinyloxy group, propenyloxy group, allyloxy group and butenyloxy group; the above-described aryl group; an aryloxy group such as phenoxy group; and an aryloxycarbonyl group such as benzoyloxy group.

Examples of the electron-withdrawing group of $Z_{ka1}$ include a halogen atom, a cyano group, an oxy group, a carbonyl group, a carbonyloxy group, an oxycarbonyl group, a nitrile group, a nitro group, a sulfonyl group, a sulfinyl group, a halo(cyclo)alkyl group represented by —C($R_{f1}$)($R_{f2}$)—$R_{f3}$, a haloaryl group, and a combination thereof. The term "halo(cyclo)alkyl group" indicates a (cyclo)alkyl group with at least one hydrogen atom being substituted for by a halogen atom.

The halogen atom of $Z_{ka1}$ includes a fluorine atom, a chlorine atom, a bromine atom and an iodine atom. Among these, a fluorine atom is preferred.

In the halo(cyclo)alkyl group represented by —C($R_{f1}$)($R_{f2}$)—$R_{f3}$, $R_{f1}$ represents a halogen atom, a perhaloalkyl group, a perhalocycloalkyl group or a perhaloaryl group. $R_{f1}$ is preferably a fluorine atom, a perfluoroalkyl group or a perfluorocycloalkyl group, more preferably a fluorine atom or a trifluoromethyl group.

In the halo(cyclo)alkyl group represented by —C($R_{f1}$)($R_{f2}$)—$R_{f3}$, each of $R_{f2}$ and $R_{f3}$ independently represents a hydrogen atom, a halogen atom or an organic group. Examples of the organic group include an alkyl group, a cycloalkyl group and an alkoxy group. These groups may further have a substituent such as halogen atom.

At least two members out of $R_{f1}$ to $R_{f3}$ may combine with each other to form a ring. Examples of the ring include a cycloalkyl ring, a halocycloalkyl ring, an aryl ring and a haloaryl ring.

Examples of the alkyl group and haloalkyl group of $R_{f1}$ to $R_{f3}$ include the alkyl groups described above for $Z_{ka1}$ and groups where at least a part of hydrogen atoms in such an alkyl group is substituted for by a halogen atom.

Examples of the halocycloalkyl group and haloaryl group include groups where at least a part of hydrogen atoms in the cycloalkyl group or aryl group described above for $Z_{ka1}$ is substituted for by a halogen atom. More preferred examples of the halocycloalkyl group and haloaryl group include a fluorocycloalkyl group represented by —$C_{(n)}F_{(2n-2)}H$ and a perfluoroaryl group. Here, the range of carbon number n is not particularly limited, but n is preferably an integer of 5 to 13, and n is more preferably 6.

$R_{f2}$ is preferably the same group as $R_{f1}$ or combines with $R_{f3}$ to form a ring.

The electron-withdrawing group is preferably a halogen atom, a halo(cyclo)alkyl group or a haloaryl group.

In the electron-withdrawing group, a part of fluorine atoms may be substituted for by an electron-withdrawing group except for fluorine atom.

Incidentally, when the electron-withdrawing group is a divalent or higher valent group, the remaining bond is used for bonding to an arbitrary atom or substituent. In this case, the partial structure above may be bonded to the main chain of the hydrophobic resin through a further substituent.

Out of the structures represented by formula (KA-1), a structure represented by the following formula (KY-1) is preferred.

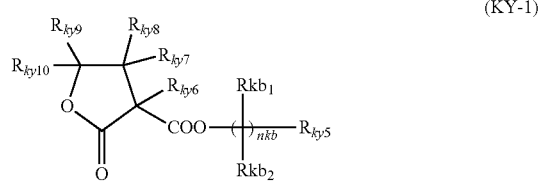

(KY-1)

In formula (KY-1), each of $R_{ky6}$ to $R_{ky10}$ independently represents a hydrogen atom, a halogen atom, an alkyl group, a cycloalkyl group, a carbonyl group, a carbonyloxy group, an oxycarbonyl group, an ether group, a hydroxy group, a cyano group, an amide group or an aryl group. At least two members out of $R_{ky6}$ to $R_{ky10}$ may combine with each other to form a ring.

$R_{ky5}$ represents an electron-withdrawing group. Examples of the electron-withdrawing group are the same as those for $Z_{ka1}$ in formula (KA-1). The electron-withdrawing group is preferably a halogen atom, a halo(cyclo)alkyl represented by —C($R^{f1}$)($R_{f2}$)—$R_{f3}$, or a haloaryl group. Specific examples of these groups are the same as specific examples in formula (KA-1).

nkb represents 0 or 1.

Each of $R_{kb1}$ and $R_{kb2}$ independently represents a hydrogen atom, an alkyl group, a cycloalkyl group, an aryl group or an electron-withdrawing group. Specific examples of these atomic groups are the same as those for $Z_{ka1}$ in formula (KA-1).

The structure represented by formula (KY-1) is more preferably a structure represented by the following formula (KY-1-1).

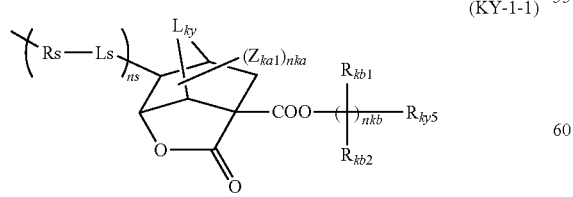

(KY-1-1)

In formula (KY-1-1), $Z_{ka1}$ and nka have the same meanings as those in formula (KA-1). $R_{ky5}$, $R_{kb1}$, $R_{kb2}$ and nkb have the same meaning as those in formula (KY-1).

$L_{ky}$ represents an alkylene group, an oxygen atom or a sulfur atom. Examples of the alkylene group of $L_{ky}$ include a methylene group and an ethylene group. $L_{ky}$ is preferably an oxygen atom or a methylene group, more preferably a methylene group.

Ls represents a single bond, an ether bond, an ester bond, an amide bond, a urethane bond or a urea bond, and when a plurality of Ls's are present, each Ls may be the same as or different from every other Ls.

Rs represents, when ns is 2 or more, each independently represents, an alkylene group or a cycloalkylene group. When ns is 2 or more, each Rs may be the same as or different from every other Rs.

ns is the repetition number of the linking group represented by —(Rs-Ls)- and represents an integer of 0 to 5.

Specific preferred examples of the repeating unit having a structure represented by formula (KA-1) are illustrated below, but the present invention is not limited thereto. Ra represents a hydrogen atom, a fluorine atom, a methyl group or a trifluoromethyl group.

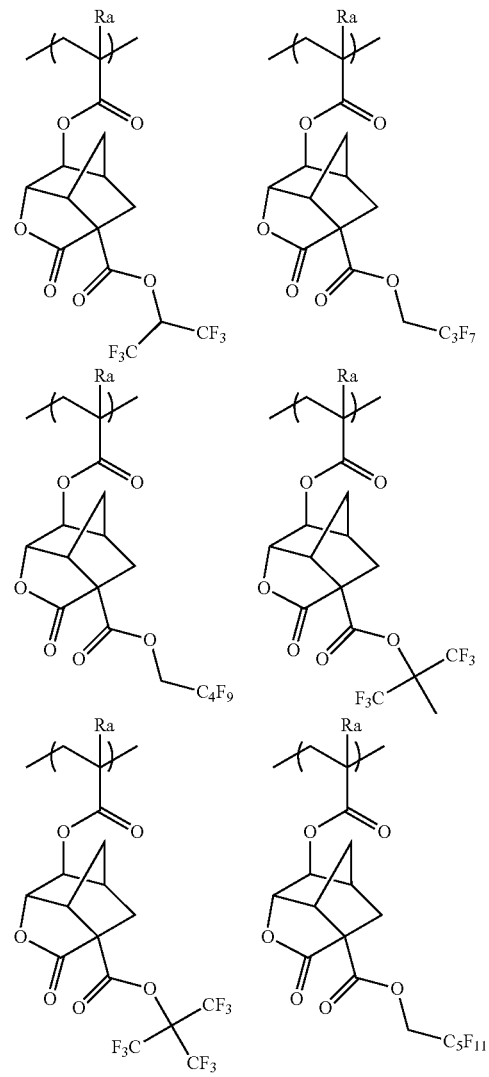

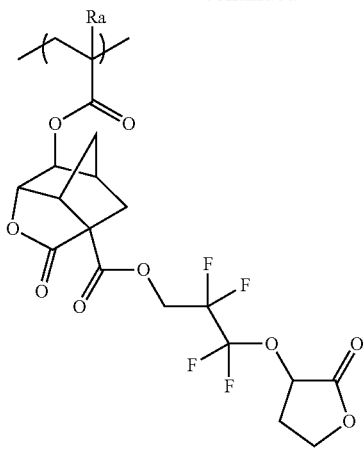
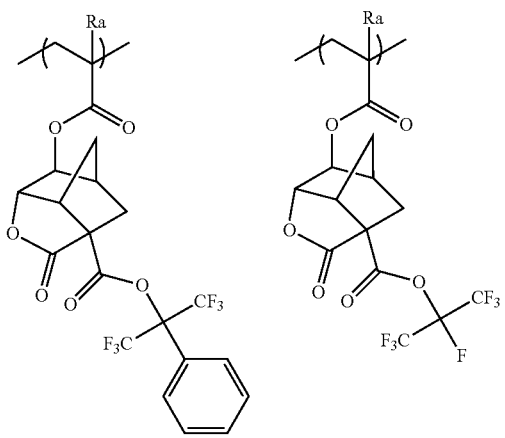
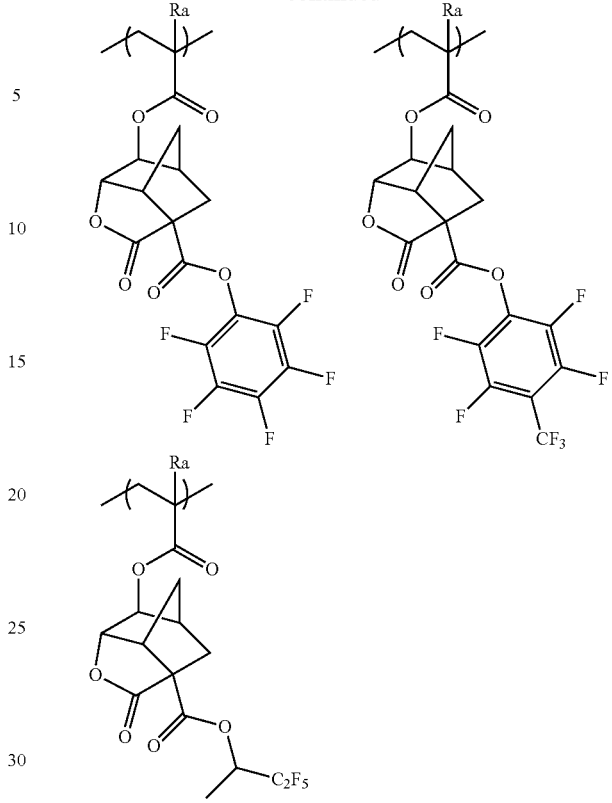
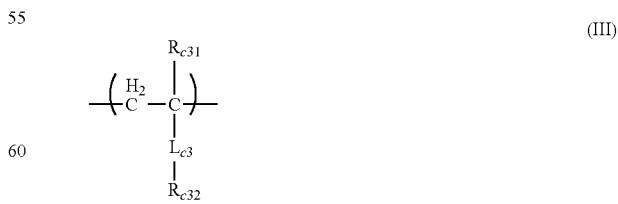

The content of the repeating unit having a lactone structure-containing group, an acid anhydride group or an acid imide group is preferably from 1 to 100 mol %, more preferably from 3 to 98 mol %, still more preferably from 5 to 95 mol %, based on all repeating units in the hydrophobic resin.

Examples of the repeating unit having (z) a group capable of decomposing by the action of an acid, which is contained in the hydrophobic resin (E), are the same as those of the repeating unit having an acid-decomposable group described for the resin (A). The repeating unit having (z) a group capable of decomposing by the action of an acid may contain at least either a fluorine atom or a silicon atom. The content of the repeating unit having (z) a group capable of decomposing by the action of an acid, in the hydrophobic resin (E), is preferably from 1 to 80 mol %, more preferably from 10 to 80 mol %, still more preferably from 20 to 60 mol %, based on all repeating units in the resin (E).

The hydrophobic resin (E) may further contain a repeating unit represented by the following formula (III):

(III)

$$\left(\begin{matrix} H_2 \\ C \end{matrix} - \begin{matrix} R_{c31} \\ | \\ C \\ | \\ L_{c3} \\ | \\ R_{c32} \end{matrix}\right)$$

In formula (III), $R_{c31}$ represents a hydrogen atom, an alkyl group, an alkyl group which may be substituted with a fluorine atom, a cyano group, or a —CH$_2$—O—Rac$_2$ group, wherein Rac$_2$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a fluorine atom or a silicon atom-containing group.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably a phenyl group or a naphthyl group, which are an aryl group having a carbon number of 6 to 20, and these groups may have a substituent.

$R_{c32}$ is preferably an unsubstituted alkyl group or an alkyl group with a fluorine atom.

The divalent linking group of $L_{c3}$ is preferably an alkylene group (preferably having a carbon number of 1 to 5), an ether bond, a phenylene group or an ester bond (a group represented by —COO—).

The content of the repeating unit represented by formula (III) is preferably from 1 to 100 mol %, more preferably from 10 to 90 mol %, still more preferably from 30 to 70 mol %, based on all repeating units in the hydrophobic resin.

It is also preferred that the hydrophobic resin (E) further contains a repeating unit represented by the following formula (CII-AB):

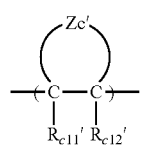

(CII-AB)

In formula (CII-AB), each of $R_{c11}'$ and $R_{c12}'$ independently represents a hydrogen atom, a cyano group, a halogen atom or an alkyl group.

$Z_c'$ represents an atomic group for forming an alicyclic structure containing two carbon atoms (C—C) to which bonded.

The content of the repeating unit represented by formula (CII-AB) is preferably from 1 to 100 mol %, more preferably from 10 to 90 mol %, still more preferably from 30 to 70 mol %, based on all repeating units in the hydrophobic resin.

Specific examples of the repeating units represented by formulae (III) and (CII-AB) are illustrated below, but the present invention is not limited thereto. In the formulae, Ra represents H, $CH_3$, $CH_2OH$, $CF_3$ or CN.

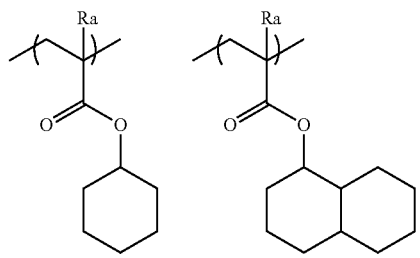

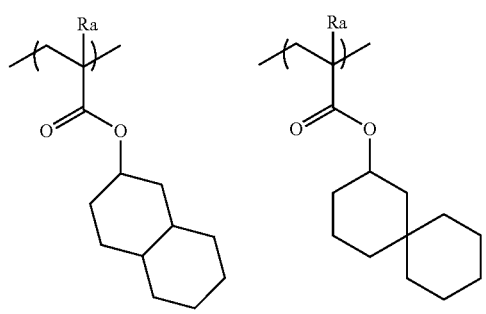

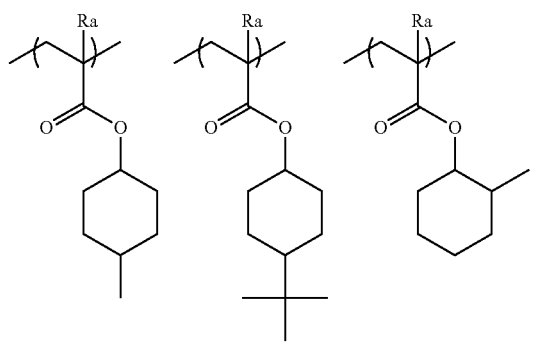

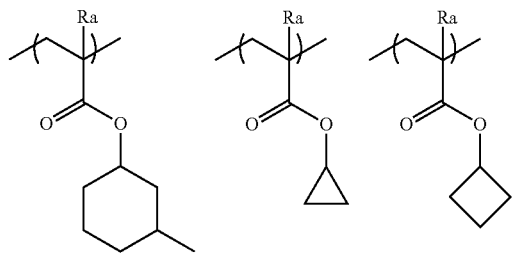

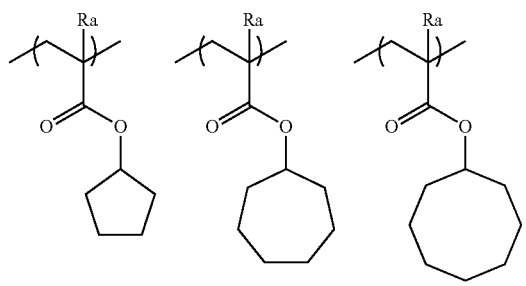

-continued

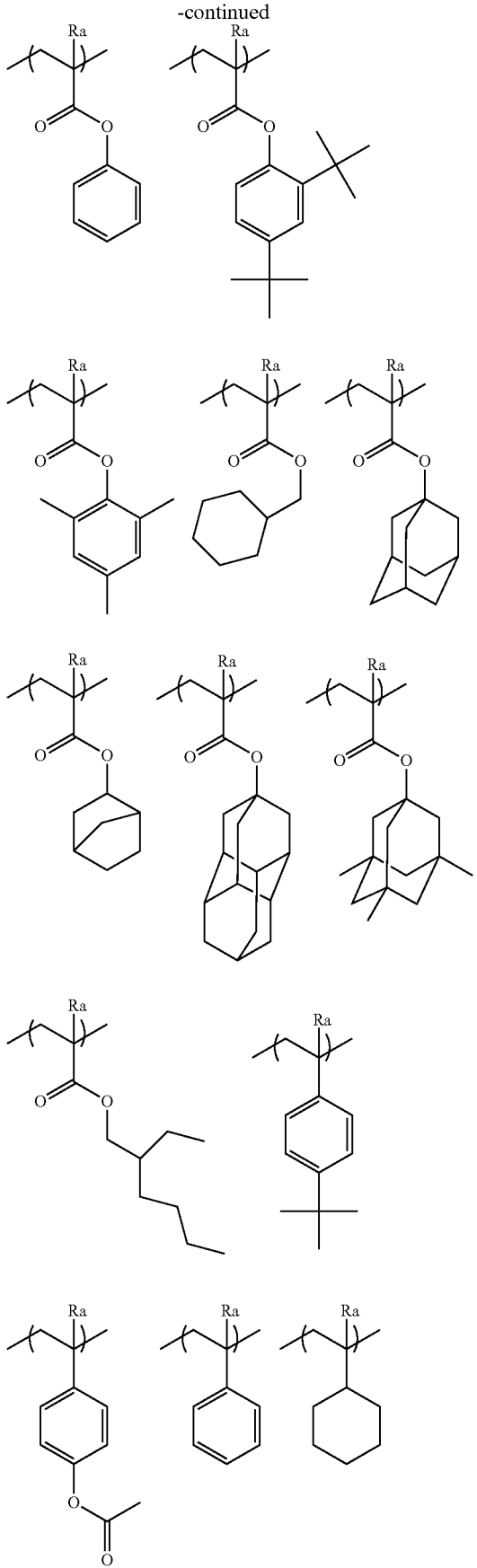

-continued

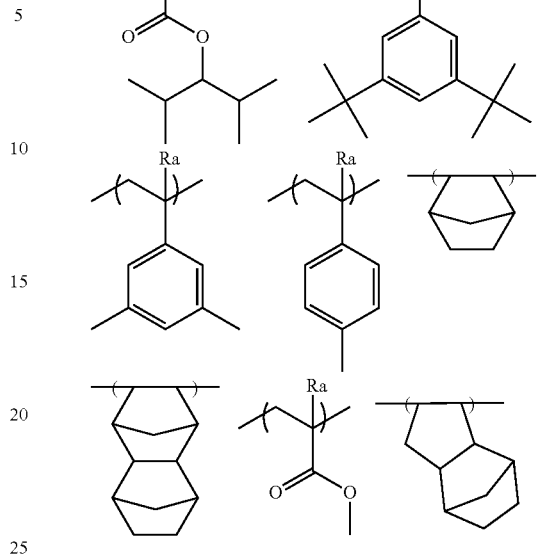

In the case where the hydrophobic resin (E) contains a fluorine atom, the fluorine atom content is preferably from 5 to 80 mass %, more preferably from 10 to 80 mass %, based on the weight average molecular weight of the hydrophobic resin (E). Also, the fluorine atom-containing repeating unit preferably accounts for 10 to 100 mol %, more preferably from 30 to 100 mol %, in the hydrophobic resin (E).

In the case where the hydrophobic resin (E) contains a silicon atom, the silicon atom content is preferably from 2 to 50 mass %, more preferably from 2 to 30 mass %, based on the weight average molecular weight of the hydrophobic resin (E). Also, the silicon atom-containing repeating unit preferably accounts for 10 to 100 mol %, more preferably from 20 to 100 mol %, in the hydrophobic resin (E).

The weight average molecular weight of the hydrophobic resin (E) is preferably from 1,000 to 100,000, more preferably from 1,000 to 50,000, still more preferably from 2,000 to 15,000, in terms of standard polystyrene.

As for the hydrophobic resin (E), one kind of a resin may be used, or a plurality of kinds of resins may be used in combination.

The content of the hydrophobic resin (E) in the composition is preferably from 0.01 to 10 mass %, more preferably from 0.05 to 8 mass %, still more preferably from 0.1 to 5 mass %, based on the entire solid content in the composition of the present invention.

In the hydrophobic resin (E), similarly to the resin (A), it is of course preferred that the content of impurities such as metal is small, but also, the content of residual monomers or oligomer components is preferably from 0.01 to 5 mass %, more preferably from 0.01 to 3 mass %, still more preferably from 0.05 to 1 mass %. When these conditions are satisfied, a resist composition free from extraneous substances in liquid or changes with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As for the hydrophobic resin (E), various commercially available products may be used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (e.g., temperature, concentration) and the purification method after reaction are the same as those described for the resin (A), but in the synthesis of the hydrophobic resin (E), the concentration during reaction is preferably from 30 to 50 mass %.

Specific examples of the hydrophobic resin (E) are illustrated below. Also, the molar ratio of repeating units (corresponding to repeating units starting from the left), weight average molecular weight and polydispersity of each resin are shown in Tables 1 and 2 later.

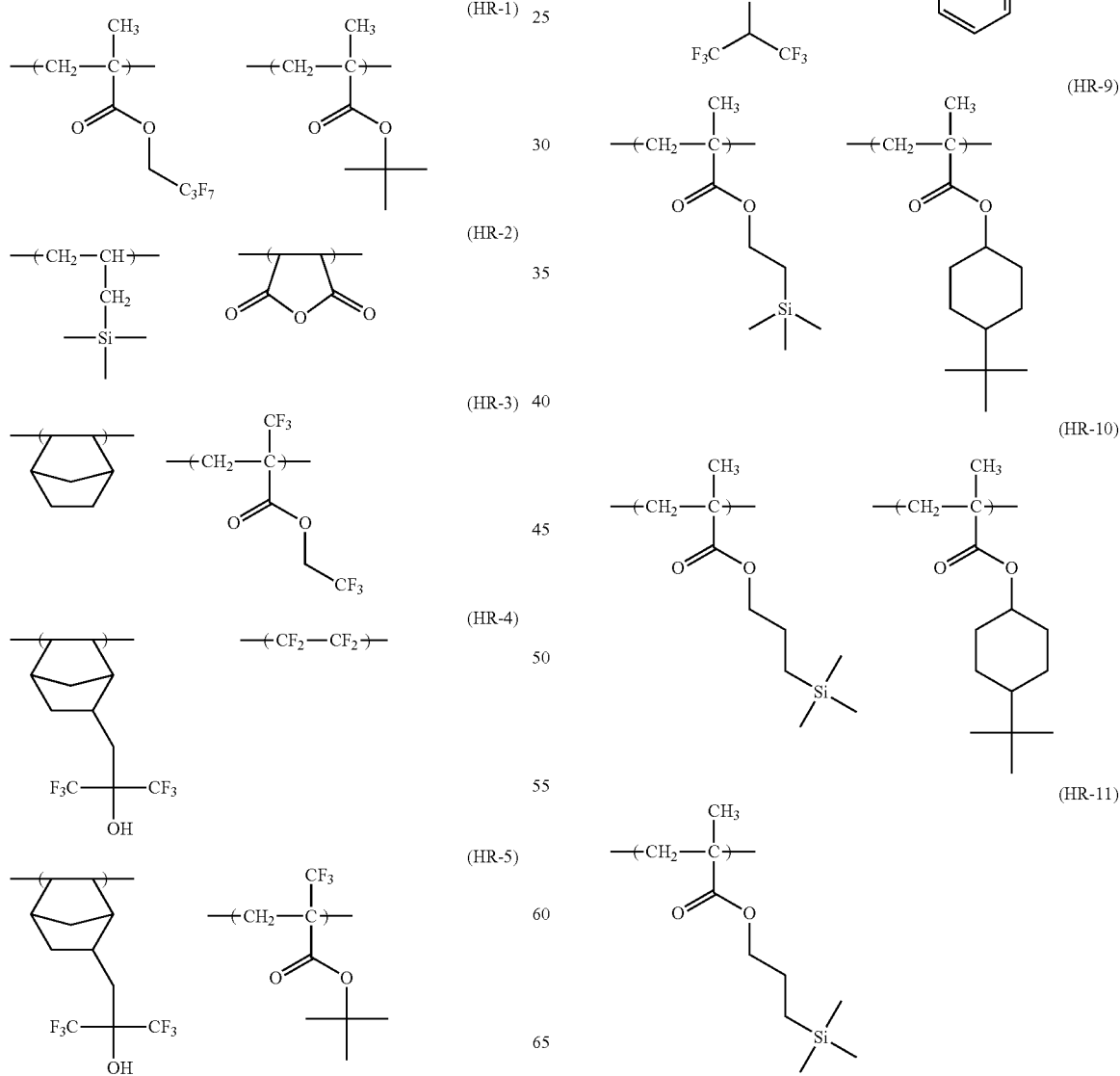

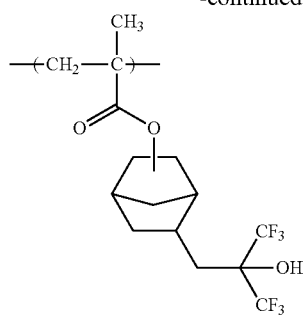
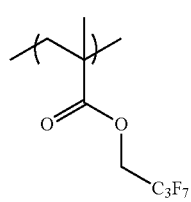 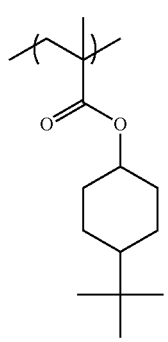
(HR-12)
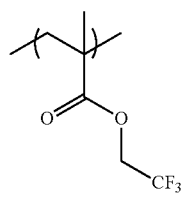 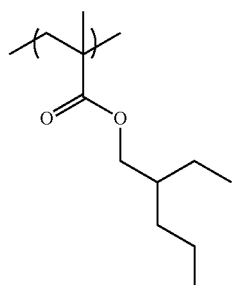
(HR-13)
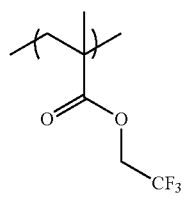 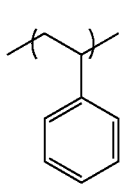
(HR-14)
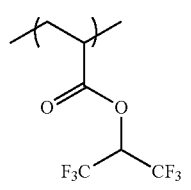
(HR-15)
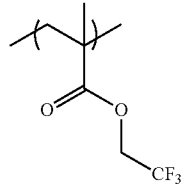
(HR-16)
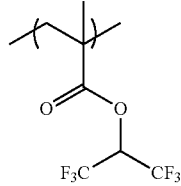 (H1-17)
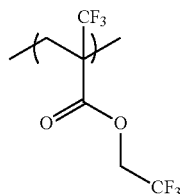 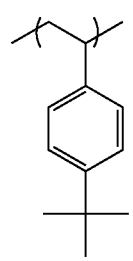 (HR-18)
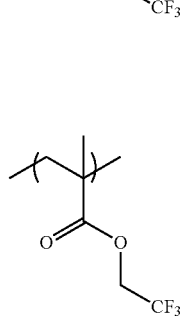 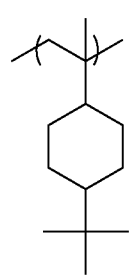 (HR-19)
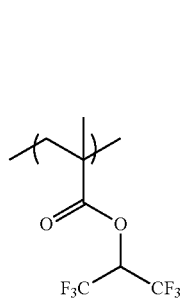 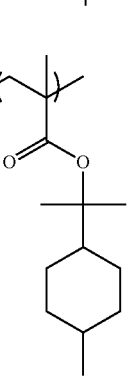 (HR-20)
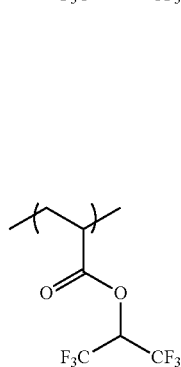 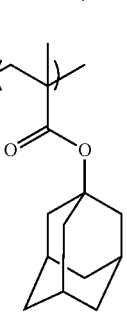 (HR-21)
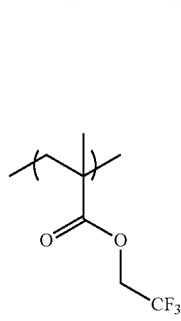 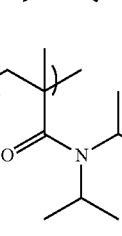 (HR-22)

(HR-23) 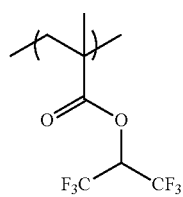 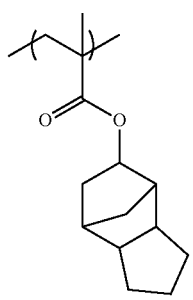
(HR-24) 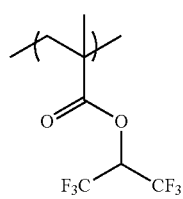 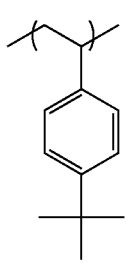
(HR-25) 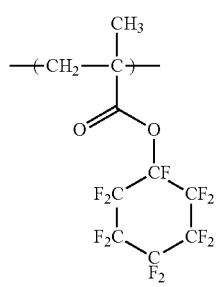 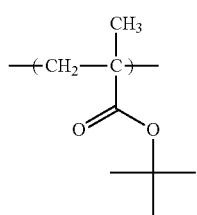
(HR-26) 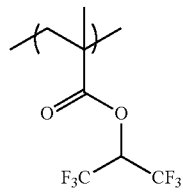 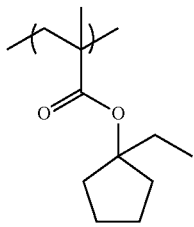
(HR-27) 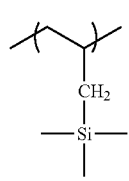 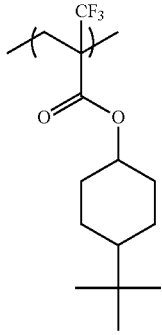
(HR-28) 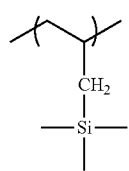 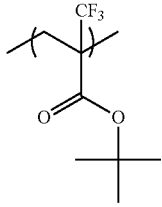
(HR-29) 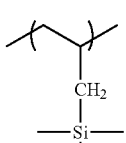 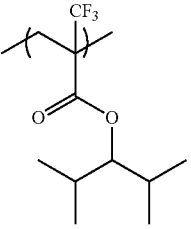
(HR-30) 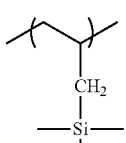 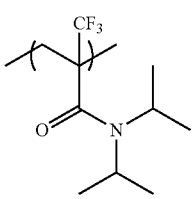
(HR-31) 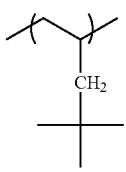 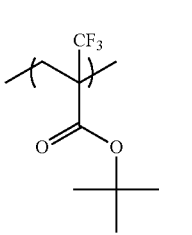
(HR-32) 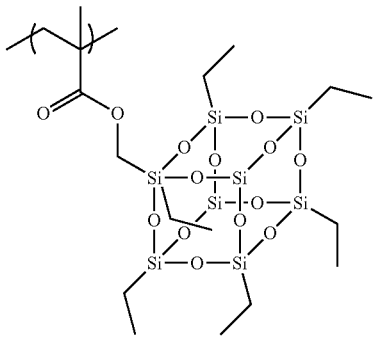
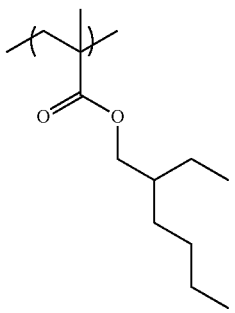
(HR-33) 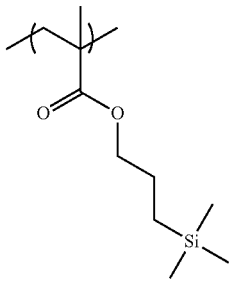 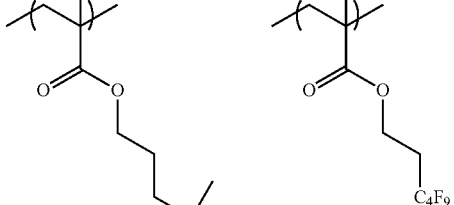

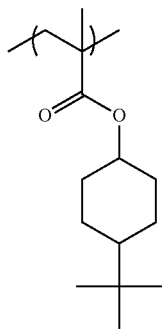
(HR-34)
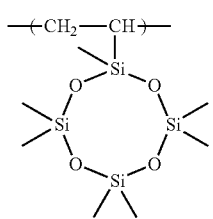
(HR-35)
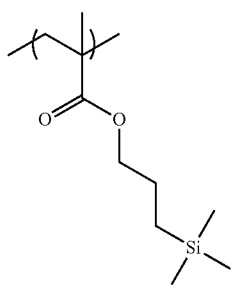
(HR-36)
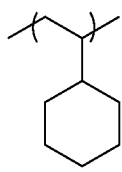
(HR-37)
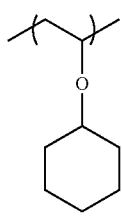
(HR-38)
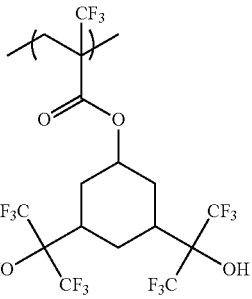 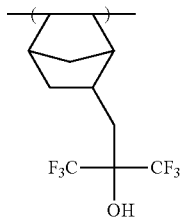
(HR-39)
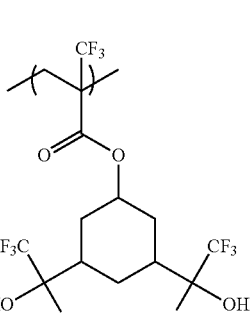 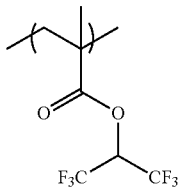
(HR-40)
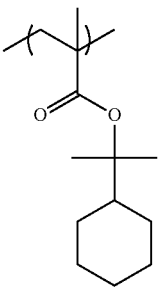 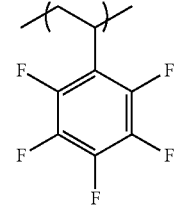
(HR-41)
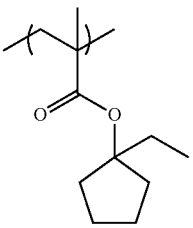 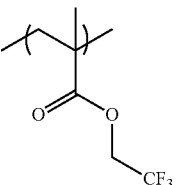
(HR-42)
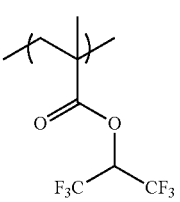 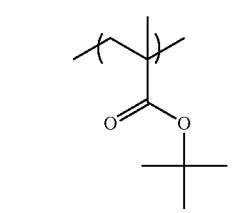
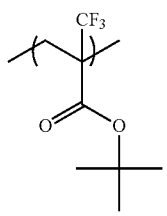
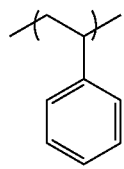
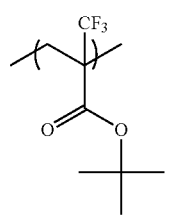

(HR-43) 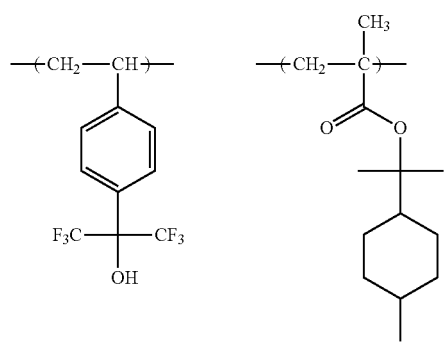
(HR-44) 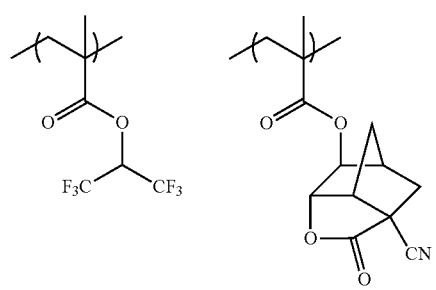
(HR-45) 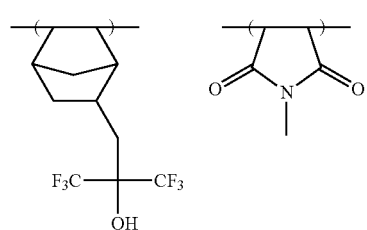
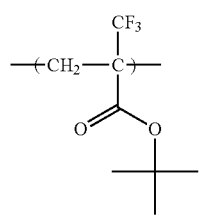
(HR-46) 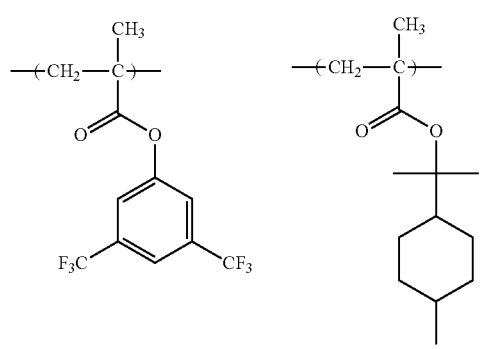
(HR-47) 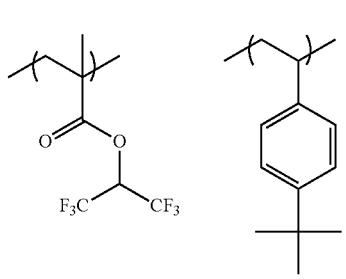
(HR-48) 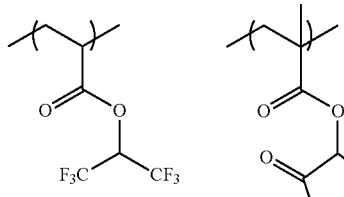
(HR-49) 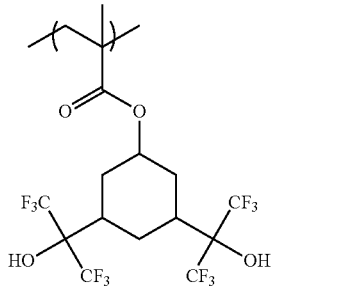
(HR-50) 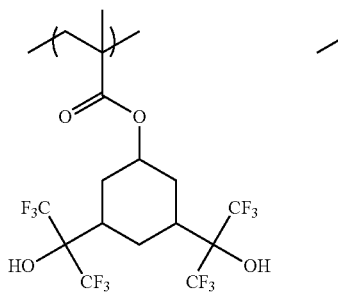
(HR-51) 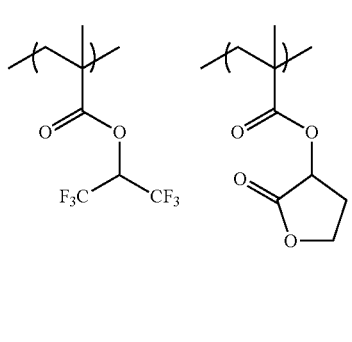

(HR-52)
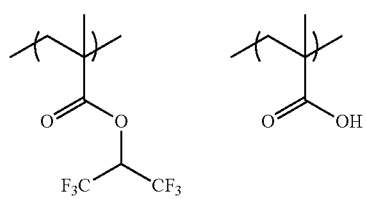
(HR-53)
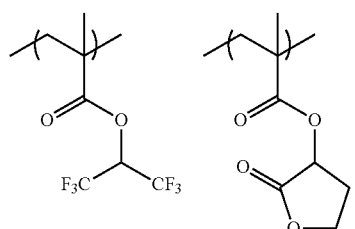
(HR-54)
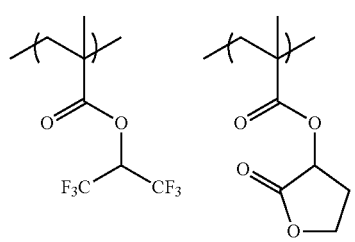
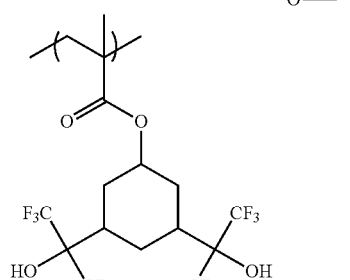
(HR-55)
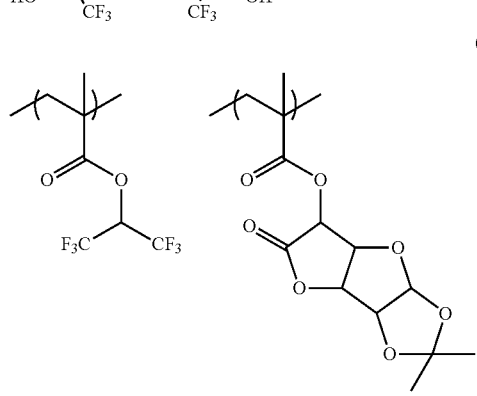
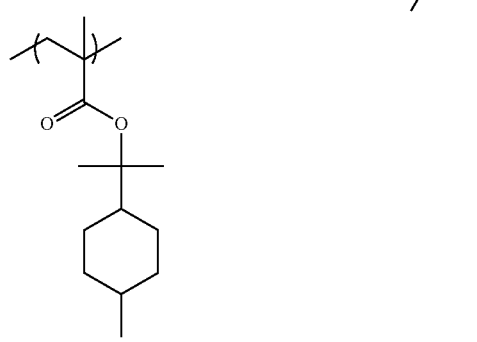
(HR-56)
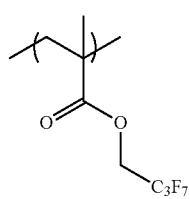
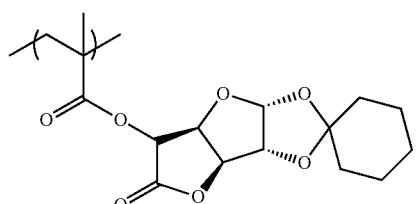
(HR-57)
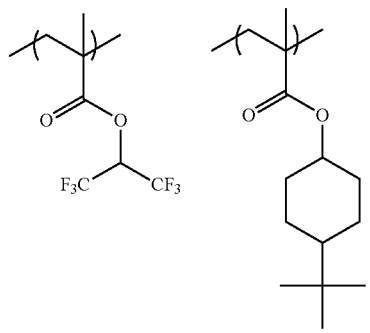
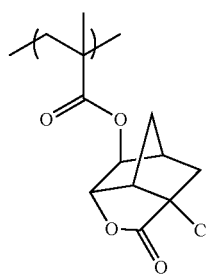
(HR-58)
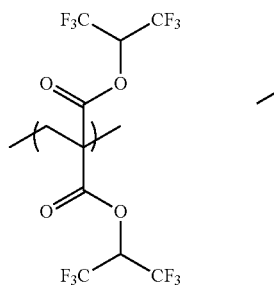
(HR-59)
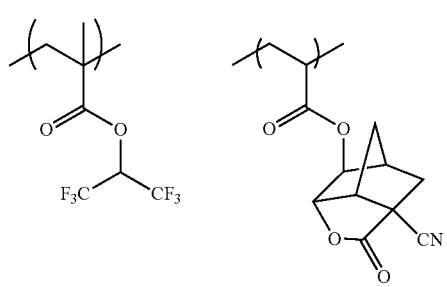

(HR-60)
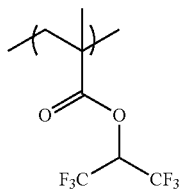 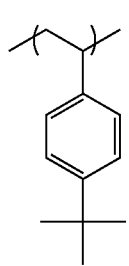
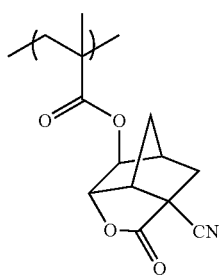 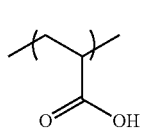
(HR-61)
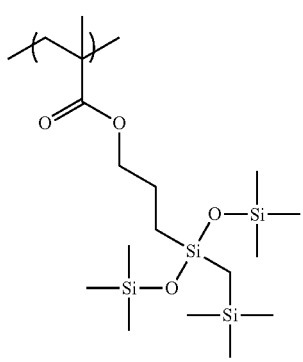
(HR-62)
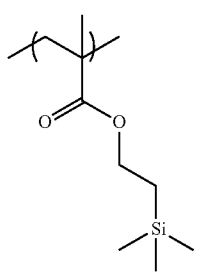 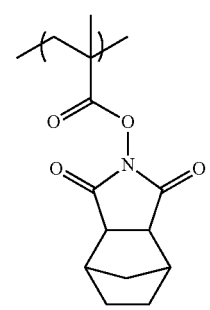
(HR-63)
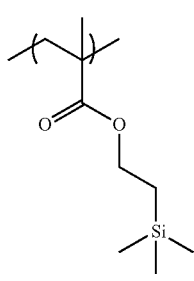 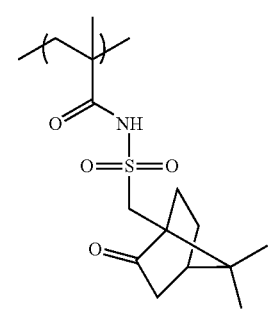
(HR-64)
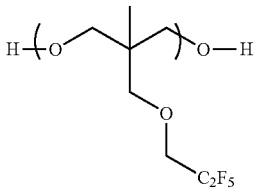
(HR-65)
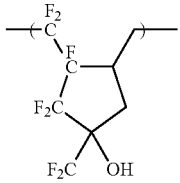
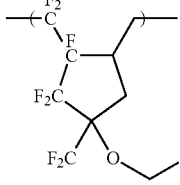
(HR-66)
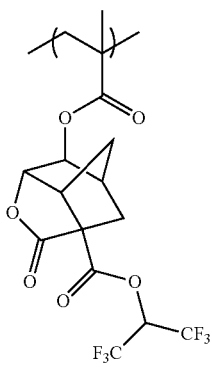
(HR-67)
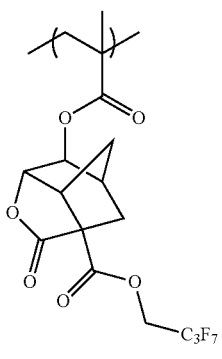
(HR-68)
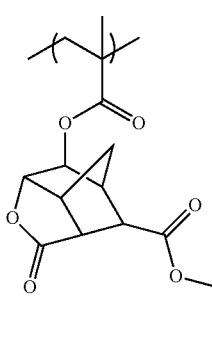

145
-continued
(HR-69)
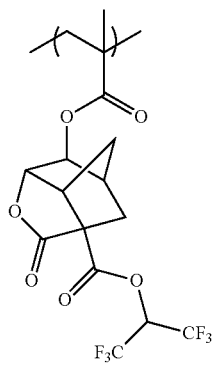 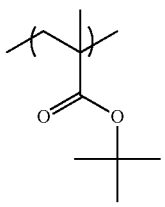
(HR-70)
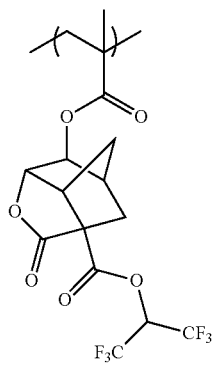
(HR-71)
(HR-72)
146
-continued
(HR-73)
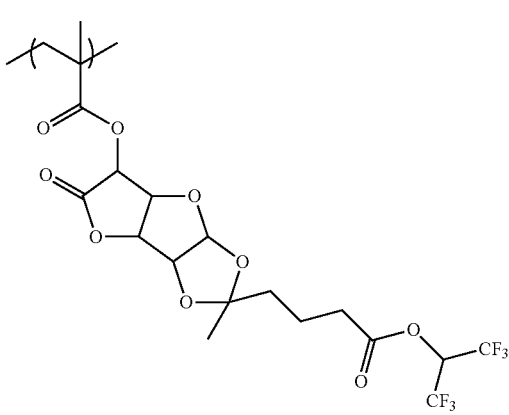
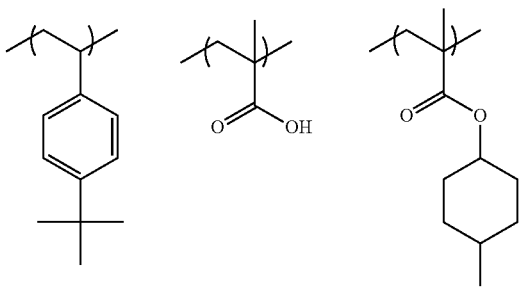
(HR-74)
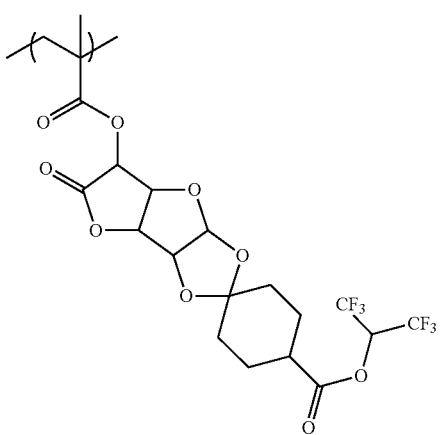
(HR-75)
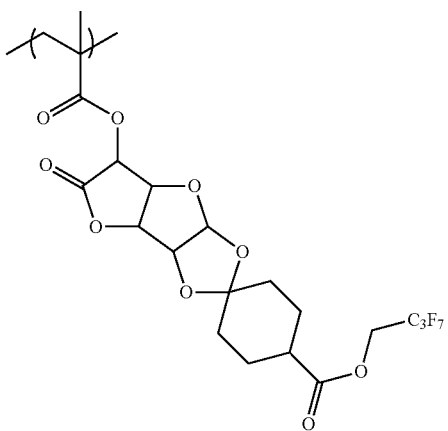

(HR-76)
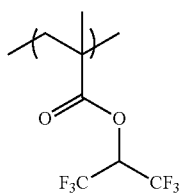
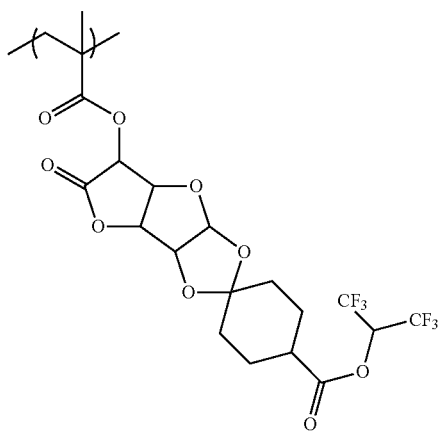
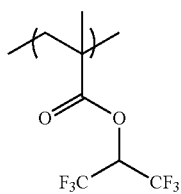
(HR-77)
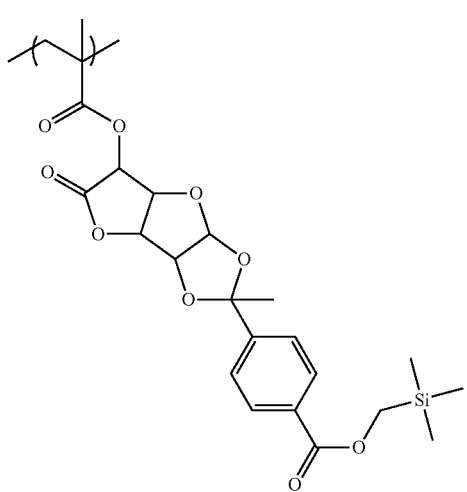
(HR-78)
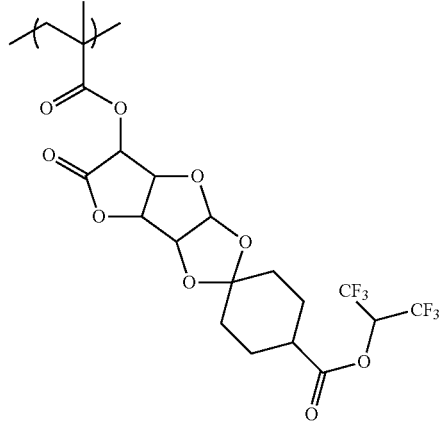
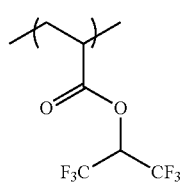
(HR-79)
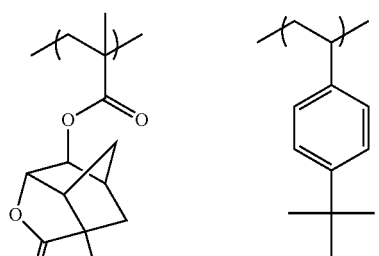
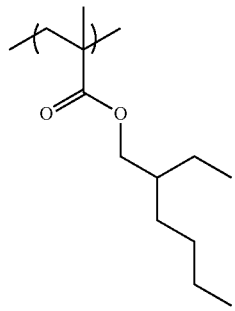
(HR-80)
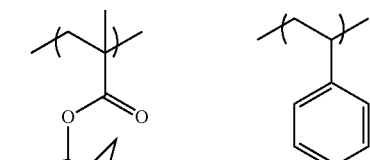
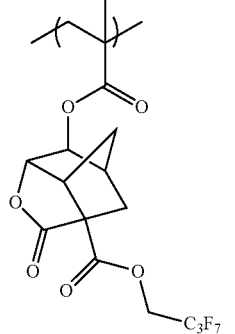

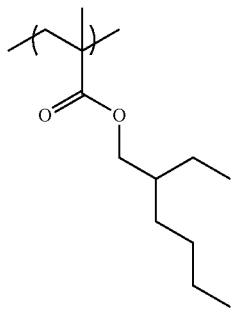
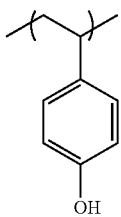
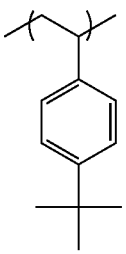
(HR-80)
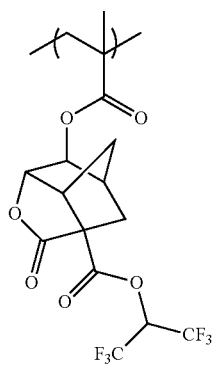
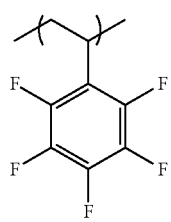
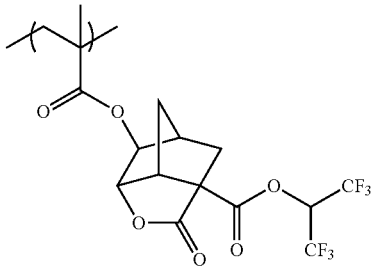
(HR-82)
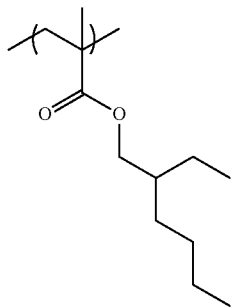
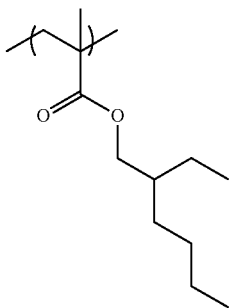
(HR-83)
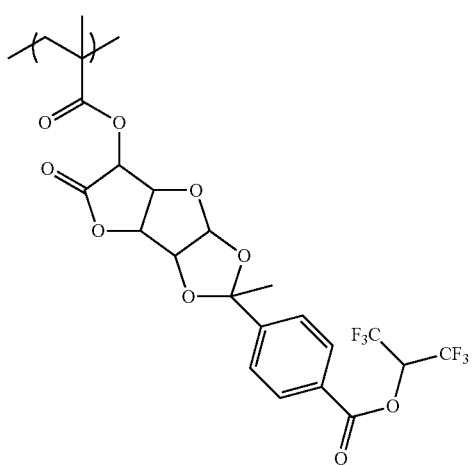
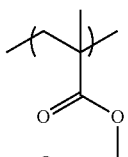
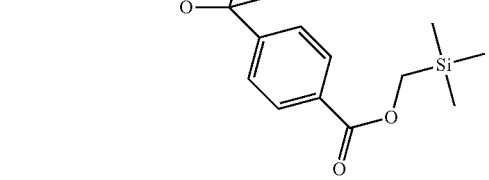
(HR-84)
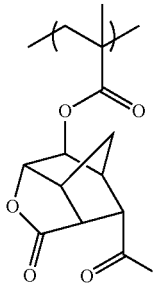
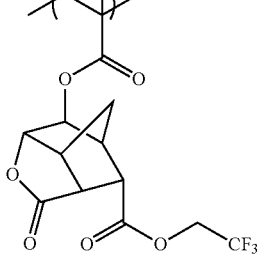
(HR-85)

-continued
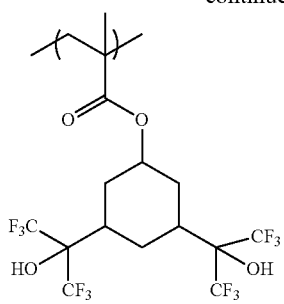
(HR-86)
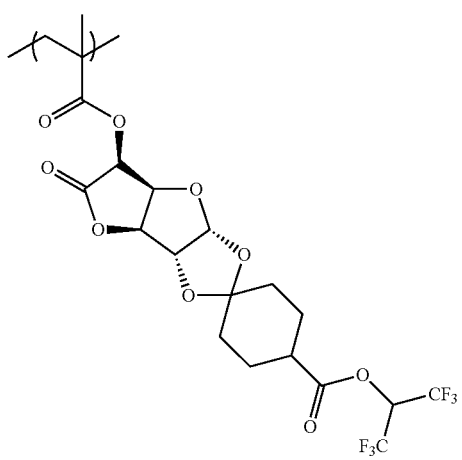
(HR-87)
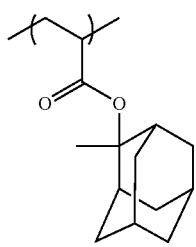
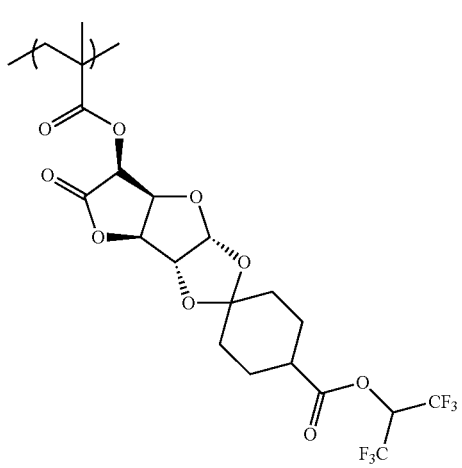
-continued
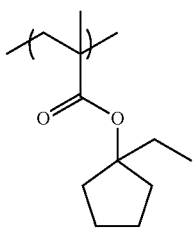
(HR-88)
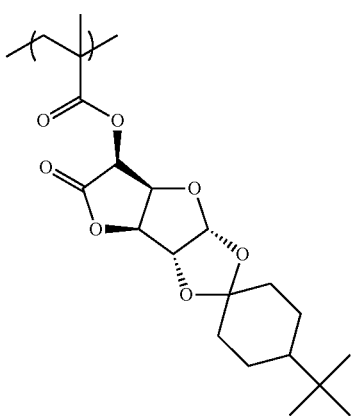
(HR-89)
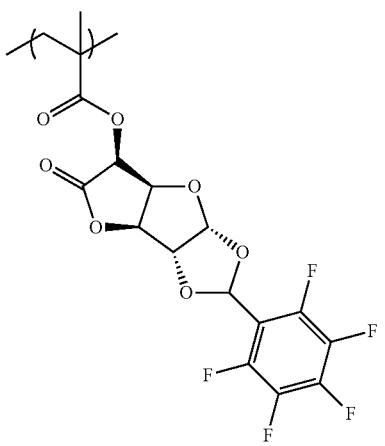
(HR-90)
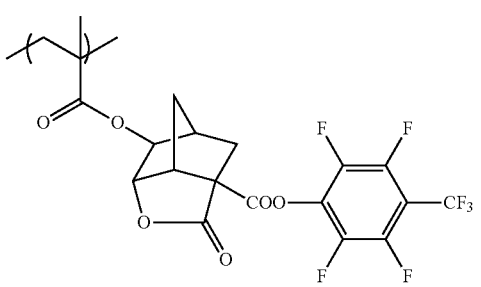

-continued

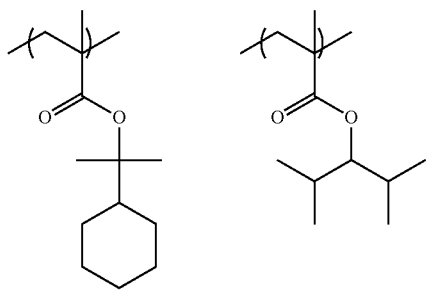

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |

TABLE 1-continued

| Resin | Composition | Mw | Mw/Mn |
|---|---|---|---|
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[6] (F) Basic Compound

The resist composition of the present invention preferably contains (F) a basic compound so as to reduce the change of performance with aging from exposure to heating.

The basic compound is preferably a compound having a structure represented by the following formulae (A) to (E):

(A)

(B)

(C)

(D)

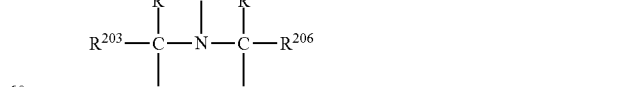

(E)

In formulae (A) to (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine together to form a ring. Each of $R^{203}$, $R^{204}$, $R^{205}$ and $R^{206}$, which may be the same or different, represents an alkyl group having a carbon number of 1 to 20.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A) and (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, benzimidazole and 2-phenylbenzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide, and a 2-oxoalkyl group-containing sulfonium hydroxide, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure becomes a carboxylate, and examples thereof include an acetate, an adamantane-1-carboxylate and a perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine, tris(methoxyethoxyethyl)amine and N-phenyldiethanolamine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom. Also, an oxygen atom is preferably contained in the alkyl chain to form an oxyalkylene group. The number of oxyalkylene groups within the molecule is 1 or more, preferably from 3 to 9, more preferably from 4 to 6. Among oxyalkylene groups, structures of —$CH_2CH_2O$—, —$CH(CH_3)CH_2O$— and —$CH_2CH_2CH_2O$— are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in [0066] of U.S. Patent Application Publication 2007/0224539. One of these basic compounds may be used alone, or two or more thereof may be used in combination.

The amount of the basic compound used is usually from 0.001 to 10 mass %, preferably from 0.01 to 5 mass %, based on the solid content of the resist composition.

The ratio between the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

[7] (G) Surfactant

The resist composition of the present invention may or may not further contain a surfactant and in the case of containing a surfactant, it is preferred to contain any one of fluorine-containing and/or silicon-containing surfactants (a fluorine-containing surfactant, a silicon-containing surfactant or a surfactant containing both a fluorine atom and a silicon atom), or two or more thereof.

By virtue of containing a surfactant, the resist composition of the present invention can give a resist pattern with good sensitivity, resolution and adherence as well as little development defect when used for exposure to a light source of 250 nm or less, particularly 220 nm or less.

Examples of the fluorine-containing and/or silicon-containing surfactants include the surfactants described in paragraph [0276] of U.S. Patent Application Publication 2008/0248425, such as EFtop EF301 and EF303 (produced by Shin-Akita Kasei K. K.); Florad FC430, 431 and 4430 (produced by Sumitomo 3M Inc.); Megaface F171, F173, F176, F189, F113, F110, F177, F120 and $R^{08}$ (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, polysiloxane polymer KP-341 (produced by Shin-Etsu Chemical Co., Ltd.) may be also used as the silicon-containing surfactant.

As for the surfactant, other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the surfactant coming under this type include Megaface F178, F-470, F-473, F-475, F-476 and F-472 (produced by Dainippon Ink & Chemicals, Inc.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactants, described in paragraph [0280] of U.S. Patent Application Publication 2008/0248425, may be also used.

One of these surfactants may be used alone, or some of them may be used in combination.

In the case where the resist composition contains a surfactant, the amount of the surfactant used is preferably from 0.0001 to 2 mass %, more preferably from 0.0005 to 1 mass %, based on the entire amount of the resist composition (excluding the solvent).

On the other hand, by setting the amount added of the surfactant to 10 ppm or less based on the entire amount of the resist composition (excluding the solvent), the hydrophobic resin is more unevenly distributed to the surface, so that the resist film surface can be made more hydrophobic and the followability of water at the immersion exposure can be enhanced.

[8] (II) Onium Carboxylate

The resist composition of the present invention may or may not contain an onium carboxylate. Examples of the onium carboxylate include those described in paragraphs and [0606] of U.S. Patent Application Publication No. 2008/0187860.

Such an onium carboxylate can be synthesized by reacting a sulfonium, iodonium or ammonium hydroxide and a carboxylic acid with silver oxide in an appropriate solvent.

In the case where the resist composition contains an onium carboxylate, the content thereof is generally from 0.1 to 20 mass %, preferably from 0.5 to 10 mass %, more preferably from 1 to 7 mass %, based on the entire solid content of the composition.

[9] (I) Other Additives

The resist composition of the present invention may further contain, for example, a dye, a plasticizer, a photosensitizer, a light absorber, an alkali-soluble resin, a dissolution inhibitor, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

The solid content concentration of the resist composition of the present invention is usually from 1.0 to 10 mass %, preferably from 2.0 to 5.7 mass %, more preferably from 2.0 to 5.3 mass %. When the solid content concentration is in this range, the resist solution can be uniformly coated on a substrate and moreover, a resist pattern improved in the line edge roughness can be formed. The reasons therefor are not clearly known, but it is considered that by setting the solid content concentration to 10 mass % or less, preferably 5.7 mass % or less, the materials, particularly the photoacid generator, in the resist solution are prevented from aggregation, as a result, a uniform resist film can be formed.

The solid content concentration is a weight percentage of the weight of resist components excluding solvents, based on the total weight of the resist composition.

[10] Pattern Forming Method

The pattern forming method (negative pattern forming method) of the present invention includes:

(i) a step of forming a film (resist film) from a chemical amplification resist composition,
(ii) a step of exposing the film, and
(iii) a step of developing the exposed film by using an organic solvent-containing developer.

The resist film is formed from the above-described chemical amplification resist composition of the present invention and, more specifically, is preferably formed on a substrate. In the pattern forming method of the present invention, the step of forming a film from a resist composition on a substrate, the step of exposing the film, and the development step can be performed by a generally known method.

The present invention also relates to a chemical amplification resist composition used for the pattern forming method.

The pattern forming method also preferably includes, after film formation, a pre-baking step (PB) before entering the exposure step.

Furthermore, the pattern forming method also preferably includes a post-exposure baking step (PEB) after the exposure step but before the development step.

As for the heating temperature, both PB and PEB are preferably performed at 70 to 120° C., more preferably at 80 to 110° C.

The heating time is preferably from 30 to 300 seconds, more preferably from 30 to 180 seconds, still more preferably from 30 to 90 seconds.

The heating can be performed using a device attached to an ordinary exposure/developing machine or may be performed using a hot plate or the like.

Thanks to baking, the reaction in the exposed area is accelerated, and the sensitivity and pattern profile are improved.

The light source wavelength of the exposure apparatus for use in the present invention is not limited, but, for example, a KrF excimer laser wavelength (248 nm), an ArF excimer laser wavelength (193 nm) and an $F_2$ excimer laser wavelength (157 nm) are applicable.

In the present invention, an immersion exposure method can be applied in the step of performing exposure.

The immersion exposure method is a technique to increase the resolution, and this is a technique of performing the exposure by filling a high refractive-index liquid (hereinafter, sometimes referred to as an "immersion liquid") between the projection lens and the sample.

As for the "effect of immersion", assuming that $\lambda_0$ is the wavelength of exposure light in air, n is the refractive index of the immersion liquid for air, θ is the convergence half-angle of beam and $NA_0 = \sin θ$, the resolution and the depth of focus in immersion can be expressed by the following formulae. Here, $k_1$ and $k_2$ are coefficients related to the process.

$$(\text{Resolution}) = k_1 \cdot (\lambda_0/n)/NA_0$$

$$(\text{Depth of focus}) = \pm k_2 \cdot (\lambda_0/n)/NA_0^2$$

That is, the effect of immersion is equal to use of an exposure wavelength of 1/n. In other words, in the case of a projection optical system having the same NA, the depth of focus can be made n times larger by the immersion. This is effective for all pattern profiles and furthermore, can be combined with the super-resolution technology under study at present, such as phase-shift method and modified illumination method.

In the case of performing immersion exposure, a step of washing the film surface with an aqueous chemical solution may be performed (1) before the exposure step after forming the film on a substrate and/or (2) after the step of exposing the film through an immersion liquid but before the step of heating the film The immersion liquid is preferably a liquid being transparent to light at the exposure wavelength and having as small a temperature coefficient of refractive index as possible in order to minimize the distortion of an optical image projected on the film. Particularly, when the exposure light source is an ArF excimer laser (wavelength: 193 nm), water is preferably used in view of easy availability and easy handleability in addition to the above-described aspects.

In the case of using water, an additive (liquid) capable of decreasing the surface tension of water and increasing the interface activity may be added in a small ratio. This additive is preferably a liquid that does not dissolve the resist layer on the wafer and at the same time, gives only a negligible effect on the optical coat on the undersurface of the lens element.

Such an additive is preferably, for example, an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the liquid as a whole can be advantageously made very small.

On the other hand, if a substance opaque to light at 193 nm or an impurity greatly differing in the refractive index from water is mingled, this incurs distortion of the optical image projected on the resist. Therefore, the water used is preferably distilled water. Furthermore, pure water after filtration through an ion exchange filter or the like may be also used.

In the present invention, the substrate on which the film is formed is not particularly limited, and an inorganic substrate such as silicon, SiN, $SiO_2$ and SiN, a coating-type inorganic substrate such as SOG, or a substrate generally used in the process of producing a semiconductor such as IC or producing a liquid crystal device or a circuit board such as thermal head or in the lithography of other photo-fabrication processes can be used. If desired, an organic antireflection film may be formed between the film and the substrate.

In the case where the pattern forming method of the present invention further includes a step of developing the film with an alkali developer, examples of the alkali developer which can be used include an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

This alkaline aqueous solution above may be also used after adding thereto alcohols and a surfactant each in an appropriate amount.

The alkali concentration of the alkali developer is usually from 0.1 to 20 mass %.

The pH of the alkali developer is usually from 10.0 to 15.0.

In particular, an aqueous 2.38 mass % tetramethylammonium hydroxide solution is preferred.

As for the rinsing solution in the rinsing treatment performed after the alkali development, pure water is used, and the pure water may be used after adding thereto a surfactant in an appropriate amount.

As for the developer which can be used in the step of developing the film by using an organic solvent-containing developer (hereinafter, sometimes referred to as an "organic developer"), a polar solvent such as ketone-based solvent, ester-based solvent, alcohol-based solvent, amide-based solvent and ether-based solvent, or a hydrocarbon-based solvent can be used.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl amyl ketone, methyl isobutyl ketone, acetyl acetone, acetonyl acetone, ionone, diacetonyl alcohol, acetyl carbinol, acetophenone, methyl naphthyl ketone, isophorone and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate and γ-butyrolactone.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol.

Examples of the ether-based solvent include, in addition to the glycol ether-based solvents above, dioxane and tetrahydrofuran.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or with water. However, in order to sufficiently bring out the effects of the present invention, the water content ratio in the entire developer is preferably less than 10 mass %, and it is more preferred to contain substantially no water.

That is, the amount of the organic solvent used in the organic developer is preferably from 90 to 100 mass %, more preferably from 95 to 100 mass %, based on the entire amount of the developer.

In particular, the organic developer is preferably a developer containing at least one kind of an organic solvent selected from the group consisting of a ketone-based solvent, an ester-based solvent, an alcohol-based solvent, an amide-based solvent and an ether-based solvent.

The vapor pressure at 20° C. of the organic developer is preferably 5 kPa or less, more preferably 3 kPa or less, still more preferably 2 kPa or less. By setting the vapor pressure of the organic developer to 5 kPa or less, evaporation of the developer on a substrate or in a development cup is suppressed and the temperature uniformity in the wafer plane is enhanced, as a result, the dimensional uniformity in the wafer plane is improved.

Specific examples of the solvent having a vapor pressure of 5 kPa or less include a ketone-based solvent such as 1-octanone, 2-octanone, 1-nonanone, 2-nonanone, 4-heptanone, 2-hexanone, diisobutyl ketone, cyclohexanone, methylcyclohexanone, phenylacetone and methyl isobutyl ketone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent such as tetrahydrofuran; an amide-based solvent such as N-methyl-2-pyrrolidone, N,N-dimethylacetamide and N,N-dimethylformamide; an aromatic hydrocarbon-based solvent such as toluene and xylene; and an aliphatic hydrocarbon-based solvent such as octane and decane.

Specific examples of the solvent having a vapor pressure of 2 kPa or less that is a particularly preferred range include a ketone-based solvent such as 1-octanone, 2-octanone, 1-nonanone, 2-nonanone, 4-heptanone, 2-hexanone, diisobutyl ketone, cyclohexanone, methylcyclohexanone and phenylacetone; an ester-based solvent such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate and propyl lactate; an alcohol-based solvent such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an amide-based solvent such as N-methyl-2-pyrrolidone, N,N-dimethylacetamide and N,N-dimethylformamide; an aromatic hydrocarbon-based solvent such as xylene; and an aliphatic hydrocarbon-based solvent such as octane and decane.

In the organic developer, a surfactant can be added in an appropriate amount, if desired.

The surfactant is not particularly limited but, for example, an ionic or nonionic fluorine-containing and/or silicon-containing surfactant can be used. Examples of such a fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. A nonionic surfactant is preferred. The nonionic surfactant is not particularly limited, but use of a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

As regards the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spraying method), and a method of continuously ejecting the developer on the substrate spinning at a constant speed while scanning the developer ejecting nozzle at a constant rate (dynamic dispense method) may be applied.

In the case where the above-described various developing methods include a step of ejecting the developer toward the resist film from a development nozzle of a developing apparatus, the ejection pressure of the developer ejected (the flow velocity per unit area of the developer ejected) is preferably 2 mL/sec/mm$^2$ or less, more preferably 1.5 mL/sec/mm$^2$ or less, still more preferably 1 mL/sec/mm$^2$ or less. The flow velocity has no particular lower limit but in view of throughput, is preferably 0.2 mL/sec/mm$^2$ or more.

By setting the ejection pressure of the ejected developer to the range above, pattern defects attributable to the resist scum after development can be greatly reduced.

Details of this mechanism are not clearly known, but it is considered that thanks to the ejection pressure in the above-described range, the pressure imposed on the resist film by the developer becomes small and the resist film or resist pattern is kept from inadvertent chipping or collapse.

Here, the ejection pressure (mL/sec/mm$^2$) of the developer is a value at the outlet of a development nozzle in a developing apparatus.

Examples of the method for adjusting the ejection pressure of the developer include a method of adjusting the ejection pressure by a pump or the like, and a method of supplying the developer from a pressurized tank and adjusting the pressure to change the ejection pressure.

After the step of developing the film by using an organic solvent-containing developer, a step of stopping the development by replacing the solvent with another solvent may be practiced.

A step of rinsing the film with a rinsing solution is preferably provided after the step of developing the film by using an organic solvent-containing developer.

The rinsing solution used in the rinsing step after the step of developing the film by using an organic solvent-containing developer is not particularly limited as long as it does not dissolve the resist pattern, and a solution containing a general organic solvent may be used. As for the rinsing solution, a rinsing solution containing at least one kind of an organic solvent selected from the group consisting of a hydrocarbon-based solvent, a ketone-based solvent, an ester-based solvent, an alcohol-based solvent, an amide-based solvent and an ether-based solvent is preferably used.

Specific examples of the hydrocarbon-based solvent, ketone-based solvent, ester-based solvent, alcohol-based solvent, amide-based solvent and ether-based solvent, are the same as those described above for the organic solvent-containing developer.

After the step of developing the film by using an organic solvent-containing developer, more preferably, a step of rinsing the film by using a rinsing solution containing at least one kind of an organic solvent selected from the group consisting of a ketone-based solvent, an ester-based solvent, an alcohol-based solvent and an amide-based solvent is preformed; still more preferably, a step of rinsing the film by using a rinsing solution containing an alcohol-based solvent or an ester-based solvent is performed; yet still more preferably, a step of rinsing the film by using a rinsing solution containing a monohydric alcohol is performed; and most preferably, a step of rinsing the film by using a rinsing solution containing a monohydric alcohol having a carbon number of 5 or more is performed.

The monohydric alcohol used in the rinsing step includes a linear, branched or cyclic monohydric alcohol, and specific examples of the monohydric alcohol which can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. As for the particularly preferred monohydric alcohol having a carbon number of 5 or more, 1-hexanol, 2-hexanol, 4-methyl-2-pentanol, 1-pentanol, 3-methyl-1-butanol and the like can be used.

A plurality of these components may be mixed, or the solvent may be used by mixing it with an organic solvent other than those described above.

The water content ratio in the rinsing solution is preferably 10 mass % or less, more preferably 5 mass % or less, still more preferably 3 mass % or less. By setting the water content ratio to 10 mass % or less, good development characteristics can be obtained.

The vapor pressure at 20° C. of the rinsing solution used after the step of developing the film by using an organic solvent-containing developer is preferably from 0.05 to 5 kPa, more preferably from 0.1 to 5 kPa, and most preferably from 0.12 to 3 kPa. By setting the vapor pressure of the rinsing solution to the range from 0.05 to 5 kPa, the temperature uniformity in the wafer plane is enhanced and moreover, swelling due to permeation of the rinsing solution is suppressed, as a result, the dimensional uniformity in the wafer plane is improved.

The rinsing solution may be also used after adding thereto a surfactant in an appropriate amount.

In the rinsing step, the wafer after development using an organic solvent-containing developer is rinsed using the above-described organic solvent-containing rinsing solution. The method for rinsing treatment is not particularly limited, but examples of the method which can be applied include a method of continuously ejecting the rinsing solution on the substrate spinning at a constant speed (spin coating method), a method of dipping the substrate in a bath filled with the rinsing solution for a fixed time (dipping method), and a method of spraying the rinsing solution on the substrate surface (spraying method). Above all, it is preferred to perform the rinsing treatment by the spin coating method and after the rinsing, remove the rinsing solution from the substrate surface by spinning the substrate at a rotational speed of 2,000 to 4,000 rpm. It is also preferred to include a heating step (Post Bake) after the rinsing step. The developer and rinsing solution remaining between patterns and in the inside of the pattern are removed by the baking. The heating step after the rinsing step is performed at usually from 40 to 160° C., preferably from 70 to 95° C., for usually from 10 seconds to 3 minutes, preferably from 30 to 90 seconds.

EXAMPLES

The present invention is described below by referring to Examples, but the present invention should not be construed as being limited thereto.

Synthesis Example

Synthesis of Resin (1)

In a nitrogen stream, a three-neck flask was charged with 40 g of cyclohexanone and heated at 80° C. (Solvent 1). Monomers corresponding to the following repeating units were dissolved in a molar ratio of 40/10/40/10 in cyclohexanone to prepare a 22 mass % monomer solution (400 g), and polymerization initiator V-601 (produced by Wako Pure Chemical Industries, Ltd.) in a concentration of 7.2 mol % based on the monomers was added thereto and dissolved. The resulting solution was added dropwise to Solvent 1 over 6 hours. After the completion of dropwise addition, the reaction was further allowed to proceed at 80° C. for 2 hours. The reaction solution was left standing to cool and then poured in 3,600 ml of heptane/400 ml of ethyl acetate, and the powder precipitated was collected by filtration and dried, as a result, 74 g of Resin (1) was obtained. The weight average molecular weight of the obtained Resin (1) was 9,800 and the polydispersity (Mw/Mn) was 1.8.

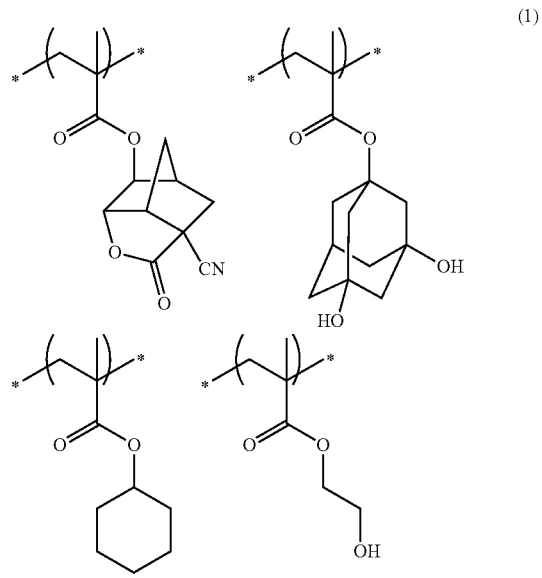

(1)

Resins (2) to (10) and Hydrophobic Resins (1b) to (3b) were synthesized in the same manner as in Synthesis Example above for using monomers corresponding to respective repeating units to give a desired compositional ratio (molar ratio). Here, Hydrophobic Resins (1b) to (3b) come under the hydrophobic resin (E).

Structures of Resins (2) to (10) and Resins (1b) to (3b) are shown below together with that of Resin (1). Also, the compositional ratio (molar ratio), weight average molecular weight and polydispersity of each of Resins (2) to (10) and Resins (1b) to (3b) are shown in Table 3 together with those of Resin (1). Furthermore, with respect to Resins (1) to (10), the dissolution rate measured as follows is also shown together.

(Measurement of Dissolution Rate)

A composition prepared by dissolving only each of Resins (1) to (10) in butyl acetate to give a total solid content concentration of 3.5 mass % was coated on a silicon wafer and baked at 100° C. for 60 seconds, and the formed resin film having a thickness of 100 nm was dipped in an aqueous 2.38 mass % TMAH solution for 1,000 seconds. When the film remained undissolved, the residual film thickness was measured, and when the film was completely dissolved, the average dissolution rate (nm/sec) was calculated from the time until the film could be completely dissolved. The measurement of results was performed using a QCM sensor at room temperature (25° C.).

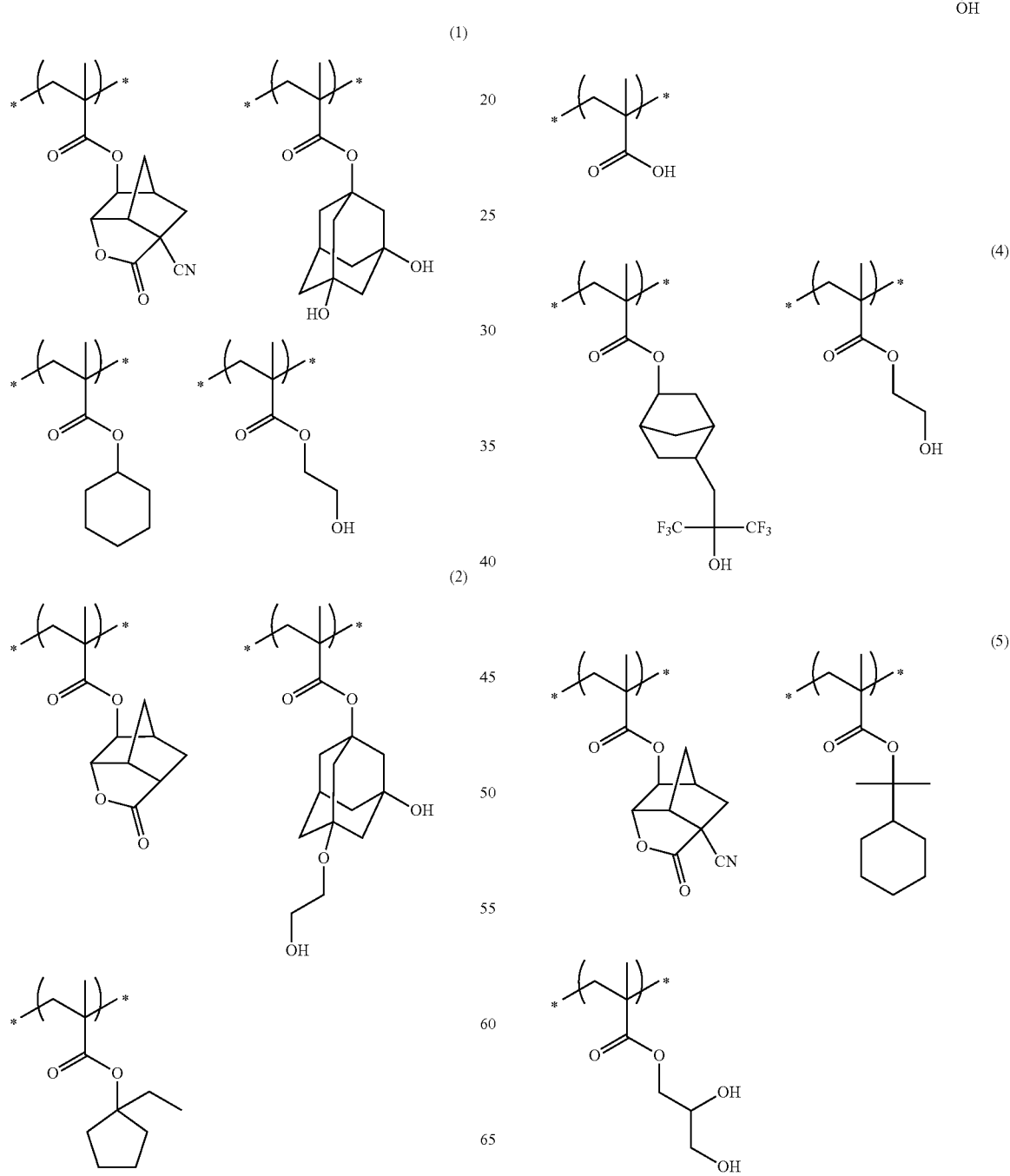

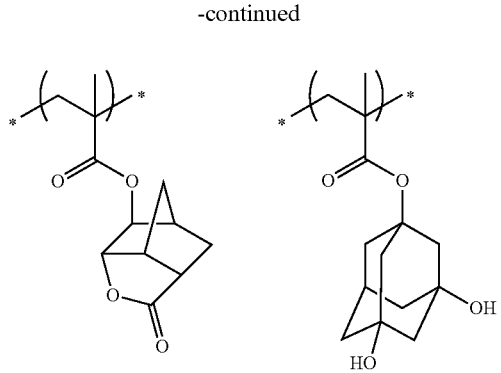
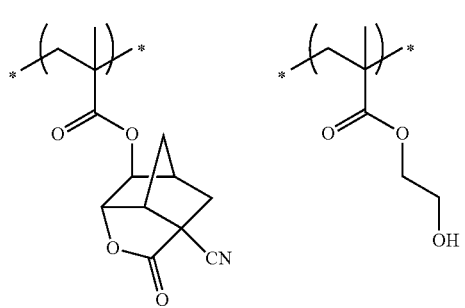
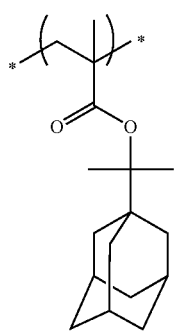
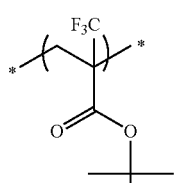
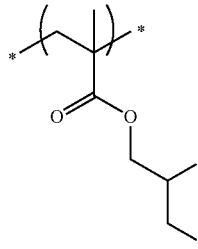
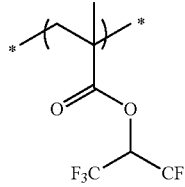
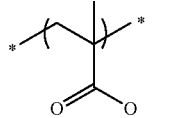
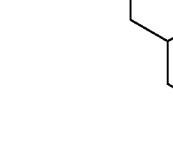
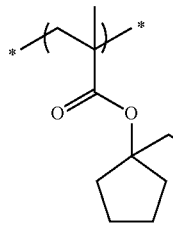

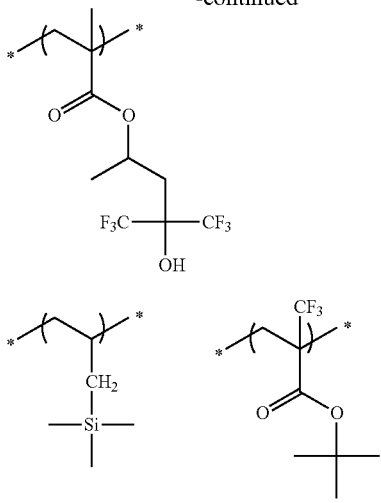

(3b)

TABLE 3

| Resin | Compositional Ratio (mol %) | Mw | Mw/Mn | Dissolution Rate (nm/s) |
|---|---|---|---|---|
| (1) | 40/10/40/10 | 9800 | 1.8 | 0.06 |
| (2) | 35/20/45 | 10600 | 1.8 | 0.04 |
| (3) | 40/50/10 | 9600 | 1.6 | 0.10 |
| (4) | 50/50 | 9900 | 1.7 | 1.21 |
| (5) | 30/60/10 | 10700 | 1.8 | 0.08 |
| (6) | 50/50 | 10000 | 1.8 | 0.05 |
| (7) | 40/60 | 9600 | 1.6 | 0.07 |
| (8) | 40/10/50 | 9900 | 1.7 | 0.05 |
| (9) | 30/20/50 | 10500 | 1.7 | 0.03 |
| (10) | 20/20/60 | 11000 | 1.8 | 0.16 |
| (1b) | 30/60/10 | 5000 | 1.4 | |
| (2b) | 50/40/10 | 6500 | 1.5 | |
| (3b) | 50/50 | 4000 | 1.3 | |

<Preparation of Resist Composition>

The components shown in Table 4 below were dissolved in the solvent shown in Table 4 to prepare a solution having a solid content concentration of 4 mass %, and the solution was filtered through a polyethylene filter having a pore size of 0.03 µm. In this way, Resist Compositions (Ar-1) to (Ar-11) were prepared.

TABLE 4

| Resist Composition | Resin (g) | Acid Generator (Compound (B)) (g) | Acid Generator (Compound (B′)) (g) | Crosslinking Agent (g) | Hydrophobic Resin (g) | Basic Compound (g) | Surfactant (g) | Solvent (mass ratio) |
|---|---|---|---|---|---|---|---|---|
| Ar-1 | Resin (1) (10) | PAG-8 (0.5) | — | X-1 (1.00) | 1b (0.05) | PBI (0.03) | W-4 (0.03) | A1/B1 (70/30) |
| Ar-2 | Resin (2) (10) | PAG-5/PAG-7 (0.3/0.2) | — | X-3 (1.00) | 1b (0.05) | TPI (0.03) | W-2 (0.03) | A1/B1 (70/30) |
| Ar-3 | Resin (3) (10) | PAG-6 (0.5) | — | X-5 (1.00) | 2b (0.05) | TPI (0.03) | W-4 (0.03) | A2/B2 (60/40) |
| Ar-4 | Resin (4) (10) | PAG-3 (0.5) | — | X-4 (1.00) | 2b (0.05) | DPA (0.03) | W-3 (0.03) | A1 (100) |
| Ar-5 | Resin (5) (10) | PAG-1 (0.5) | — | X-3 (1.50) | — | TPI/DPA (0.02/0.01) | W-1 (0.03) | A1/A2/B1 (50/4/46) |
| Ar-6 | Resin (6) (10) | PAG-4 (0.5) | — | X-3 (1.00) | 3b (0.05) | DPA (0.03) | — | A2/B1 (60/40) |
| Ar-7 | Resin (7) (10) | PAG-7 (0.5) | — | X-1 (1.00) | 1b (0.05) | TPI (0.03) | W-3 (0.03) | A3/B2 (80/20) |
| Ar-8 | Resin (8) (10) | PAG-8 (0.5) | — | X-2 (2.00) | 2b (0.05) | PBI/TPI (0.015/0.015) | W-1 (0.03) | A3/B1 (60/40) |
| Ar-9 | Resin(7)/ Resin (9) (2/8) | PAG-5 (0.5) | — | X-4 (1.00) | 2b (0.05) | DPA (0.03) | W-4 (0.03) | A1/B1 (60/40) |
| Ar-10 | Resin (10) (10) | PAG-2 (0.2) | PAG-ref (0.2) | X-3 (1.20) | 1b (0.05) | PBI (0.03) | W-2 (0.03) | A2/B2 (80/20) |
| Ar-11 | Resin (7) (10) | PAG-9 (0.5) | — | X-1 (2.00) | — | PEA (0.03) | W-1 (0.03) | A1/B1 (60/40) |

Abbreviations in Table 4 are as follows.
PAG-1 to PAG-9, PAG-ref: Each indicates the compound shown below.
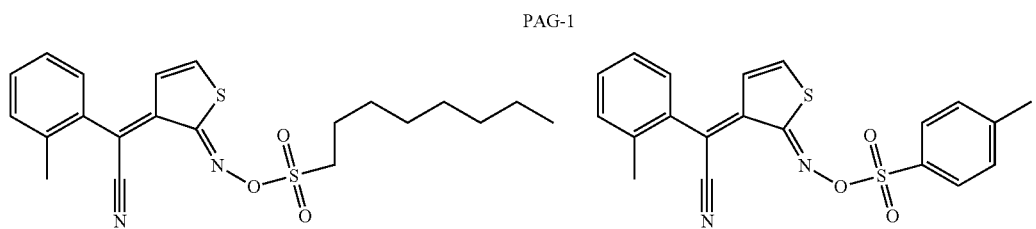
PAG-1
PAG-2
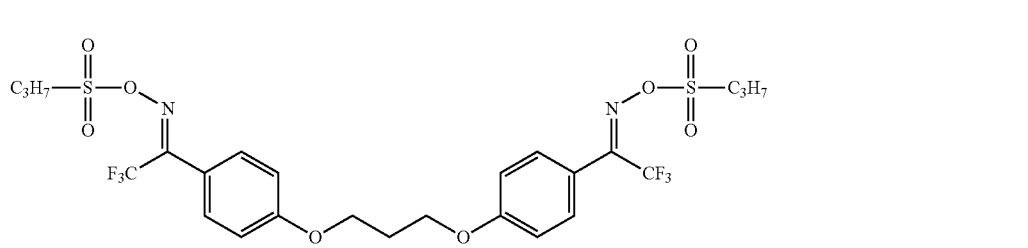
PAG-3
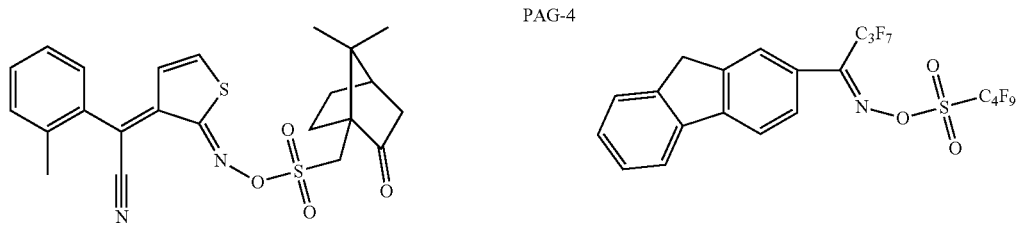
PAG-4
PAG-5
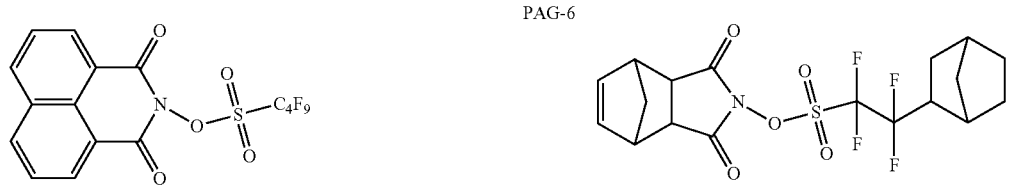
PAG-6
PAG-7
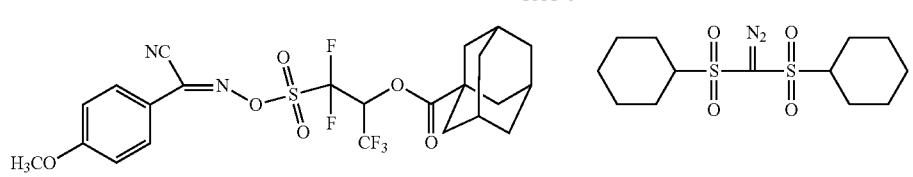
PAG-8
PAG-9
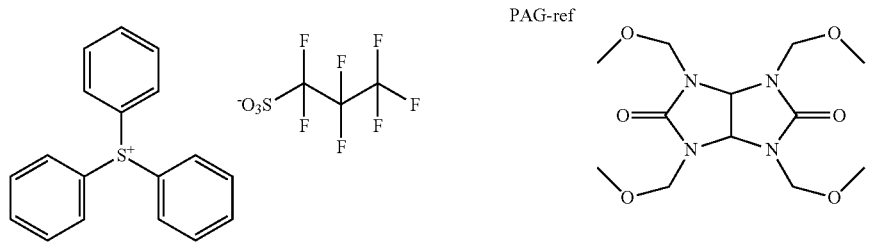
PAG-ref
(X-1)

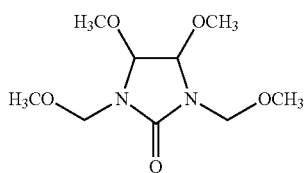
(X-2)

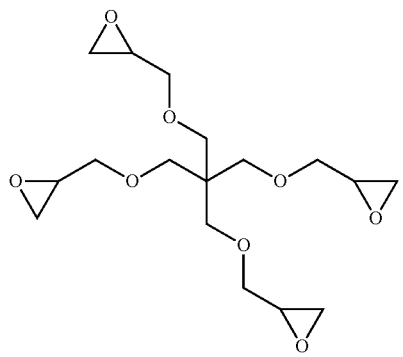
(X-3)

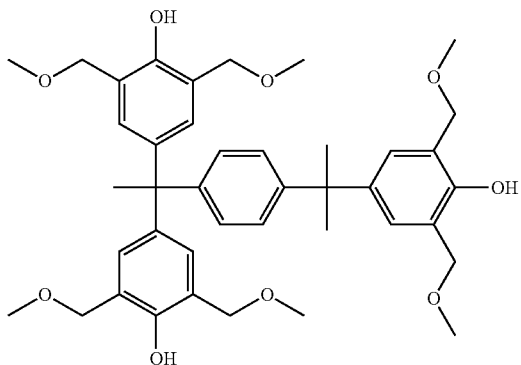
(X-4)

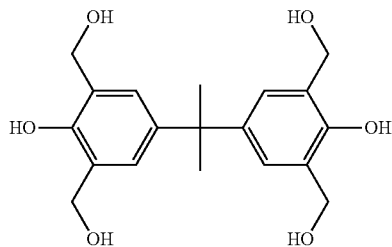
(X-5)

TPI: 2,4,5-Triphenylimidazole
PEA: N-Phenyldiethanolamine
DPA: 2,6-Diisopropylphenyl alcohol
PBI: 2-Phenylbenzimidazole
W-1: Megaface F176 (produced by Dainippon Ink & Chemicals, Inc.) (containing fluorine)
W-2: Megaface R08 (produced by Dainippon Ink & Chemicals, Inc.) (containing fluorine and silicon)
W-3: Polysiloxane Polymer KP-341 (produced by Shin-Etsu Chemical Co., Ltd.) (containing silicon)

W-4:

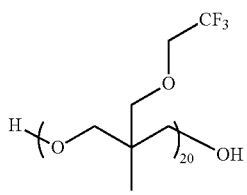

A1: Propylene glycol monomethyl ether acetate
A2: γ-Butyrolactone
A3: Cyclohexanone
B1: Propylene glycol monomethyl ether
B2: Ethyl lactate Using the resist composition prepared, a resist pattern was formed by the following method.

Example 1

An organic antireflection film, ARC29A (produced by Nissan Chemical Industries, Ltd.), was coated on a silicon wafer and baked at 205° C. for 60 seconds to form an antireflection film having a thickness of 86 nm.

Resist Composition Ar-1 was coated on the antireflection film and baked (Prebake, PB) at 100° C. for 60 seconds to form a resist film having an average thickness of 100 nm.

The formed resist film was exposed through a 6% halftone mask having a 1:1 line-and-space pattern with a line width of 75 nm by using an ArF excimer laser scanner (PAS5500/1100, manufactured by ASML, NA: 0.75, Dipole, σo/σi=0.89/0.65). Thereafter, the resist film was baked (Post-Exposure Bake, PEB), at 100° C. over 60 seconds and then dipped in the developer shown in Table 5 for 30 seconds. After this development treatment, the film was rinsed using the rising solution shown in Table 5, and then, the wafer was spun at a rotation speed of 4,000 rpm for 30 seconds to form a 1:1 line-and-space resist pattern with a line width of 75 nm.

Examples 2 to 11

A 1:1 line-and-space resist pattern with a line width of 75 nm was formed in the same manner as in Example 1 except for employing the resist compositions and the conditions shown in Table 5.

TABLE 5

|  | Resist Composition | PB | Developer | PEB | Rinsing Solution |
|---|---|---|---|---|---|
| Example 1 | Ar-1 | 100 C. 60 s | butyl acetate | 100 C. 60 s | 4-methyl-2-pentanol |
| Example 2 | Ar-2 | 100 C. 60 s | butyl acetate | 110 C. 60 s | 4-methyl-2-pentanol |
| Example 3 | Ar-3 | 100 C. 60 s | mixed solvent of butyl acetate:A2 = 80:20 (by mass) | 110 C. 60 s | 4-methyl-2-pentanol |
| Example 4 | Ar-4 | 110 C. 60 s | isopentyl acetate | 120 C. 60 s | decane |
| Example 5 | Ar-5 | 100 C. 60 s | mixed solvent of butyl acetate:A1 = 70:30 (by mass) | 110 C. 60 s | 1-hexanol |
| Example 6 | Ar-6 | 95 C. 60 s | isopentyl acetate | 100 C. 60 s | mixed solvent of 4-methyl-2-pentanol:decane = 75:25 (mass %) |
| Example 7 | Ar-7 | 110 C. 60 s | pentyl acetate | 100 C. 60 s | 1-hexanol |
| Example 8 | Ar-8 | 100 C. 60 s | isopentyl acetate | 95 C. 60 s | 4-methyl-2-pentanol |
| Example 9 | Ar-9 | 100 C. 60 s | pentyl acetate | 110 C. 60 s | decane |
| Example 10 | Ar-10 | 110 C. 60 s | pentyl acetate | 100 C. 60 s | 1-hexanol |
| Example 11 | Ar-11 | 100 C. 60 s | butyl acetate | 90 C. 60 s | 4-methyl-2-pentanol |

In Table 5, PB indicates heating before exposure, and PEB indicates heating after exposure. Also, in the columns of PB and PEB, for example, "100060s" indicates heating at 100° C. for 60 seconds. Each of A1 and A2 indicates the solvent described above.

<Evaluation Method>
[Line Width Roughness (LWR)]

The 1:1 line-and-space resist pattern with a line width of 75 nm was observed using a Critical Dimension scanning electron microscope (SEM; S-938011, manufactured by Hitachi Ltd.). With respect to the range of 2 μm in the longitudinal direction of the space pattern, the line width was measured at 50 points at regular intervals and from its standard deviation, 3σ was computed, whereby the line width roughness was measured. A smaller value indicates better performance.

[Exposure Latitude (EL)]

The exposure dose for forming a 1:1 line-and-space mask pattern with a line width of 75 nm was defined as an optimal exposure dose. The amplitude of exposure dose allowing for a ±10% tolerance on the pattern size when changing the exposure dose from the above-described optimal exposure dose was determined, and this value was divided by the optimal exposure dose and expressed in percentage. As the value is larger, the fluctuation of performance due to change in the exposure dose is smaller and the exposure latitude (EL) (%) is better.

[Focus Latitude (DOF)]

The exposure dose and focus for forming a 1:1 line-and-space resist pattern with a line width of 75 nm were defined as an optimal exposure dose and an optimal focus, respectively. The focus was changed (defocused) while keeping the exposure dose at the optimal exposure dose, and the amplitude of focus allowing for a ±10% tolerance on the pattern size was determined. As the value is larger, the change of performance due to change in the focus is smaller and the focus latitude (DOF) is better.

[Scum Defect]

The exposure dose and focus for forming a 1:1 line-and-space resist pattern with a line width of 75 nm were defined as an optimal exposure dose and an optimal focus, respectively. The number of scum defects (per one sheet of a 8-inch silicon wafer) of a pattern obtained under the conditions of optimal exposure dose and optimal focus was digitized and evaluated based on the following criteria.
A: From 0 to 50 defects.
B: From 51 to 100 defects.
C: From 101 to 150 defects.
D: 151 Defects or more.

TABLE 6

|  | LWR (nm) | EL (%) | DOF (μm) | Scum Defect |
|---|---|---|---|---|
| Example 1 | 6.4 | 8.9 | 0.52 | A |
| Example 2 | 6.1 | 9.1 | 0.50 | A |
| Example 3 | 6.5 | 9.0 | 0.52 | A |
| Example 4 | 7.8 | 8.0 | 0.41 | C |
| Example 5 | 7.0 | 8.0 | 0.42 | B |
| Example 6 | 7.3 | 8.2 | 0.45 | B |
| Example 7 | 6.5 | 9.4 | 0.54 | A |
| Example 8 | 6.8 | 8.8 | 0.53 | A |
| Example 9 | 6.5 | 8.7 | 0.47 | A |
| Example 10 | 7.9 | 8.0 | 0.42 | C |
| Example 11 | 7.3 | 8.4 | 0.47 | B |

As seen from Table 6, according to the pattern forming method of Examples where a nonionic compound is used as an acid generator and at the same time, an organic developer is used, the exposure latitude (EL) and focus latitude (DOF) can be excellent and the line width variation (LWR) and scum defect can be reduced.

With respect to the resist compositions of Examples 1 to 4 and 6 to 10, immersion exposure was performed using pure water as the immersion medium, as a result, good lithography performance was obtained similarly to the dry exposure.

According to such the pattern forming performance, it is apparent that the pattern forming method and the chemical amplification resist composition of the present invention are remarkably effective in the production of an electronic device.

INDUSTRIAL APPLICABILITY

According to the present invention, a pattern forming method, a chemical amplification resist composition and a resist film can be provided, ensuring that the exposure latitude (EL) and focus latitude (DOF) are excellent and the line width variation (LWR) and scum defect can be reduced.

The entire disclosure of Japanese Patent Application No. 2010-99298 filed on Apr. 22, 2010, from which the benefit of foreign priority has been claimed in the present application, is incorporated herein by reference, as if fully set forth.

What is claimed is:

1. A pattern forming method comprising:
(i) a step of forming a film from a chemical amplification resist composition,
(ii) a step of exposing the film, and
(iii) a step of developing the exposed film by using an organic solvent-containing developer,
wherein the resist composition contains:
(A) a resin,
(B) a nonionic compound capable of generating an acid upon irradiation with an actinic ray or radiation,
(C) a crosslinking agent, and
(D) a solvent,
and wherein the organic solvent-containing developer contains substantially no water and is a developer containing at least one kind of an organic solvent selected from the group consisting of a ketone-based solvent, an ester-based solvent, an amide-based solvent and an ether-based solvent.

2. The pattern forming method as claimed in claim 1, wherein the resin (A) is substantially alkali-insoluble.

3. The pattern forming method as claimed in claim 1, wherein the nonionic compound is a compound represented by the following formula (B1) or (B2):

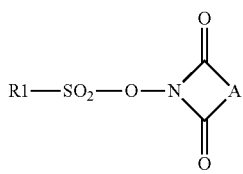

(B1)

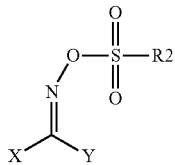

(B2)

wherein each of R1 and R2 independently represents an organic group,
A represents an alkylene group, a cycloalkylene group, an alkenylene group, a cycloalkenylene group or an arylene group,
each of X and Y independently represents an alkyl group, a cycloalkyl group, an aryl group, a cyano group or a nitro group, X and Y may combine with each other to form a ring, and
X or Y in a compound represented by formula (B2) may combine with X or Y in another compound represented by formula (B2) through a linking group.

4. The pattern forming method as claimed in claim 3, wherein the organic group as R1 and R2 in formulae (B1) and (B2) is a group represented by the following formula (I):

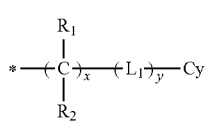

(I)

wherein each of $R_1$ and $R_2$ independently represents a hydrogen atom, a fluorine atom or an alkyl group, and when a plurality of $R_1$'s or $R_2$'s are present, each $R_1$ or $R_2$ may be the same as or different from every other $R_1$ or $R_2$,
$L_1$ represents a divalent linking group and when a plurality of $L_1$'s are present, each $L_1$ may be the same as or different from every other $L_1$,
Cy represents a cyclic organic group,
x represents an integer of 0 to 20,
y represents an integer of 0 to 10, and
* represents a bond to a sulfonyl group.

5. The pattern forming method as claimed in claim 4, wherein the organic group represented by formula (I) is a group represented by the following formula (II) or (III):

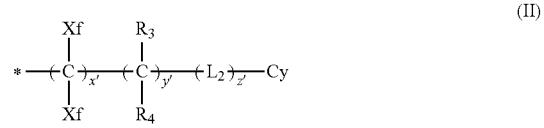

(II)

(III)

wherein in formula (II),
each Xf independently represents a fluorine atom or an alkyl group substituted with at least one fluorine atom,
each of $R_3$ and $R_4$ independently represents a hydrogen atom or an alkyl group, and when a plurality of $R_3$'s or $R_4$'s are present, each $R_3$ or $R_4$ may be the same as or different from every other $R_3$ or $R_4$,
$L_2$ represents a divalent linking group and when a plurality of $L_2$'s are present, each $L_2$ may be the same as or different from every other $L_2$,
Cy represents a cyclic organic group,
x' represents an integer of 0 to 20,
y' represents an integer of 0 to 10, and
z' represents an integer of 0 to 10,
provided that $1 \leq x'+y'+z'$;
in formula (III),
Ar represents an aryl group,
$R_5$ represents a group containing a hydrocarbon group, and
p represents an integer of 0 or more;
and in formulae (II) and (III),
* represents a bond to a sulfonyl group.

6. The pattern forming method as claimed in claim 5, wherein the organic group represented by formula (II) or (III) is an organic group represented by formula (II) and x' is an integer of 1 to 10.

7. The pattern forming method as claimed in claim 1, wherein the resin (A) contains a repeating unit having an acid-decomposable group.

8. The pattern forming method as claimed in claim 1, wherein the resin (A) does not contain a repeating unit having an acid-decomposable group.

9. The pattern forming method according to claim 1, which is a negative-type pattern forming method.

10. A method for producing an electronic device, comprising the pattern forming method according to claim 1.

11. A pattern forming method comprising:
(i) a step of forming a film from a chemical amplification resist composition,
(ii) a step of exposing the film, and (iii) a step of developing the exposed film by using an organic solvent-containing developer which contains substantially no water, wherein the resist composition contains:

(A) a resin containing a repeating unit derived from an ester of an acrylic acid, in which the α-position of the main chain may be substituted, (B) a nonionic compound capable of generating an acid upon irradiation with an actinic ray or radiation, (C) a crosslinking agent, and (D) a solvent.

12. The pattern forming method according to claim 11, wherein the resin (A) is substantially alkali-insoluble.

13. The pattern forming method according to claim 11, wherein the nonionic compound is a compound represented by the following formula (B1) or (B2):

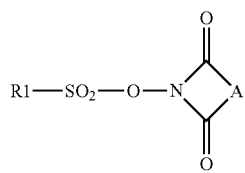
(B1)

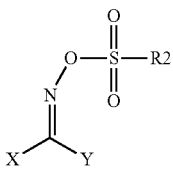
(B2)

wherein each of R1 and R2 independently represents an organic group,

A represents an alkylene group, a cycloalkylene group, an alkenylene group, a cycloalkenylene group or an arylene group, each of X and Y independently represents an alkyl group, a cycloalkyl group, an aryl group, a cyano group or a nitro group, X and Y may combine with each other to form a ring, and X or Y in a compound represented by formula (B2) may combine with X or Y in another compound represented by formula (B2) through a linking group.

14. The pattern forming method according to claim 11, wherein the resin (A) contains a repeating unit having an acid-decomposable group.

15. The pattern forming method according to claim 11, wherein the resin (A) does not contain a repeating unit having an acid-decomposable group.

16. A method for producing an electronic device, comprising the pattern forming method according to claim 11.

* * * * *